United States Patent [19]

Narita et al.

[11] Patent Number: 5,883,975
[45] Date of Patent: Mar. 16, 1999

[54] COMPRESSION AND DECOMPRESSION METHODS ON TWO-DIMENSIONAL IMAGE DATA

[75] Inventors: Yoshinori Narita; Kazunori Matsuura, both of Tokyo, Japan

[73] Assignee: Nippon Steel Corporation, Tokyo, Japan

[21] Appl. No.: 526,663

[22] Filed: Sep. 11, 1995

[30] Foreign Application Priority Data

Sep. 12, 1994 [JP] Japan .................................. 6-244741
Oct. 28, 1994 [JP] Japan .................................. 6-289109
Oct. 28, 1994 [JP] Japan .................................. 6-289110

[51] Int. Cl.[6] .................................................. G06K 9/36
[52] U.S. Cl. ........................................................... 382/232
[58] Field of Search .................................. 382/232, 233, 382/238, 239, 240, 243, 245, 246; 358/261.1, 261.2, 261.3; 341/51, 55, 79, 106

[56] References Cited

U.S. PATENT DOCUMENTS

| | | | |
|---|---|---|---|
| 4,107,648 | 8/1978 | Frank | 382/246 |
| 4,602,383 | 7/1986 | Ogawa et al. | 382/245 |
| 5,003,307 | 3/1991 | Whiting et al. | 341/51 |
| 5,126,739 | 6/1992 | Whiting et al. | 341/106 |
| 5,146,221 | 9/1992 | Whiting et al. | 341/67 |
| 5,150,430 | 9/1992 | Chu | 382/246 |
| 5,170,445 | 12/1992 | Nelson et al. | 382/233 |
| 5,329,405 | 7/1994 | Hou et al. | 382/244 |

OTHER PUBLICATIONS

Ziv, Jacob and Lempel, Abraham, "Compression of Individual Sequences via Variable–Rate Coding," *IEEE Transactions of Information Theory*, vol. IT–24, No. 5, Sep. 1978, pp. 530–536.

*Primary Examiner*—Jose L. Couso
*Attorney, Agent, or Firm*—Pollock, Vande Sande & Amernick

[57] ABSTRACT

A data compression apparatus includes a dictionary buffer for holding data of the immediately preceding line of successively inputted two-dimensional image data, a buffer for extracting a plurality of continuous data strings from the inputted data of the current line to store them as a partial data string to be compressed, a scanning comparison section for detecting whether or not the same data string as the partial data string to be compressed exists in the data stored in the dictionary buffer, and a code generator by which in the case where the presence of the same data string is detected by the scanning comparison section, data of the position and the length of a partial data string on the data of the immediately preceding line stored in the dictionary buffer is outputted as data of that partial data string of the current line.

70 Claims, 48 Drawing Sheets

FIG. 4A

```
       COLUMN
ROW   0  1  2  3  4  5  6  7
  0   2  2  2  2  3  4  4  4
  1   5  5  5  4  3  4  1  3
  2   5  5  4  3  4  3  5  4
  3   6  5  5  4  a  a  a  a
  4   c  c  5  5  a  a  a  a
  5   c  c  c  5  5  a  a  a
  6   c  c  c  6  6  6  3  3
  7   6  c  c  6  6  3  3  3
```

FIG. 4B

```
          COLUMN
ROW      0  1  2  3  4  5  6  7
    0    2  2  2  2  3  4  4  4
a ─ 1   (5  5  5  4  3  4) 1  3
    2   (5  5  4  3  4) 3  5  4
b ─ 3    6  5  5  4  a  a  a  a
    4    c  c  5  5  a  a  a  a
    5    c  c  c  5  5  a  a  a
    6    c  c  c  6  6  6  3  3
    7    6  c  c  6  6  3  3  3
```

FIG. 4C

```
          COLUMN
ROW      0  1  2  3  4  5  6  7
    0    2  2  2  2  3  4  4  4
    1    5 (5  5  4  3) 4  1  3  ─ e
    2   (5  5  4  3)(4  3) 5  4
c ─ 3    6  5  5  4  a  a  a  a  ─ d
    4    c  c  5  5  a  a  a  a
    5    c  c  c  5  5  a  a  a
    6    c  c  c  6  6  6  3  3
    7    6  c  c  6  6  3  3  3
```

FIG. 5

| ROW | CODE STRING |
|---|---|
| 0 | [2, 4][3, 1][4, 3] |
| 1 | [5, 3][4, 1]{0, 2}[1, 1][3, 1] |
| 2 | {1, 5} {-1, 1}[5, 1][4, 1] |
| 3 | [6, 1]{-1, 3}[a, 4] |
| 4 | [c, 2]{-1, 2} {0, 4} |
| 5 | {0, 2} {-1, 1} {-1, 5} |
| 6 | {0, 3}[6, 3][3, 2] |
| 7 | [6, 1]{-1, 2} {0, 2} {1, 2} {0, 1} |

| LENGTH | CODE |
|---|---|
| 1 | 0 |
| 2 | 10 |
| 3 | 110 |
| 4 | 1110 |
| 5 | 11110 |
| 6 | 111110 |
| 7 | 1111110 |
| 8 | 1111111 |

| RELATIVE POSITION | CODE |
|---|---|
| -1 | 11 |
| 0 | 0 |
| 1 | 10 |

| LENGTH | CODE |
|---|---|
| 1 | 00 |
| 2 | 01 |
| 3 | 10 |
| 4 | 1100 |
| 5 | 1101 |
| 6 | 1110 |
| 7 | 11110 |
| 8 | 11111 |

| ROW | CODE STRING |
|---|---|
| 0 | 00101110 00110 0100110 |
| 1 | 00101110 001000 1001 000010 000110 |
| 2 | 1101101 11100 001010 001000 |
| 3 | 001100 11110 010101110 |
| 4 | 0110010 11101 101100 |
| 5 | 1001 11100 1111101 |
| 6 | 1010 00110110 0001110 |
| 7 | 001100 11101 1001 11001 1000 |

FIG. 13A

```
        COLUMN
ROW    0  1  2  3  4  5  6  7
  0    2  2  2  2  3  4  4  4
  1    5  5  5  4  3  4  1  3
  2    5  5  4  3  4  3  5  4
  3    6  5  5  4  a  a  a  a
  4    c  c  5  5  a  a  a  a
  5    c  c  c  5  5  a  a  a
  6    c  c  c  6  6  6  3  3
  7    6  c  c  6  6  3  3  3
```

FIG. 13B

```
           COLUMN
   ROW    0  1  2  3  4  5  6  7
     0    2  2  2  2  3  4  4  4
a — 1   [ 5  5  5  4  3  4 ] 1  3
     2   [ 5  5  4  3  4 ] 3  5  4
b —
     3    6  5  5  4  a  a  a  a
     4    c  c  5  5  a  a  a  a
     5    c  c  c  5  5  a  a  a
     6    c  c  c  6  6  6  3  3
     7    6  c  c  6  6  3  3  3
```

FIG. 13C

```
           COLUMN
   ROW    0  1  2  3  4  5  6  7
     0    2  2  2  2  3  4  4  4
     1    5 [ 5  5  4  3 ] 4  1  3 — e
     2  [ 5  5  4  3 ][ 4  3 ] 5  4
   c —                          — d
     3    6  5  5  4  a  a  a  a
     4    c  c  5  5  a  a  a  a
     5    c  c  c  5  5  a  a  a
     6    c  c  c  6  6  6  3  3
     7    6  c  c  6  6  3  3  3
```

FIG. 14

| ROW | CODE STRING |
|---|---|
| 0 | [0, 2, 4][4, 3, 1][5, 4, 3] |
| 1 | [0, 5, 3][3, 4, 1]{4, 0, 2}[6, 1, 1][7, 3, 1] |
| 2 | {0, 1, 5} {5, -1, 1}[6, 5, 1][7, 4, 1] |
| 3 | [0, 6, 1]{1, -1, 3}[4, a, 4] |
| 4 | [0, c, 2]{2, -1, 2} {4, 0, 4} |
| 5 | {0, 0, 2} {2, -1, 6} |
| 6 | {0, 0, 3}[3, 6, 3][6, 3, 2] |
| 7 | [0, 6, 1]{1, 0, 4} {5, 1, 2} {7, 0, 1} |

| z / y | 0 | 1 | 2 | 3 |
|---|---|---|---|---|
| LENGTH | RUN LENGTH | RELATIVE POSITION | | |
| | | -1 | 0 | +1 |
| 1 | 110 | — | 0100 | 11110 |
| 2 | 1000 | — | 1010 | 011110 |
| 3 | 01010 | — | 01110 | 111110 |
| 4 | 10110 | — | 11100 | 0111110 |
| 5 | 101110 | — | 10010 | 0111111 |
| 6 | 101111 | — | 10011 | 1111111 |
| 7 | 1111110 | — | 11101 | 01011 |
| 8 | 0110 | — | 00 | — |

| y \ z | 0 | 1 | 2 | 3 |
|---|---|---|---|---|
| LENGTH | RUN LENGTH | RELATIVE POSITION | | |
| | | -1 | 0 | +1 |
| 1 | 00 | 0110 | 1110 | 010110 |
| 2 | 100 | 1100 | 11010 | 011100 |
| 3 | 1010 | 11110 | 011110 | 0101111 |
| 4 | 10110 | 011101 | 0111110 | 1111101 |
| 5 | 0101110 | 1111110 | 01111110 | 11111111 |
| 6 | 1111100 | 01111111 | 11111110 | 10111 |
| 7 | 11011 | 01010 | 0100 | — |
| 8 | — | — | — | — |

| y \ z | 0 | 1 | 2 | 3 |
|---|---|---|---|---|
| LENGTH | RUN LENGTH | RELATIVE POSITION | | |
| | | -1 | 0 | +1 |
| 1 | 10 | 11010 | 0001 | 0101 |
| 2 | 1100 | 11110 | 0110 | 00110 |
| 3 | 0000 | 111110 | 01110 | 1111110 |
| 4 | 110110 | 001111 | 011110 | 011111 |
| 5 | 001110 | 11111110 | 11111111 | 0100 |
| 6 | 0010 | 110111 | 1110 | — |
| 7 | — | — | — | — |
| 8 | — | — | — | — |

| LENGTH | RUN LENGTH | RELATIVE POSITION | | |
|---|---|---|---|---|
| | | -1 | 0 | +1 |
| | | z=1 | z=2 | z=3 |
| | z=0 | | | |
| 1 | 10 | 0000 | 0010 | 11010 |
| 2 | 010 | 11011 | 11110 | 011110 |
| 3 | 0001 | 01110 | 111110 | 011111 |
| 4 | 00111 | 1111110 | 1111111 | 0110 |
| 5 | 1110 | 00110 | 1100 | — |
| 6 | — | — | — | — |
| 7 | — | — | — | — |
| 8 | — | — | — | — |

| LENGTH | RUN LENGTH | RELATIVE POSITION | | |
|---|---|---|---|---|
| | | -1 | 0 | +1 |
| | | z=1 | z=2 | z=3 |
| | z=0 | | | |
| 1 | 10 | 0010 | 0011 | 11010 |
| 2 | 010 | 11011 | 01110 | 01111 |
| 3 | 0110 | 111110 | 111111 | 1100 |
| 4 | 1110 | 11110 | 000 | — |
| 5 | — | — | — | — |
| 6 | — | — | — | — |
| 7 | — | — | — | — |
| 8 | — | — | — | — |

| y \ z | 0 | 1 | 2 | 3 |
|---|---|---|---|---|
| LENGTH | RUN LENGTH | RELATIVE POSITION | | |
| | | -1 | 0 | +1 |
| 1 | 10 | 0011 | 0110 | 11110 |
| 2 | 010 | 0111 | 11111 | 1110 |
| 3 | 110 | 0010 | 000 | — |
| 4 | — | — | — | — |
| 5 | — | — | — | — |
| 6 | — | — | — | — |
| 7 | — | — | — | — |
| 8 | — | — | — | — |

| y \ z | 0 | 1 | 2 | 3 |
|---|---|---|---|---|
| LENGTH | RUN LENGTH | RELATIVE POSITION | | |
| | | -1 | 0 | +1 |
| 1 | 00 | 1110 | 1111 | 100 |
| 2 | 01 | 101 | 110 | — |
| 3 | — | — | — | — |
| 4 | — | — | — | — |
| 5 | — | — | — | — |
| 6 | — | — | — | — |
| 7 | — | — | — | — |
| 8 | — | — | — | — |

| y \ z | 0 | 1 | 2 | 3 |
|---|---|---|---|---|
| LENGTH | RUN LENGTH | RELATIVE POSITION | | |
| | | -1 | 0 | +1 |
| 1 | 0 | 11 | 10 | — |
| 2 | — | — | — | — |
| 3 | — | — | — | — |
| 4 | — | — | — | — |
| 5 | — | — | — | — |
| 6 | — | — | — | — |
| 7 | — | — | — | — |
| 8 | — | — | — | — |

FIG. 23

| | CODE STRING |
|---|---|
| 0 | 101100010 100011 1100100 |
| 1 | 010100101 100100 01110 000001 00011 |
| 2 | 0111111 0011 000101 00100 |
| 3 | 1100110 11110 11100000 |
| 4 | 10000010 11110 000 |
| 5 | 1010 110111 |
| 6 | 01110 00010110 010011 |
| 7 | 1100110 0111110 1110 10 |

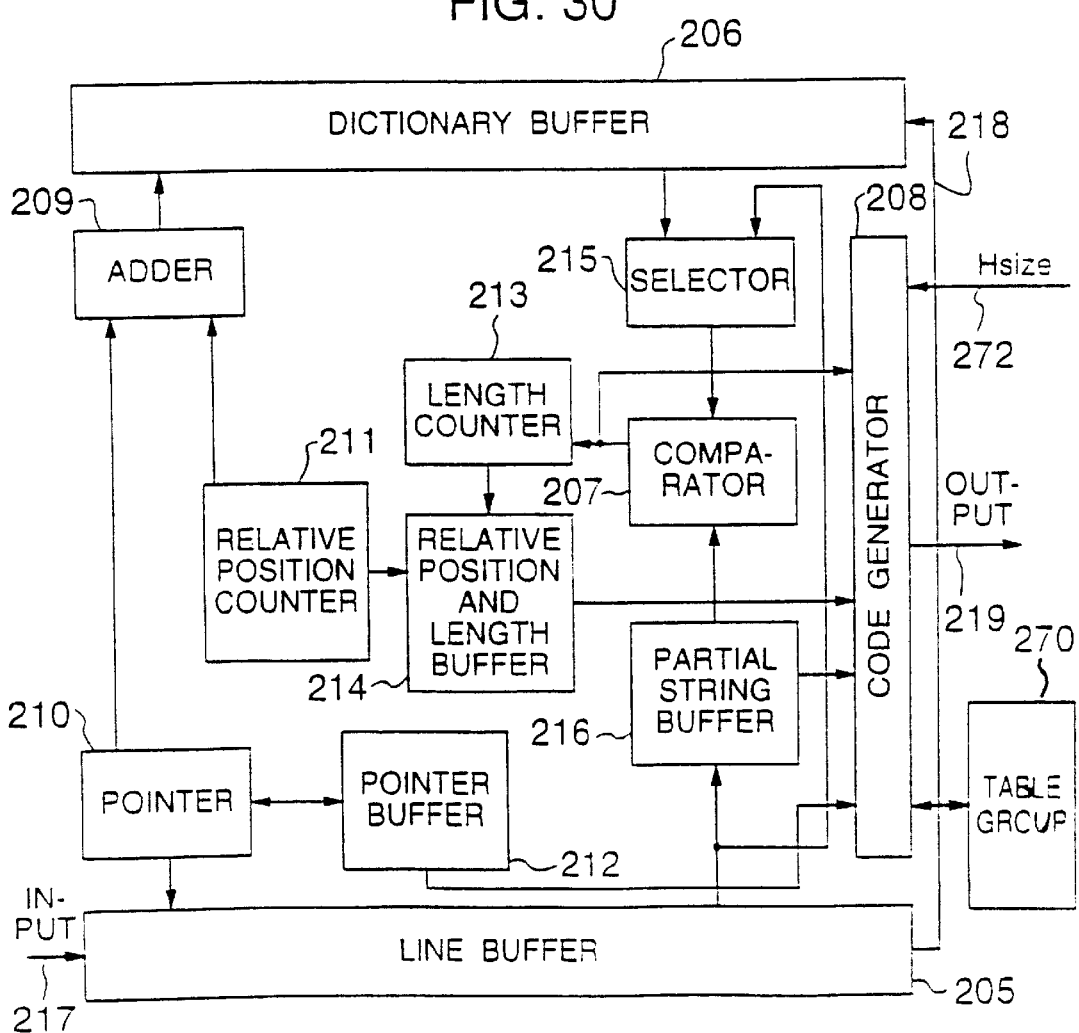

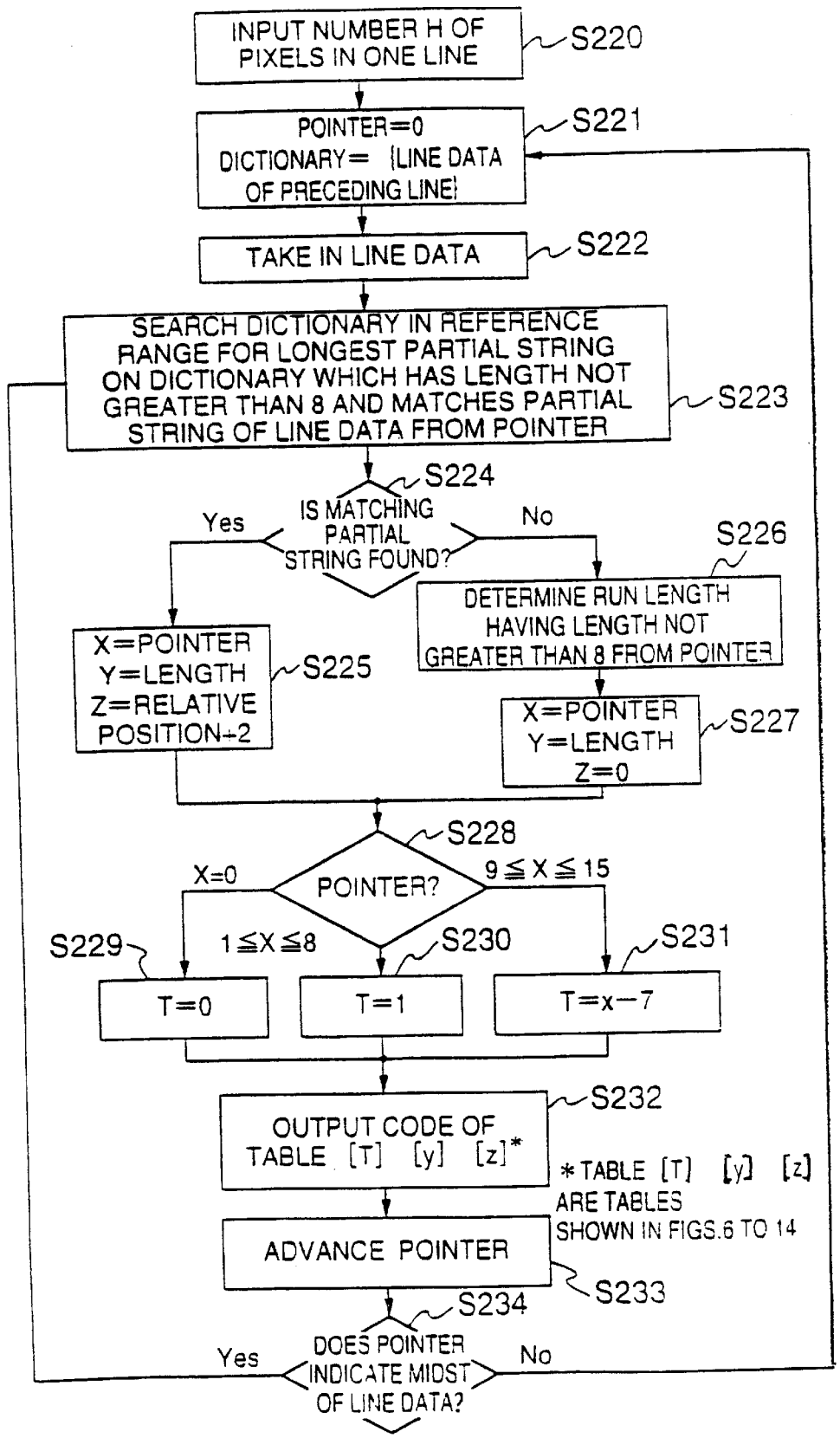

FIG. 32A

```
       COLUMN
ROW\  0 1 2 3 4 5 6 7 8 9 A B C D E F
  0   2 2 2 3 4 4 4 6 C C 6 6 3 3 3
  1   5 5 5 4 3 4 1 3 C C C 6 6 6 3 3
  2   5 5 4 3 4 3 5 4 C C C 5 5 A A A
  3   6 5 5 4 A A A A C C 5 5 A A A A
  4   C C 5 5 A A A A 6 5 5 4 A A A A
  5   C C C 5 5 A A A 5 5 4 3 4 3 5 4
  6   C C C 6 6 6 3 3 5 5 5 4 3 4 1 3
  7   6 C C 6 6 3 3 3 2 2 2 2 3 4 4 4
```

FIG. 32B

```
       COLUMN
ROW\  0 1 2 3 4 5 6 7 8 9 A B C D E F
  0   2 2 2 3 4 4 4 6 C C 6 6 3 3 3
  1   5 5 5 4 3 4 1 3 C C C 6 6 6 3 3
  2   5 5 4 3 4 3 5 4 C C C 5 5 A A A
  3   6 5 5 4 A A A A C C 5 5 A A A A
  4   C C 5 5 A A A A 6 5 5 4 A A A A
  5   C C C 5 5 A A A 5 5 4 3 4 3 5 4
  6   C C C 6 6 6 3 3 5 5 5 4 3 4 1 3
  7   6 C C 6 6 3 3 3 2 2 2 2 3 4 4 4
```

FIG. 32C

```
       COLUMN
ROW\  0 1 2 3 4 5 6 7 8 9 A B C D E F
  0   2 2 2 3 4 4 4 6 C C 6 6 3 3 3
  1   5 5 5 4 3 4 1 3 C C C 6 6 6 3 3
  2   5 5 4 3 4 3 5 4 C C C 5 5 A A A
  3   6 5 5 4 A A A A C C 5 5 A A A A
  4   C C 5 5 A A A A 6 5 5 4 A A A A
  5   C C C 5 5 A A A 5 5 4 3 4 3 5 4
  6   C C C 6 6 6 3 3 5 5 5 4 3 4 1 3
  7   6 C C 6 6 3 3 3 2 2 2 2 3 4 4 4
```

FIG. 33

| ROW | INTERMMEDIATE CODE STRING |
|---|---|
| 0 | [0, 2, 4][1, 3, 1][1, 4, 3][1, 6, 1][2, C, 2][4, 6, 2][6, 3, 3] |
| 1 | [0, 5, 3][1, 4, 1]{1, 0, 2}[1, 1, 1][1, 3, 1]{1, 1,2} {3, 0, 3} {6, -1, 3} |
| 2 | {0, 1, 5} {1, -1, 1}[1, 5, 1][1, 4, 1]{1, 0, 3}[4, 5, 2][6. A, 3] |
| 3 | [0, 6, 1]{1, -1, 3}[1, A. 4]{1, 1, 7} {8, 0, 1} |
| 4 | [0, C, 2]{1, -1, 2} {1, 0, 4}[1, 6, 1] {2, 1, 2}[4, 4, 1]{5. 0, 4} |
| 5 | {0, 0, 2} {1, -1, 6} {1, 1, 3}[4, 3, 1]{5, -1, 1}[6, 3, 1][7, 5, 1][8, 4, 1] |
| 6 | {0, 0, 3}[1, 6. 3][1, 3, 2]{1, 0, 2} {3, -1, 4}[7, 1, 1][8. 3, 1] |
| 7 | [0, 6, 1]{1, 0. 4} {1, 1, 2} {1, 0. 1} {1, 2. 4} {5, 0, 2} {7. -1, 1}[8, 4, 1] |

| y | z=0 | z=1 | z=2 | z=3 |
|---|---|---|---|---|
| | | RELATIVE POSITION | | |
| LENGTH | RUN LENGTH | -1 | 0 | +1 |
| 1 | 01111 | — | 0101 | 01100100 |
| 2 | 011011110 | — | 0000 | 011011111 |
| 3 | 0110110101 | — | 0100 | 01100101 |
| 4 | 0110110111 | — | 0010 | 01100111 |
| 5 | 01101101100 | — | 01110 | 01101110 |
| 6 | 01101101101 | — | 0011 | 01100110 |
| 7 | 0110110100 | — | 0011 | 01101100 |
| 8 | 011010 | — | 1 | 011000 |

| y | z=0 | z=1 | z=2 | z=3 |
|---|---|---|---|---|
| LENGTH | RUN LENGTH | RELATIVE POSITION | | |
| | | -1 | 0 | +1 |
| 1 | 10 | 0111 | 1101 | 01101 |
| 2 | 0100 | 01011 | 11001 | 00000 |
| 3 | 00110 | 110000 | 00111 | 001010 |
| 4 | 010100 | 001001 | 00001 | 0110011 |
| 5 | 0110001 | 0110000 | 010101 | 11000101 |
| 6 | 01100101 | 0001110 | 000110 | 00011111 |
| 7 | 00011110 | 01100100 | 1100011 | 11000100 |
| 8 | 001000 | 001011 | 111 | 00010 |

| y | z=0 | z=1 | z=2 | z=3 |
|---|---|---|---|---|
| LENGTH | RUN LENGTH | RELATIVE POSITION | | |
| | | -1 | 0 | +1 |
| 1 | 10 | 11111 | 11100 | 111100 |
| 2 | 11011 | 110000 | 110011 | 1111010 |
| 3 | 1101010 | 110001101 | 1100010 | 1100011101 |
| 4 | 1101011 | 110100001 | 1101001 | 1100011111 |
| 5 | 1101000111 | 110100010 | 110100000 | 1100011110 |
| 6 | 1100011100 | 1101000110 | 110001100 | 11101 |
| 7 | 110010 | 1111011 | 0 | — |
| 8 | — | — | — | — |

| y | z=0 | z=1 | z=2 | z=3 |
|---|-----|-----|-----|-----|
| LENGTH | RUN LENGTH | RELATIVE POSITION | | |
|  |  | -1 | 0 | +1 |
| 1 | 00 | 01011 | 01000 | 010100 |
| 2 | 01101 | 011100 | 0110001 | 01110111 |
| 3 | 0110011 | 01110101 | 0110000 | 0111010000 |
| 4 | 0110010 | 0111011011 | 011101001 | 0111011010 |
| 5 | 0111011000 | 0111010001 | 0111011001 | 01111 |
| 6 | 01001 | 010101 | 1 | — |
| 7 | — | — | — | — |
| 8 | — | — | — | — |

| y | z=0 | z=1 | z=2 | z=3 |
|---|-----|-----|-----|-----|
| LENGTH | RUN LENGTH | RELATIVE POSITION | | |
|  |  | -1 | 0 | +1 |
| 1 | 00 | 0100 | 01101 | 0111011 |
| 2 | 011100 | 010111 | 011001 | 01100001 |
| 3 | 0101101 | 0110001 | 011101001 | 011000000 |
| 4 | 01110101 | 011101000 | 011000001 | 01111 |
| 5 | 01010 | 0101100 | 1 | — |
| 6 | — | — | — | — |
| 7 | — | — | — | — |
| 8 | — | — | — | — |

| y | z=0 | z=1 | z=2 | z=3 |
|---|---|---|---|---|
| | RUN LENGTH | RELATIVE POSITION | | |
| LENGTH | | -1 | 0 | +1 |
| 1 | 01 | 00100 | 00101 | 00001 |
| 2 | 001111 | 00111000 | 0011101 | 0000001 |
| 3 | 0000000 | 001110010 | 001110011 | 0001 |
| 4 | 00110 | 000001 | 1 | — |
| 5 | — | — | — | — |
| 6 | — | — | — | — |
| 7 | — | — | — | — |
| 8 | — | — | — | — |

| y | z=0 | z=1 | z=2 | z=3 |
|---|---|---|---|---|
| | RUN LENGTH | RELATIVE POSITION | | |
| LENGTH | | -1 | 0 | +1 |
| 1 | 01 | 00100 | 00101 | 00001 |
| 2 | 00000 | 0011010 | 0011011 | 0001 |
| 3 | 00111 | 001100 | 1 | — |
| 4 | — | — | — | — |
| 5 | — | — | — | — |
| 6 | — | — | — | — |
| 7 | — | — | — | — |
| 8 | — | — | — | — |

| y | z=0 | z=1 | z=2 | z=3 |
|---|---|---|---|---|
| | RUN LENGTH | RELATIVE POSITION | | |
| LENGTH | | -1 | 0 | +1 |
| 1 | 00 | 01011 | 0100 | 0110 |
| 2 | 0111 | 01010 | 1 | — |
| 3 | — | — | — | — |
| 4 | — | — | — | — |
| 5 | — | — | — | — |
| 6 | — | — | — | — |
| 7 | — | — | — | — |
| 8 | — | — | — | — |

| y | z=0 | z=1 | z=2 | z=3 |
|---|---|---|---|---|
| | RUN LENGTH | RELATIVE POSITION | | |
| LENGTH | | -1 | 0 | +1 |
| 1 | 01 | 00 | 1 | — |
| 2 | — | — | — | — |
| 3 | — | — | — | — |
| 4 | — | — | — | — |
| 5 | — | — | — | — |
| 6 | — | — | — | — |
| 7 | — | — | — | — |
| 8 | — | — | — | — |

FIG. 43

| ROW | CODE STRING |
|---|---|
| 0 | 01101101110010 100011 001100100 100110 110111100 0111000110 001110011 |
| 1 | 0110110101010101 100100 11001 100001 100011 00000 0110000 001100 |
| 2 | 01101110 0111 100101 100100 00111 0111000101 001111010 |
| 3 | 01110110 110000 0101001010 11000100 1 |
| 4 | 0110111101100 01011 00001 100110 1111010 000100 1 |
| 5 | 0000 0001110 001010 000011 00100 010011 000101 010100 |
| 6 | 0100 001100110 01000011 11001 0111011011 000001 010011 |
| 7 | 011110110 00001 00000 1101 0101000010 0011101 01011 010100 |

FIG. 52A

```
        COLUMN
ROW \   0  1  2  3  4  5  6  7
   0  | 2  2  2  2  3  4  4  4
   1  | 5  5  5  4  3  4  1  3
   2  | 5  5  4  3  4  3  5  4
   3  | 6  5  5  4  a  a  a  a
   4  | c  c  5  5  a  a  a  a
   5  | c  c  c  5  5  a  a  a
   6  | c  c  c  6  6  6  3  3
   7  | 6  c  c  6  6  3  3  3
```

FIG. 52B

```
        COLUMN
ROW \   0  1  2  3  4  5  6  7
   0  | 2  2  2  2  3  4  4  4
a→ 1  | 5  5  5  4  3  4  1  3
   2  | 5  5  4  3  4  3  5  4
b→ 3  | 6  5  5  4  a  a  a  a
   4  | c  c  5  5  a  a  a  a
   5  | c  c  c  5  5  a  a  a
   6  | c  c  c  6  6  6  3  3
   7  | 6  c  c  6  6  3  3  3
```

FIG. 52C

```
        COLUMN
ROW \   0  1  2  3  4  5  6  7
   0  | 2  2  2  2  3  4  4  4
   1  | 5  5  5  4  3  4  1  3
   2  | 5  5  4  3  4  3  5  4     e
c→ 3  | 6  5  5  4  a  a  a  a   d
   4  | c  c  5  5  a  a  a  a
   5  | c  c  c  5  5  a  a  a
   6  | c  c  c  6  6  6  3  3
   7  | 6  c  c  6  6  3  3  3
```

FIG. 53

| ROW | CODE STRING |
|---|---|
| 0 | [2, 4][3, 1][4, 3] |
| 1 | [5, 3][4, 1]{0, 2}[1, 1][3, 1] |
| 2 | {1, 5} {-1, 1}[5, 1][4, 1] |
| 3 | [6, 1]{-1, 3}[a, 4] |
| 4 | [c, 2]{-1, 2} {0, 4} |
| 5 | {0, 2} {-1, 6} |
| 6 | {0, 3}[6, 3][3, 2] |
| 7 | [6, 1]{0, 4} {1, 2} {0, 1} |

FIG. 54

| LENGTH | CODE | | | | | | | |
|---|---|---|---|---|---|---|---|---|
| | T=0 | T=1 | T=2 | T=3 | T=4 | T=5 | T=6 | T=7 |
| 1 | 0 | 0 | 0 | 0 | 0 | 0 | 0 | — |
| 2 | 10 | 10 | 10 | 100 | 110 | 10 | 1 | — |
| 3 | 1100 | 1100 | 1100 | 101 | 10 | 11 | — | — |
| 4 | 1101 | 1101 | 1101 | 110 | 111 | — | — | — |
| 5 | 11110 | 11110 | 1110 | 111 | — | — | — | — |
| 6 | 111110 | 1110 | 1111 | — | — | — | — | — |
| 7 | 1110 | 11111 | — | — | — | — | — | — |
| 8 | 111111 | — | — | — | — | — | — | — |

FIG. 55A

| 0 (IDENTIFIER) | KIND OF DATA (4 BITS FIXED) | LENGTH (BIT LENGTH VARIABLE) ⌐361 |
|---|---|---|

| LENGTH | CODE |
|---|---|
| 1 | 0 |
| 2 | 10 |
| 3 | 110 |
| 4 | 1110 |
| 5 | 11110 |
| 6 | 111110 |
| 7 | 1111110 |
| 8 | 1111111 |

| 1 (IDENTIFIER) | RELATIVE POSITION (BIT LENGTH VARIABLE) | LENGTH (BIT LENGTH VARIABLE) ⌐362 |
|---|---|---|

| RELATIVE POSITION | CODE |
|---|---|
| -1 | 11 |
| 0 | 0 |
| 1 | 10 |

362a

| ROW | CODE STRING |
|---|---|
| 0 | 00101110 00110 0100110 |
| 1 | 00101110 001000 10110 000010 000110 |
| 2 | 1111110 1110 001010 001000 |
| 3 | 001100 1111100 000001110 |
| 4 | 0001010 11110 10111 |
| 5 | 1010 1111111 |
| 6 | 101100 00110110 0001110 |
| 7 | 001100 101101 1101 10 |

FIG. 62A

| ROW\COLUMN | 0 | 1 | 2 | 3 | 4 | 5 | 6 | 7 |
|---|---|---|---|---|---|---|---|---|
| 0 | 2 | 2 | 2 | 2 | 3 | 4 | 4 | 4 |
| 1 | 5 | 5 | 5 | 4 | 3 | 4 | 1 | 3 |
| 2 | 5 | 5 | 4 | 3 | 4 | 3 | 5 | 4 |
| 3 | 6 | 5 | 5 | 4 | a | a | a | a |
| 4 | c | c | 5 | 5 | a | a | a | a |
| 5 | c | c | c | 5 | 5 | a | a | a |
| 6 | c | c | c | 6 | 6 | 6 | 3 | 3 |
| 7 | 6 | c | c | 6 | 6 | 3 | 3 | 3 |

FIG. 62B

| ROW\COLUMN | 0 | 1 | 2 | 3 | 4 | 5 | 6 | 7 |
|---|---|---|---|---|---|---|---|---|
| 0 | 2 | 2 | 2 | 2 | 3 | 4 | 4 | 4 |
| 1 | 5 | 5 | 5 | 4 | 3 | 4 | 1 | 3 |
| 2 | 5 | 5 | 4 | 3 | 4 | 3 | 5 | 4 |
| 3 | 6 | 5 | 5 | 4 | a | a | a | a |
| 4 | c | c | 5 | 5 | a | a | a | a |
| 5 | c | c | c | 5 | 5 | a | a | a |
| 6 | c | c | c | 6 | 6 | 6 | 3 | 3 |
| 7 | 6 | c | c | 6 | 6 | 3 | 3 | 3 |

FIG. 63

| ROW | CODE STRING |
|---|---|
| 0 | [2, 4][3, 1][4, 3] |
| 1 | [5, 3][4, 1]{0, 2}[1, 1][3, 1] |
| 2 | {1, 5}{-1, 1}[5, 1][4, 1] |
| 3 | [6, 1]{-1, 3}[a, 4] |
| 4 | [c, 2]{-1, 2}{0, 4} |
| 5 | {0, 2}{-1, 6} |
| 6 | {0, 3}[6, 3][3, 2] |
| 7 | [6, 1]{0, 4}{1, 2}{0, 1} |

FIG. 64A

| 0 (IDENTIFIER) | KIND OF DATA (4 BITS FIXED) | LENGTH (BIT LENGTH VARIABLE) 461 |
|---|---|---|

FIG. 64B

| 1 (IDENTIFIER) | RELATIVE POSITION (BIT LENGTH VARIABLE) | LENGTH (BIT LENGTH VARIABLE) 462 |
|---|---|---|

FIG. 65A

| RELATIVE POSITION | CODE | | |
|---|---|---|---|
| | S'=0 | S'=1 | S'=2 |
| -1 | — | 11 | 1 |
| 0 | 0 | 0 | 0 |
| 1 | 1 | 10 | — |

FIG. 65B

| RELATIVE POSITION | CODE | | | | | |
|---|---|---|---|---|---|---|
| | S'=1 | | | S'=2 | | |
| | T'=-1 | T'=0 | T'=1 | T'=-1 | T'=0 | T'=1 |
| -1 | — | 1 | 1 | — | — | 1 |
| 0 | 0 | — | 0 | — | — | 0 |
| 1 | 1 | 0 | — | — | — | — |

FIG. 66A

| LENGTH | CODE |
|---|---|
| 1 | 0 |
| 2 | 10 |
| 3 | 110 |
| 4 | 1110 |
| 5 | 11110 |
| 6 | 111110 |
| 7 | 1111110 |
| 8 | 1111111 |

FIG. 66B

| LENGTH | CODE | | | | | | | |
|---|---|---|---|---|---|---|---|---|
| | U=0 | U=1 | U=2 | U=3 | U=4 | U=5 | U=6 | U=7 |
| 1 | 0 | 0 | 0 | 0 | 0 | 0 | 0 | — |
| 2 | 10 | 10 | 10 | 100 | 110 | 10 | 1 | — |
| 3 | 1100 | 1100 | 1100 | 101 | 10 | 11 | — | — |
| 4 | 1101 | 1101 | 1101 | 110 | 111 | — | — | — |
| 5 | 11110 | 11110 | 1110 | 111 | — | — | — | — |
| 6 | 111110 | 1110 | 1111 | — | — | — | — | — |
| 7 | 1110 | 11111 | — | — | — | — | — | — |
| 8 | 111111 | — | — | — | — | — | — | — |

| ROW | CODE STING |
|---|---|
| 0 | 00101110 00110 0100110 |
| 1 | 00101110 001000 10110 000010 000110 |
| 2 | 1111110 110 001010 001000 |
| 3 | 001100 1111100 000001110 |
| 4 | 0001010 11110 10111 |
| 5 | 1010 111111 |
| 6 | 101100 00110110 0001110 |
| 7 | 001100 101101 101 10 |

COMPRESSION AND DECOMPRESSION METHODS ON TWO-DIMENSIONAL IMAGE DATA

BACKGROUND OF THE INVENTION

1. Field of the Invention

The present invention relates to data compression and decompression methods for two-dimensional image data.

2. Description of the Related Art

An irreversible data compression method and a reversible data compression method are known as the conventional image compression method. Examples of the irreversible data compression method include JPEG (Joint Photographic Except Group) or MPEG (Moving Picture Except Group) using discrete cosine transformation (DCT). In the case where image data using color code (or color pallet call code) is to be compressed, such an irreversible data compression method cannot be used since the missing of information may be generated. Typical examples of the reversible data compression method include a method in which data compression is performed using the run length of information (run-length compression method) and a method in which data compression is performed in such a manner that frequently occurring information is registered in a dictionary (dictionary compression method). The latter method or dictionary compression method is disclosed by Ziv and Lempel, "Compression of Individual Sequences via Variable Rate Coding", IEEE Transactions on Information Theory, IT-24, pp. 530–536.

The above compression methods involve problems which will be mentioned in the following.

Though the run-length compression method is effective for image data which abounds with the same continuous information, this method is ineffective for image data which is not so, that is, there may be the case where the effect of compression does not appear at all.

Though the dictionary compression method is effective for image data which has a high hit ratio for the dictionary, this method is ineffective for image data which is not so. Also, since the hit ratio depends on a storage capacity for storing the dictionary, a storage location having a large capacity is needed if it is desired to obtain a high hit ratio. Further, since the large-capacity dictionary is involved, the number of times of reference to the dictionary is increased, thereby lowering the compression speed.

SUMMARY OF THE INVENTION

An object of the present invention is to provide a data compression method which makes compensation for the problems of the above-mentioned conventional compression methods and which can enhance the data compression ratio of image data to reduce the amount of information and can perform the compression at a high speed and to provide a data decompression method in which the compressed data can be expanded (or decompressed) at a high speed.

To achieve the above object, the present invention provides a first data compression method in which in the case where the reference to data of the immediately preceding line for successively scanned two-dimensional image data results in that there exists a partial data string which is the same as the immediately preceding line to the extent of at least one or more pixels, data of the position and the length of the partial data string on the immediately preceding line is outputted as data of that partial data string.

A first data decompression method of the present invention provides a decompression method for compressed two-dimensional image data in which in the case where there exists a partial data string which is the same as the immediately preceding line to the extent of at least one or more pixels, information of the position and the length of the partial data string on the immediately preceding line is successively inputted as data of the overlapping portion, the method comprising holding at least data of the immediately preceding line, extracting the information concerning the position and the length of said partial data string from the inputted compressed data, and extracting on the basis of the extracted information, that portion of the held data of the immediately preceding line which corresponds to the length of said partial data string from the position of said partial data string, for inputted data of the current line, the extracted data being outputted as decompressed data.

A first data compression apparatus for realizing the first data compression method comprises reference memory means for holding data of the immediately preceding line for successively inputted two-dimensional image data, buffer means for extracting a plurality of continuous data strings from an inputted signal of the current line to store them as a partial data string to be compressed, scanning comparison means for detecting whether or not the same partial data string as the partial data string to be compressed exists in the data stored in the reference memory means, and code generating means by which in the case where the presence of the same partial data string is detected by the scanning comparison means, data of the position and the length of the partial data string on the data of the immediately line stored in the reference memory means is outputted as data of that partial data string of the current line.

A first data decompression apparatus for realizing the first data decompression method comprises buffer memory means for holding data of the immediately preceding line for successively inputted two-dimensional image data, extracting means for extracting the information concerning the position and the length of the partial data string from inputted compressed data, and decoding means for extracting on the basis of the extracted information, that portion of the data of the immediately preceding line stored in the buffer memory means which corresponds to the length of the partial data string from the position of the partial data string, for inputted data of the current line, and outputting the extracted data as decompressed data.

To achieve the above object, a second data compression method of the present invention provides a compression method for two-dimensional image data in which a compression processing is performed in the case where the reference to data of the immediately preceding line for successively scanned two-dimensional image data results in that there exists a partial data string which is the same as the immediately preceding line to the extent of at least one or more pixels, the method comprising preparing tables which are provided for the respective positions of a pixel of interest on the current line and in which a different code is allotted in accordance with the relative position of a leading pixel of said partial data string and the pixel of interest and the length of said partial data string on the immediately preceding line, and selecting, in the case where there exists a partial data string which is the same as the immediately preceding line to the extent of at least one or more pixels, said table in accordance with the position of a pixel of interest of input data on the current line to output a code corresponding to the leading position and the length of the partial data string on the immediately preceding line.

A second data decompression method of the present invention provides a decompression method for compressed two-dimensional image data in which in the case where there exists a partial data string which is the same as the immediately preceding line to the extent of at least one or more pixels, a code differing in accordance with the relative position and the length of the partial data string on the immediately preceding line for each leading position of the compressed data on the current line is allotted and successively inputted as data of the overlapping portion, the method comprising holding at least data of the immediately preceding line in a buffer, selecting a table corresponding to the position of a pixel of interest to be decompressed on the current line, and extracting said code from the inputted compressed data to refer to the selected table on the basis of the extracted code so that data continuing from a bit corresponding to the relative position of said partial data string to the extent of the length of said partial data string is extracted from said buffer for the inputted data of the current line, the extracted data being outputted as decompressed data.

A second data compression apparatus for realizing the second data compression method comprises reference memory means for holding data of the immediately preceding line for successively inputted two-dimensional image data, buffer means for extracting a plurality of continuous data strings from an inputted signal of the current line to store them as a partial data string to be compressed, scanning comparison means for detecting whether or not the same data string as a data string continuing from a pixel of interest of said partial data string to be compressed exists in the data stored in said reference memory means, and code generating means by which in the case where the presence of the same data string is detected by said scanning comparison means, data of the position of a leading pixel of said partial data string relative to said pixel of interest and the length of said partial data string on the data of the immediately line stored in said reference memory means is determined and a corresponding code is outputted as data of that partial data string of the current line by referring to a table in which a different code is allotted in accordance with said relative position and the length of said partial data string for each position of the pixel of interest on the current line.

A second data decompression apparatus for realizing the second data decompression method provides a decompression apparatus for compressed two-dimensional image data in which in the case where there exists in two-dimensional image data a partial data string which is the same as the immediately preceding line to the extent of at least one or more pixels, there is successively inputted, as data of the overlapping portion, data encoded by referring to a table in which a different code is allotted in accordance with the relative position and the length of a partial data string on the immediately preceding line for each leading position of the compressed data on the current line, the apparatus comprising buffer memory means for holding data of the immediately preceding line, inverse transformation tables provided for the respective positions of a pixel of interest on the current line for outputting data of the relative position and the length of a partial data string on the immediately preceding line in accordance with an inputted code, and decoding means for selecting an inverse transformation table corresponding to the position on the current line of a pixel of interest to be subjected to the decoding of the inputted data, extracting said code from the inputted data to refer to the selected table on the basis of said code so that data of the relative position and the length of a partial data string on the immediately preceding line is derived from said inverse transformation table, and extracting, from said buffer memory means, data which continues from a bit corresponding to the relative position of said partial data string to the extent of the length of said partial data string, the extracted data being outputted as decompressed data.

To achieve the above object, a third data compression method of the present invention provides a compression method for two-dimensional image data in which a compression processing is performed in the case where the reference to data of the immediately preceding line for successively scanned two-dimensional image data results in that there is detected in the current line a partial data string which is the same as the immediately preceding line to the extent of at least one or more pixels, the method comprising preparing tables which are provided for the respective values of T, T being T=0 when x=0, T=1 when $1 \leq x \leq H-N$, and T=x-H+N+1 when $H-N+1 \leq x \leq H-1$ where H is the number of pixels in one line of said two-dimensional image data, N is the maximum detection string length of said partial data string ($1 \leq N \leq H$) and x is the position of a pixel of interest on the current line from a leading pixel thereof ($0 \leq x \leq H-1$) and in which a different code is allotted in accordance with the relative position of a leading pixel of said partial data string and said pixel of interest and the length of said partial data string on the immediately preceding line, and determining, in the case where there is detected in the current line a partial data string which is the same as the immediately preceding line to the extent of at least one or more pixels, the value of T on the basis of the position x of said pixel of interest on the current line and selecting the corresponding table on the basis of the determined value of T to output a code corresponding to the leading position and the length of the partial data string on the current line.

A third data decompression method of the present invention provides a decompression method for compressed two-dimensional image data in which in the case where the reference to data of the immediately preceding line for successively scanned two-dimensional image data results in that there is detected in the current line a partial data string which is the same as the immediately preceding line to the extent of at least one or more pixels, there is successively inputted as data of the overlapping portion a code which differs in accordance with the relative position of a leading pixel of said partial data string and a pixel of interest and the length of said partial data string on the immediately preceding line for each value of T, T being T=0 when x=0, T=1 when $1 \leq x \leq H-N$, and T=x-H+N+1 when $H-N+1 \leq x \leq H-1$ where H is the number of pixels in one line of said two-dimensional image data, N is the maximum detection string length of said partial data string ($1 \leq N \leq H$) and x is the position of said pixel of interest on the current from a leading pixel thereof ($0 \leq x \leq H-1$), the method comprising holding at least decompressed data of the immediately preceding line in a buffer, determining the value of T on the basis of the position x of said pixel of interest to be decompressed on the current line to select a corresponding table on the basis of the determined value of T from tables which are prepared for the respective values of T and in which a different code is allotted in accordance with said relative position and said length, and extracting said code from the inputted compressed data to refer to the selected table on the basis of the extracted code so that data continuing from a bit corresponding to the leading position of said partial data string to the extent of the length of said partial data string is extracted from said buffer for the inputted data of the current line and the extracted data is outputted as decompressed data.

A third data compression apparatus for realizing the third data compression method comprises reference memory means for holding data of the immediately preceding line for successively inputted two-dimensional image data, buffer means for extracting a plurality of continuous data strings within the range of a predetermined length from an inputted signal of the current line to store them as a partial data string to be compressed, scanning comparison means for detecting whether or not the same partial data string as a partial data string continuing from a pixel of interest of said partial data string to be compressed exists in the data stored in said reference memory means, and code generating means by which in the case where said scanning comparison means detects the same partial data string, the relative position of a leading pixel of said partial data string and said pixel of interest and the length of said partial data string on the data of the immediately line stored in said reference memory means are determined, and a corresponding code is outputted as data of that partial data string on the current line by referring to tables which are prepared for the respective values of T, T being T=0 when x=0, T=1 when $1 \leq x \leq H-N$, and $T=x-H+N+1$ when $H-N+1 \leq x \leq H-1$ where H is the number of pixels in one line of said two-dimensional image data, N is the maximum detection string length of said partial data string ($1 \leq N \leq H$) and x is the position of a pixel of interest on the current from a leading pixel thereof ($0 \leq x \leq H-1$) and in which a different code is allotted in accordance with said relative position and said length of the partial data string.

A third data decompression apparatus for realizing the third data decompression method provides a decompression apparatus for compressed two-dimensional image data in which in the case where the reference to data of the immediately preceding line for successively scanned two-dimensional image data results in that there is detected in the current line a partial data string which is the same as the immediately preceding line to the extent of at least one or more pixels, there is successively inputted as data of the overlapping portion a code which differs in accordance with the relative position of a leading pixel of said partial data string and a pixel of interest and the length of said partial data string on the immediately preceding line for each value of T, T being T=0 when x=0, T=1 when $1 \leq x \leq H-N$, and $T=x-H+N+1$ when $H-N+1 \leq x \leq H-1$ where H is the number of pixels in one line of said two-dimensional image data, N is the maximum detection string length of said partial data string ($1 \leq N \leq H$) and x is the position of said pixel of interest on the current from a leading pixel thereof ($0 \leq x \leq H-1$), the apparatus comprising buffer memory means for holding decompressed data of the immediately preceding line, inverse transformation tables which are prepared for the respective values of T and in which the relative position of a leading pixel of said partial data string and said pixel of interest and the length of said partial data string on the immediately preceding line are allotted in accordance with said code, and decoding means for determining the value of T on the basis of the position x of a pixel of interest of the compressed data to be decompressed on the current line from a leading pixel thereof to select the inverse transformation table corresponding to the determined value of T, extracting said code from the inputted data to refer to the selected inverse transformation table on the basis of said code so that data of the leading position and the length of said partial data string on the immediately preceding line is derived from said inverse transformation table, and extracting, from said buffer memory means, data which continues from a bit corresponding to the leading position of said partial data string to the extent of the length of said partial data string, so that the extracted data is outputted as decompressed data.

To achieve the above object, the present invention provides a fourth data compression method in which in the case where the reference to data of the immediately preceding line for successively scanned two-dimensional image data results in that there is detected in the current line a partial data string to be compressed which is a partial data string which is the same as the immediately preceding line to the extent of at least one or more pixels, there are outputted, as compressed data of said partial data string to be compressed, a code which differs in accordance with the position of an immediately preceding partial data string on the immediately preceding line corresponding to said partial data string to be compressed and a code which differs in accordance with the length of said immediately preceding partial data string for each value of the position $x_1$ of a pixel of interest as a leading pixel of said partial data string to be compressed from a leading pixel of the current line and/or the position $x_2$ of a leading pixel of said immediately preceding partial data string from a leading pixel of the immediately preceding line.

A fourth data decompression method of the present invention provides a decompression method for compressed two-dimensional image data in which in the case where the reference to data of the immediately preceding line for successively scanned two-dimensional image data results in that there is detected in the current line a partial data string to be compressed which is a partial data string which is the same as the immediately preceding line to the extent of at least one or more pixels, there are successively inputted, as compressed data of said partial data string to be compressed, a code which differs in accordance with the position of an immediately preceding partial data string on the immediately preceding line corresponding to said partial data string to be compressed and a code which differs in accordance with the length of said immediately preceding partial data string for each value of the position $x_1$ of a pixel of interest as a leading pixel of said partial data string to be compressed from a leading pixel of the current line and/or the position $x_2$ of a leading pixel of said immediately preceding partial data string from a leading pixel of the immediately preceding line, the method comprising holding at least decompressed data of the immediately preceding line, extracting information concerning the position of said immediately preceding partial data string from the inputted compressed data while determining the position $x_2$ of the leading pixel of said immediately preceding partial data string from the leading pixel of the immediately preceding line on the basis of the extracted information to extract information concerning the length of said immediately preceding partial string on the basis of the position $x_1$ of a pixel of interest to be decompressed from a leading pixel of the current line and/or said position $x_2$, and extracting said immediately preceding partial data string from the held decompressed data of the immediately preceding line on the basis of the information concerning the position of said immediately preceding partial data string and the information concerning the length of said immediately preceding partial string to output said immediately preceding partial data string as decompressed data of the inputted compressed data.

A fourth data compression apparatus for realizing the fourth data compression method comprises reference memory means for holding data of the immediately preceding line for successively inputted two-dimensional image data, buffer means for extracting a plurality of continuous data strings from an inputted signal of the current line to store them as a partial data string to be compressed, scanning comparison means for detecting whether or not the same partial data string as said partial data string to be compressed exists in the data stored in said reference memory means, and code generating means by which in the case where said scanning comparison means detects the same partial data string, a code differing in accordance with the position of an immediately preceding partial data string corresponding to said partial data string to be compressed on the data stored in said reference memory means and a code differing in accordance with the length of said immediately preceding partial data string for each value of the position $x_1$ of a pixel of interest as a leading pixel of said partial data string to be compressed from a leading pixel of the current line and/or the position $x_2$ of a leading pixel of said immediately preceding partial data string from a leading pixel of the immediately preceding line are outputted as compressed data of said partial data string to be compressed.

A fourth data decompression apparatus for realizing the fourth data decompression method provides a decompression apparatus for compressed two-dimensional image data in which in the case where the reference to data of the immediately preceding line for successively scanned two-dimensional image data results in that there is detected in the current line a partial data string to be compressed which is a partial data string which is the same as the immediately preceding line to the extent of at least one or more pixels, there are successively inputted, as compressed data of said partial data string to be compressed, a code which differs in accordance with the position of an immediately preceding partial data string corresponding to said partial data string to be compressed on the immediately preceding line and a code which differs in accordance with the length of said immediately preceding partial data string for each value of the position $x_1$ of a pixel of interest as a leading pixel of said partial data string to be compressed from a leading pixel of the current line and/or the position $x_2$ of a leading pixel of said immediately preceding partial data string from a leading pixel of the immediately preceding line, the apparatus comprising buffer memory means for holding at least decompressed data of the immediately preceding line, extracting means for extracting information concerning the position of said immediately preceding partial data string from the inputted compressed data while determining the position $x_2$ of the leading pixel of said immediately preceding partial data string from the leading pixel of the immediately preceding line on the basis of the extracted information to extract information concerning the length of said immediately preceding partial string on the basis of the position $x_1$ of a pixel of interest to be decompressed from a leading pixel of the current line and/or said position $x_2$, and decoding means for extracting said immediately preceding partial data string from the decompressed data of the immediately preceding line stored in the buffer memory means on the basis of the information concerning the position of said immediately preceding partial data string and the information concerning the length of said immediately preceding partial data string to output said immediately preceding partial data string as decompressed data of the inputted compressed data.

To achieve the above object, a fifth data compression method of the present invention provides a data compression method in which in the case where the reference to data of the immediately preceding line for successively scanned two-dimensional image data results in that there is detected from the current line a partial data string to be compressed which has a pixel of interest as its leading pixel and a length corresponding to one or more pixels and which matches data of the immediately preceding line to the longest extent, there are outputted, as compressed data of said partial data string to be compressed, a code which differs in accordance with the relative position of said pixel of interest and a leading pixel of an immediately preceding partial data string on the immediately preceding line corresponding to said partial data string to be compressed and a code which differs in accordance with the length of said immediately preceding partial data string, wherein in the case where the detection of said partial data string to be compressed continues on the same line two or more times, a code corresponding to said relative position and outputted as compressed data of the partial data string to be compressed which is subjected to the second or subsequent detection, is allotted with a code which differs in accordance with the relative position of a pixel of interest and a leading pixel of an immediately preceding partial data string for each value of T which is the relative position of compressed data previously outputted.

A fifth data decompression method of the present invention provides a decompression method for compressed two-dimensional image data in which in the case where the reference to data of the immediately preceding line for successively scanned two-dimensional image data results in that there is detected from the current line a partial data string to be compressed which has a pixel of interest as its leading pixel and a length corresponding to one or more pixels and which matches data of the immediately preceding line to the longest extent, there are successively inputted, as compressed data of said partial data string to be compressed, a code which differs in accordance with the relative position of said pixel of interest and a leading pixel of an immediately preceding partial data string on the immediately preceding line corresponding to said partial data string to be compressed and a code which differs in accordance with the length of said immediately preceding partial data string, and in which in the case where the detection of said partial data string to be compressed continues on the same line two or more times, a code corresponding to said relative position and inputted as compressed data of the partial data string to be compressed which is subjected to the second or subsequent detection, is allotted with a code which differs in accordance with the relative position of a pixel of interest and a leading pixel of an immediately preceding partial data string for each value of T, T being the relative position of compressed data previously inputted, the method comprising holding at least decompressed data of the immediately preceding line, extracting information concerning said relative position and the length of said immediately preceding partial data string from the inputted compressed data and extracting, in the case where the inputted compressed data is compressed data of a partial string data to be compressed which is subjected to the second or subsequent detection, information concerning said relative position on the basis of the value of T, and extracting said immediately preceding partial data string from the held compressed data of the immediately preceding line on the basis of the extracted information concerning said relative position and said length of said immediately preceding partial data string to output the extracted immediately preceding partial data string as decompressed data of the inputted compressed data.

A fifth data compression apparatus for realizing the fifth data compression method comprises comprises reference memory means for holding data of the immediately preceding line for successively inputted two-dimensional image data, buffer means for extracting from an inputted signal of the current line a plurality of partial data strings having a pixel of interest as its leading pixel and a length corresponding to one or more pixels to store them, scanning comparison means for detecting a partial data string to be compressed which is that one of said partial data strings stored in said buffer means which matches data stored in said reference memory means to the longest extent, and code generating means by which in the case where said scanning comparison means detects said partial data string to be compressed, a code differing in accordance with the relative position of said pixel of interest and a leading pixel of an immediately preceding partial data string on the data stored in said reference memory means and corresponding to said partial data string to be compressed and a code differing in accordance with the length of said immediately preceding partial data string are outputted as compressed data of said partial data string to be compressed, and by which in the case where said partial data string to be compressed is detected by said scanning comparison means on the same line continuously two or more times, a code corresponding to said relative position and outputted as compressed data of a partial data string to be compressed which is subjected to the second or subsequent detection, is allotted with a code which differs in accordance with the relative position of a pixel of interest and a leading pixel of an immediately preceding partial data string for each value of T, T being the relative position of compressed data previously outputted.

A fifth data decompression apparatus for realizing the fifth data decompression method provides a decompression apparatus for compressed two-dimensional image data in which in the case where the reference to data of the immediately preceding line for successively scanned two-dimensional image data results in that there is detected from the current line a partial data string to be compressed which has a pixel of interest as its leading pixel and a length corresponding to one or more pixels and which matches data of the immediately preceding line to the longest extent, there are successively inputted, as compressed data of said partial data string to be compressed, a code which differs in accordance with the relative position of said pixel of interest and a leading pixel of an immediately preceding partial data string on the immediately preceding line corresponding to said partial data string to be compressed and a code which differs in accordance with the length of said immediately preceding partial data string, and in which in the case where the detection of said partial data string to be compressed continues on the same line two or more times, a code corresponding to said relative position and inputted as compressed data of a partial data string to be compressed which is subjected to the second or subsequent detection, is allotted with a code which differs in accordance with the relative position of a pixel of interest and a leading pixel of an immediately preceding partial data string for each value of T, T being the relative position of compressed data previously inputted, the apparatus comprising buffer memory means for holding at least decompressed data of the immediately preceding line, extracting means by which information concerning said relative position and the length of said immediately preceding partial data string is extracted from the inputted compressed data, and by which when the inputted compressed data is compressed data of a partial string data to be compressed which is subjected to the second or subsequent detection, information concerning said relative position is extracted on the basis of the value of T, and decoding means for extracting said immediately preceding partial data string from the compressed data of the immediately preceding line stored in said buffer memory means on the basis of the information concerning said relative position and the length of said immediately preceding partial data string extracted by said extracting means to output the extracted immediately preceding partial data string as decompressed data of the inputted compressed data.

BRIEF DESCRIPTION OF THE DRAWINGS

FIGS. 4A to 4C are explanatory diagrams showing image data before data compression.

FIG. 5 is an explanatory diagram showing image data after data compression.

FIGS. 13A to 13C are explanatory diagrams showing image data before data compression.

FIG. 14 is an explanatory diagram showing image data after data compression.

FIG. 15 is a diagram representing a table in the case where the position of a pixel of interest on the current line is the 0th column.

FIG. 16 is a diagram representing a table in the case where the position of the pixel of interest on the current line is the 1st column.

FIG. 17 is a diagram representing a table in the case where the position of the pixel of interest on the current line is the 2nd column.

FIG. 18 is a diagram representing a table in the case where the position of the pixel of interest on the current line is the 3rd column.

FIG. 19 is a diagram representing a table in the case where the position of the pixel of interest on the current line is the 4th column.

FIG. 20 is a diagram representing a table in the case where the position of the pixel of interest on the current line is the 5th column.

FIG. 21 is a diagram representing a table in the case where the position of the pixel of interest on the current line is the 6th column.

FIG. 22 is a diagram representing a table in the case where the position of the pixel of interest on the current line is the 7th column.

FIG. 23 is an explanatory diagram showing image data after data compression in which actual codes are allotted.

FIG. 29 is an explanatory diagram showing two-dimensional image data for explaining the principle of a third data compression and decompression method of the present invention.

FIG. 30 is a block diagram showing a data compression circuit according to an embodiment of a third data compression apparatus for realizing the third data compression method of the present invention.

FIG. 31 is a flow chart showing the operation of data compression in the data compression circuit shown in FIG. 30.

FIGS. 32A to 32C are explanatory diagrams showing image data before data compression.

FIG. 33 is an explanatory diagram showing image data after data compression.

FIG. 34 is a diagram representing a table of T=0.

FIG. 35 is a diagram representing a table of T=1.

FIG. 36 is a diagram representing a table of T=2.

FIG. 37 is a diagram representing a table of T=3.

FIG. 38 is a diagram representing a table of T=4.

FIG. 39 is a diagram representing a table of T=5.

FIG. 40 is a diagram representing a table of T=6.

FIG. 41 is a diagram representing a table of T=7.

FIG. 42 is a diagram representing a table of T=8.

FIG. 43 is an explanatory diagram showing image data after data compression in which actual codes are allotted.

FIGS. 52A to 52C are explanatory diagrams showing image data before data compression.

FIG. 53 is an explanatory diagram showing image data after data compression.

FIG. 54 is a diagram representing the codes of length in the case of dictionary compression.

FIGS. 55A and 55B are diagrams representing actual codes.

FIGS. 62A and 62B are explanatory diagrams showing image data before data compression.

FIG. 63 is an explanatory diagram showing image data after data compression.

FIGS. 64A and 64B are diagrams for explaining the construction of the actual code.

FIGS. 65A and 65B are diagrams showing a table of codes of relative position.

FIGS. 66A and 66B are diagrams showing a table of codes of length.

DESCRIPTION OF THE PREFERRED EMBODIMENTS (First Data Compression/Decompression Method of the Invention)

Figure 1:
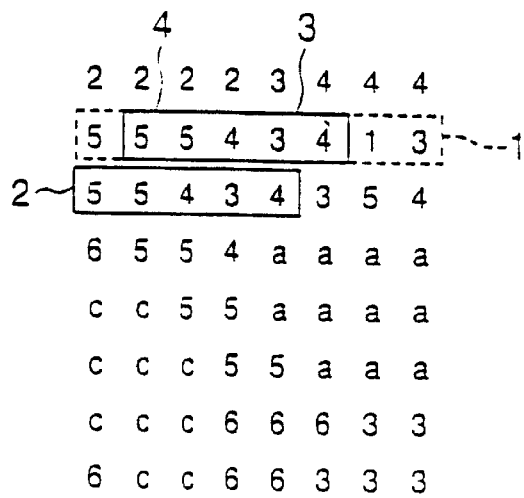
FIG. 1 is an explanatory diagram showing two-dimensional image data for explaining the principle of a first data compression and decompression method of the present invention.

In order to facilitate the understanding of a first data compression/decompression method of the present invention, the principle of the first data compression/decompression method will be explained using the drawings. In the first data compression/decompression method of the present invention, data of the immediately preceding line in successively scanned two-dimensional image data (shown in FIG. 1) is held as reference data, using a property that a certain pixel(s) in the image data is similar to a group of pixels in the neighborhood thereof (A buffer for storing the reference data will hereinafter be referred to as "dictionary" 1.). The reference to the dictionary 1 of the immediately preceding line is made in connection with a partial string 2 of line data to be compressed. When the reference results in that the partial string matches a partial string in the dictionary 1 of the immediately preceding line to the longest possible extent, the position 4 and the length of the partial string 3 on the dictionary 1 are encoded, thereby performing data compression. At this time, the position 4 of the partial string 3 on the dictionary 1 is represented as a relative position on a two-dimensional space from the partial string 2, and this relative position and the length of the partial string 3 are encoded. Also, the range of reference to the dictionary 1 is limited to fall within a range in which the degree of similarity of the partial string 2 to be compressed to the partial string on the dictionary 1 is high. Further, in the case where the partial string 2 to be compressed does not match the partial string on the dictionary 1, compression such as run-length compression is applied to the partial string 2 to be compressed.

It is preferable that the above coding is made not with fixed-length codes but with variable-length codes in order to enhance the compression ratio by allotting a short code to data which has a high probability of occurrence.

In the first data compression/decompression method of the present invention, a dictionary is required to store only the immediately preceding line, as mentioned above. Therefore, the capacity of the dictionary is very small. Also, the reference to the dictionary is made within a range in which the degree of similarity is high, and the reference is made to a longest possible partial string. Therefore, a high compression ratio can be attained and a processing for compression/decompression can be performed at a high speed. By applying compression such as run-length compression to the first line of the image data and a partial string for which the reference to the dictionary is impossible, a higher compression ratio is obtained.

Figure 2:
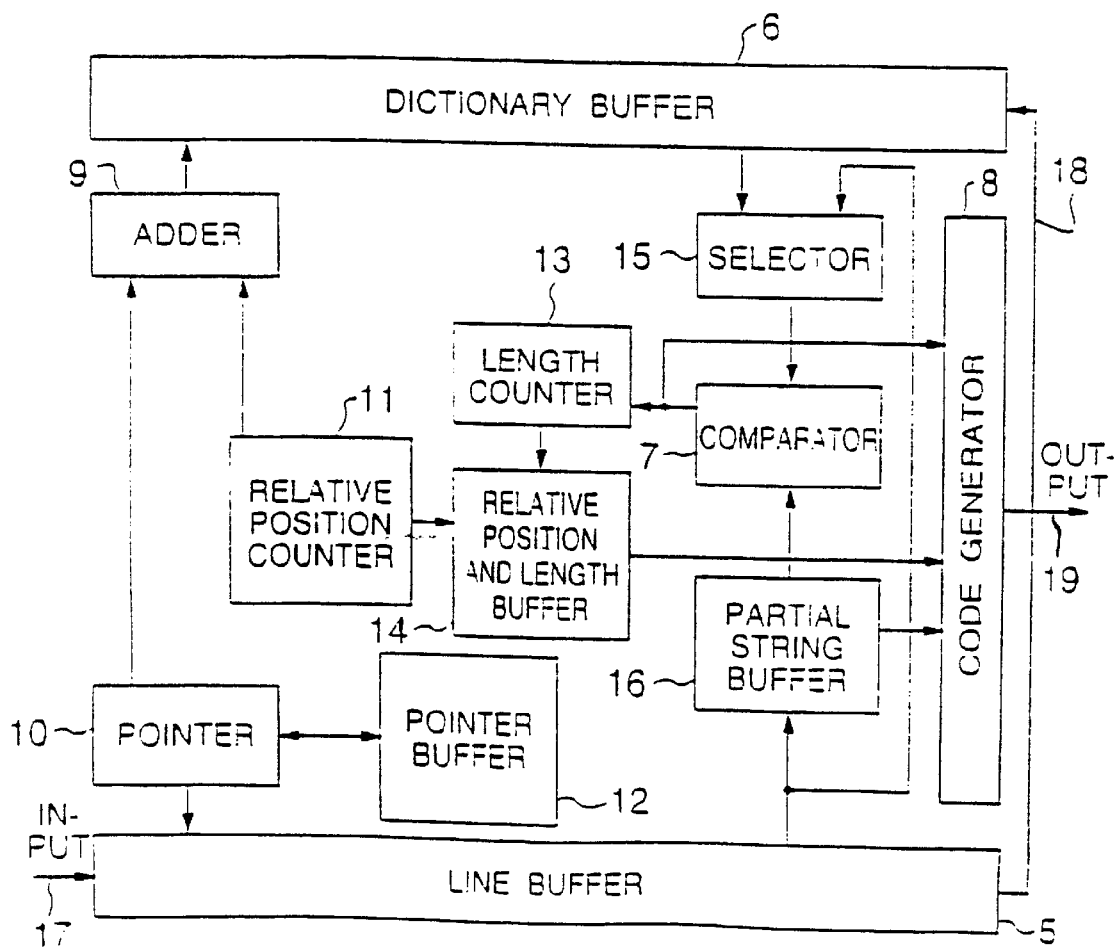
FIG. 2 is a block diagram showing a data compression circuit according to an embodiment of a first data compression apparatus for realizing the first data compression method of the present invention.

An embodiment of the first data compression/decompression method of the present invention will now be explained. As shown in FIG. 2, a data compression circuit according to an embodiment of a first data compression apparatus for realizing the first data compression method of the present invention includes a line buffer 5, a dictionary buffer 6 for holding data of the immediately preceding line, a comparator 7, a code generator 8, an adder 9, a pointer 10, a relative position counter 11, a pointer buffer 12, a length counter 13, a relative position and length buffer 14, a selector 15 and a partial string buffer 16. In FIG. 2, reference numeral 17 denotes a line buffer input signal line, reference numeral 18 a dictionary buffer input signal line, and reference numeral 19 a code output line.

Figure 3:
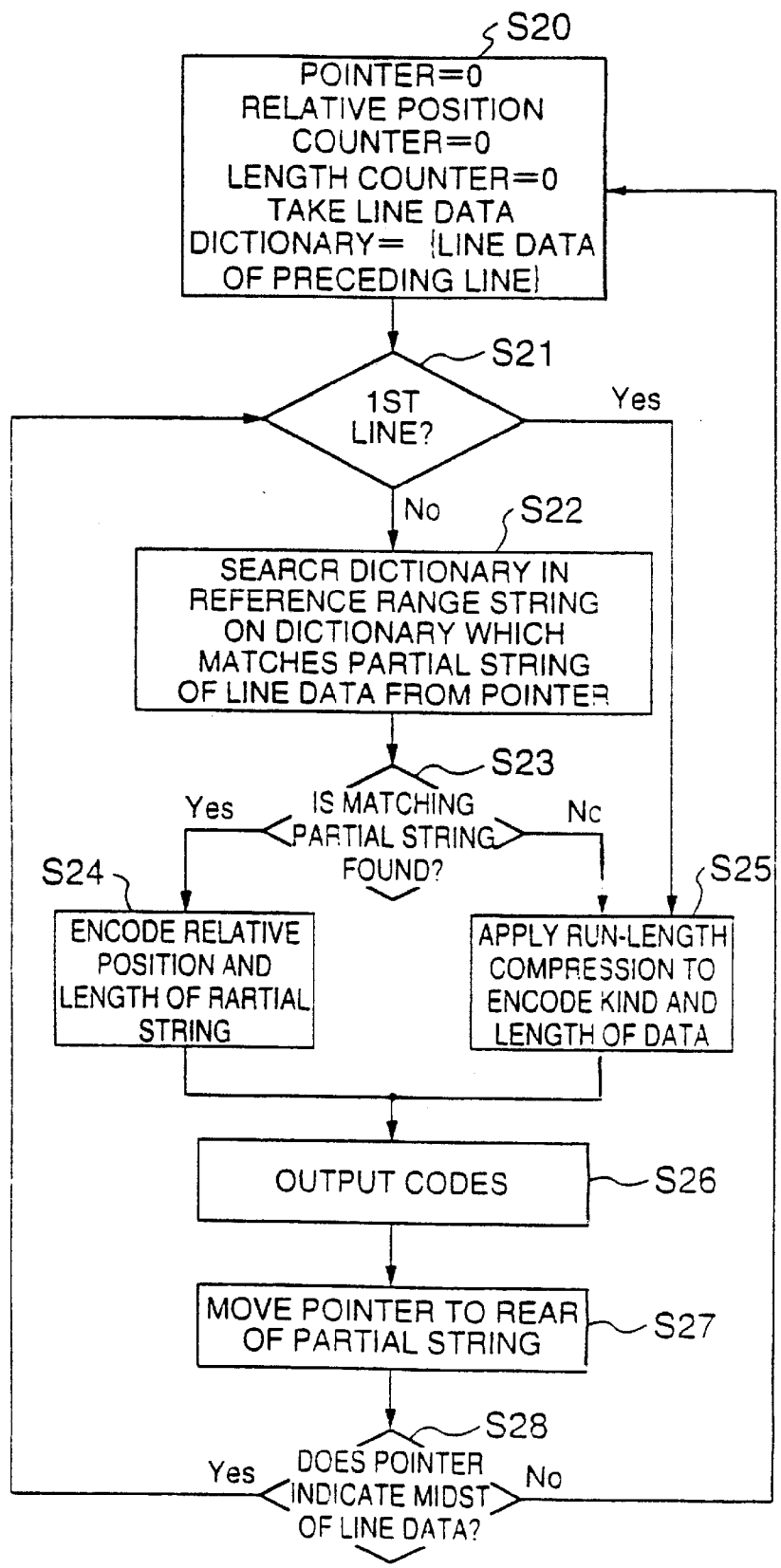
FIG. 3 is a flow chart showing the operation of data compression in the data compression circuit shown in FIG. 2.

Next, the operation of the data compression circuit having the above construction will be explained referring to FIG. 3. First or in step S20, the pointer 10 and so forth are initialized, and successively inputted image data is stored into the line buffer 5 through the line buffer input signal line 17. At this time, data pushed out of the line buffer 5 is stored into the dictionary buffer 6 through the dictionary buffer input signal line 18. Next, if line data inputted to the line buffer 5 is data of the first line (step S21), the flow goes to step S25 in which data of the line buffer 5 indicated by the pointer 10 is stored into the partial string buffer 16. Also, the pointer 10 is advanced by one so that the data of the line buffer 5 is inputted to the comparator 7 through the selector 15 for comparison with data of the partial string buffer 16. If the result of comparison indicates the matching, the length counter 13 is incremented and the next data indicated by the pointer is inputted to the comparator 7 through the selector 15 for comparison with data of the partial string buffer 16. The comparison with data of the partial string buffer 16 is repeated with the pointer being advanced one by one until the matching ceases to be obtained. When the matching ceases to be obtained, data of the length counter 13 and data of the partial string buffer 16 are inputted to the code generator 8 which in turn outputs codes through the code output line 19 (step S26). Thus, all data of the first line are processed.

If line data inputted to the line buffer 5 is data of the second or subsequent line (step S21), the flow goes to step S22 in which a search for the longest partial string is made. The search for the longest partial string shown as one flow step S22 in FIG. 3 is made in accordance with the following procedure. The concept of the search for the longest partial string will be explained using 8×8 image data shown in FIGS. 4A to 4C by way of example. In the present embodiment, the judgement of whether or not a line preceding by one line to a partial string made the object of search (as which data of continuous pixels selected from data of the current line will be defined) includes the same partial string as the partial string made the object of search, is made by performing a search as to whether or not the same pixel as a leading pixel of the partial string made the object of search exists between a position returned by one from the leading pixel position of the partial string made the object of search (defined as relative position −1) and a position advanced by one therefrom (defined as relative position +1). Namely, the compression in step S22 is performed in the case where the same pixel string exists in the immediately preceding line within a range shifted by one pixel to the right and left.

Speaking in conjunction with FIG. 4A, (1) an example of relative position −1 is a partial string "554" continuing from "5" at the 3rd row and 1st column. Since this partial string "554" is the same as a partial string "554" continuing from "5" at the 2nd row and 0th column, it is determined that the same partial string exists at a position shifted by one pixel to the left. (2) An example of relative position 0 is a partial string "34" continuing from "3" at the 1st row and 4th column. Since this partial string "34" is the same as a partial string "34" continuing from "3" at the 0th row and 4th column, it is determined that the same partial string exists at a position shifted by zero pixel. (3) An example of relative position +1 is a partial string "55434" continuing from "5" at the 2nd row and 0th column. Since this partial string "55434" is the same as a partial string "55434" continuing from "5" at the 1st row and 1st column, it is determined that the same partial string exists at a position shifted by one pixel to the right.

In step S22, data of the pointer 10 is first stored into the pointer buffer 12 and the relative position counter 11 is initialized. Next, data of one pixel is taken into the partial string buffer 16 from the line buffer 5 indicated by the pointer 10. Regarding the data of the one pixel in the current line taken in the partial string buffer 16 from the line buffer 5, a search is made as to whether or not a matching pixel exists for each of a pixel at the relative position −1, a pixel at the relative position 0 and a pixel at the relative position +1 in the immediately preceding line stored in the dictionary buffer 6. In the case where there is no matching pixel, the length "0" is written into the relative position and length buffer 14 for each relative position and the flow proceeds to step S23. In FIG. 4A, regarding "4" at the 1st row and 3rd column, the pixels at the 0th row and 2nd column and the 0th row and 3rd column are both "2" and the pixel at the 0th row and 4th column is "3". Accordingly, "0" is written as length data for a point (1, 3) into the relative position and length buffer 14 for all the relative positions −1, 0 and +1.

In the case where there is a matching pixel, the pointer 10 and the length counter 15 are incremented and data of the next pixel is taken into the partial string buffer 16. At this time, the leading address of the partial string made the object of search under searching in the present search is remained in the pointer buffer 12.

In the case where the matching for the leading pixel of the partial string made the object of search is found at the relative position −1, a search regarding the next pixel is made in such a manner that data of a pixel at the relative position −1 in the data of the immediately preceding line is compared with the pixel taken in the partial string buffer 16. Also, in the case where the matching is found at the relative position 0, a search regarding the next pixel is made in such a manner that data of a pixel at the relative position 0 in the data of the immediately preceding line is compared with the pixel taken in the partial string buffer 16. Further, in the case where the matching is found at the relative position +1, a search regarding the next pixel is made in such a manner that data of a pixel at the relative position +1 in the data of the immediately preceding line is compared with the pixel taken in the partial string buffer 16. In the case where the result of each comparison indicates the matching, the next pixel pointer 10 is incremented to take data of the next pixel into the partial string buffer 16 and the length counter 15 is incremented. This operation is repeated until the matching ceases to be obtained. Thereby, the count value of the length counter 15, at a point of time when the matching ceases to be obtained, is measured as the length L of a partial data string which has the same data string as data of the immediately preceding line. This length information is counted for each of the relative position −1, the relative position 0 and the relative position +1. Namely, after the length L has been counted for the relative position −1 in a manner mentioned above, the length L is stored as length information of the relative position −1 into the relative position and length buffer 14 at the column of the relative position −1. Subsequently, in order to make a search regarding the relative position 0, the leading address of the partial string made the object of search temporarily stored in the pointer buffer 12 is returned into the pixel pointer 10 and the relative position counter 11 is incremented. With the pixel counter 10 being incremented, the comparison is similarly made for the next data of on the right side of the leading address of the partial string made the object of search until the data matching relevant to the relative position 0 ceases to be obtained. Thereby, the length information L is determined. Subsequently, a similar search is made regarding the relative position +1.

Considering a partial string which has "5" at the 2nd row and 0th column in FIG. 4A as its leading pixel, this pixel is at the lead of the current line and hence no data exist at the relative position −1 of the preceding line. Therefore, the length L for the relative position −1 is 0. Regarding to the relative position 0, "5" exists at the 1st row and 0th column. Therefore, the length counter 13 is incremented and data "5" of the 2nd row and 1st column next to "5" of the 2nd row and 0th column is taken into the partial string buffer 16 for comparison with "5" of the 1st row and 1st column. Since this comparison too indicates the matching, the length counter 13 is incremented and data "4" of the 2nd row and 2nd column next to "5" of the 2nd row and 1st column is taken into the partial string buffer 16 for comparison with "5" of the 1st row and 2nd column. Since this comparison indicates no matching, the number "2" of matching data until this point of time provides L=2 as the length L of the partial string with "5" at the 2nd row and 0th column as its leading pixel for the relative position 0.

Regarding the partial string having "5" at the 2nd row and 0th column as its leading pixel, "5" exists at the 1st row and 1st column and this data matches the leading pixel. Therefore, the comparison for the next pixel is also made for the relative position +1. Namely, data "5" of the 2nd row and 1st column next to "5" of the 2nd row and 0th column is taken into the partial string buffer 16 and is then compared with "5" of the 1st row and 2nd column which is at the relative position +1. Since this comparison indicates the matching, the comparison is repeated while successively taking in the next pixel on the right side. When the comparison of "3" at the 2nd row and 5th column and "1" at the 1st row and 6th column is made, no matching is found. Accordingly, the value "5" of the length counter 13 at this time provides L=5 as the length L of the partial string with "5" at the 2nd row and 0th column as its leading pixel for the relative position +1.

With the above, three lengths including L (relative position −1)=0, L (relative position 0)=2 and L (relative position +1)=5 are stored in the relative position and length buffer 14 as the length L of the partial string having "5" at the 2nd row and 0th column as its leading pixel. From thereamong is selected a partial string which has the greatest length L equal to 5. In the case of FIG. 4A, a partial string a (55) corresponds to the same partial string for the relative position 0 and a partial string b (55434) corresponds to the same partial string for the relative position +1, as shown in FIG. 4B. Since the length of the partial string a is 2 and the length of the partial string b is 5, the partial string b providing a high efficiency of compression is selected.

Namely, the flow goes to step S24 in which the longest data among data stored in the relative position and length buffer 14 and the relative position for the longest data are inputted to the code generator 8 and the code generator 8 outputs codes through the code output line 19. On the other hand, if the lengths stored in the relative position and length buffer 14 are all 0, that is, if no matching partial string is found in the dictionary (step S23), the flow goes to step S25 in which run-length compression is performed. Since the run-length compression performed herein is not different from the conventional run-length compression method, the detailed explanation thereof will be omitted.

The above operation is repeated up to the last line of the image data to perform the data compression or the encoding.

Next, explanation will be made of the data compression process of the 8×8 image data shown in FIGS. 4A to 4C. It is assumed that each data is represented by 4 bits. For convenience' sake, the coordinate of image data will be represented by (column, row) and the encoded code will be represented by {relative position, length} or [kind of data, length]. Namely, a portion enclosed by the brace { } shows a portion subjected to compression based on the first data compression method of the present invention and a portion enclosed by the bracket [ ] shows a portion subjected to compression based on the run-length compression method.

For example, a code corresponding to the relative position equal to 1 and the length equal to 3 results in {1, 3} and a code corresponding to the kind of data equal to 5 and the length equal to 2 results in [5, 2]. Provided that the coordinate of data of interest is (x, y), the range of reference to the dictionary is (x–1, y–1), (x, y–1) and (x+1, y–1) in terms of relative position. First, the first line (or 0th row) is subjected to run-length compression since there is no dictionary to which the reference is to be made. Image data at (0, 0) to (3, 0) are all the same and 2, and hence the resulting code is [2, 4]. Data at (4, 0) is 3 and only one of this data exists. Therefore, the resulting code is [3, 1]. Data at (5, 0) to (7, 0) are all the same and 4, and hence the resulting code is [4, 3]. Accordingly, the resulting codes for the first line are [2, 4] [3, 1] [4, 3], as shown by the first line (or 0th row) in FIG. 5.

A processing for the second line (or 1st row) is performed handling the first line (or 0th row) as a dictionary. First, data at (0, 1) is compared with data at (0, 0) but this comparison indicates no matching. The data at (0, 1) is thereafter compared with data at (1, 0) but this comparison too indicates no matching. Therefore, on the determination that the dictionary includes no matching partial string, the run-length compression is applied. Data at (0, 1) to (2, 1) are all 5, and hence the resulting code is [5, 3]. Data at (3, 1) is 4 and does not match data at (2, 0), (3, 0) and (4, 0). The run-length compression is applied and the resulting code is [4, 1]. Data at (4, 1) is 3 and matches data at (4, 0) among (3, 0), (4, 0) and (5, 0), and data at (4, 1) to (5, 1) match data of the dictionary at (4, 0) to (5, 0). The resulting code is {0, 2}. Data at (6, 1) and data at (7, 1) do not match data of the dictionary. The resulting codes are [1, 1] and [3, 1], respectively. Accordingly, the resulting codes for the second line (or 1st row) are [5, 3] [4, 1] {0, 2} [1, 1] [3, 1], as shown by the second line (or 1st row) in FIG. 5.

A processing for the third line (or 2nd row) is performed handling the second line (or 1st row) as a dictionary. Data at (0, 2) matches data of the dictionary at (0, 1) which is the relative position 0 and also matches data of the dictionary at (1, 1) which is the relative position 1. The length of a matching partial string of the dictionary in the case of the relative position 0 is (0, 1) to (1, 1) or 2 whereas the length of a matching partial string of the dictionary in the case of the relative position 1 is (1, 1) to (5, 1) or 5. Namely, the length of the partial string of the dictionary for the relative position 1 is greater than that for the relative position 0. The resulting code is {1, 5}. The above processing is repeated up to the last line. As a result, a code string shown in FIG. 5 is obtained for the image data shown in FIGS. 4A to 4C. Next, actual codes are allotted to the code string of FIG. 5 by use of codes shown in FIGS. 6A and 6B. A code 61 in the case of the run-length compression is composed of identifier plus kind of data plus length. For example, [2, 4] results in a binary number 000101110. A code 62 in the case of the dictionary compression is composed of identifier plus relative position plus length. For example, {–1, 3} results in a binary number 11110. Regarding the first line, however, only the run-length compression is involved and hence the identifier as a code is omitted.

Figures 7, 8:
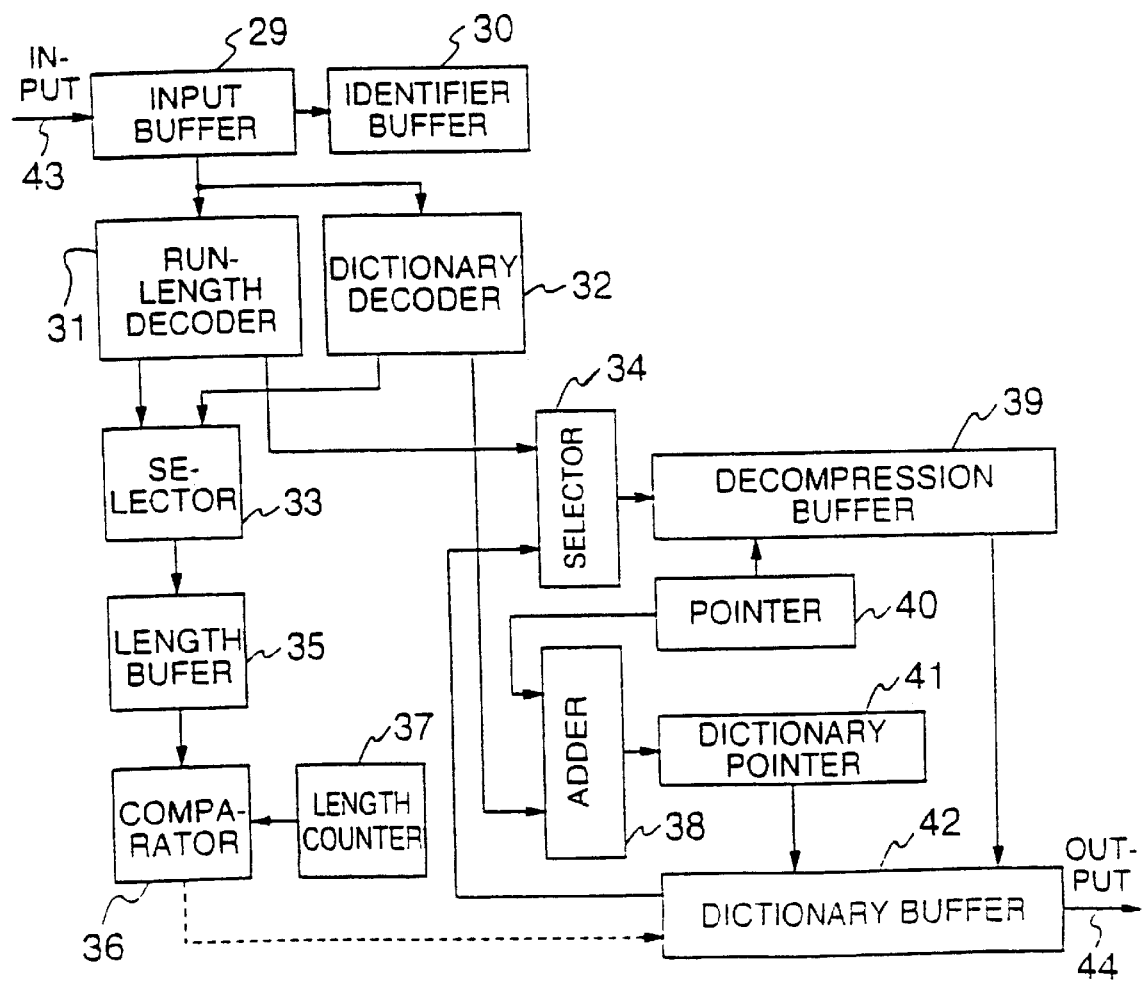
FIG. 7 is an explanatory diagram showing image data after data compression in which the actual codes are allotted.
FIG. 8 is a block diagram showing a data decompression circuit according to an embodiment of a first data decompression apparatus for realizing the first data decompression method of the present invention.

The result of transformation of the code string of FIG. 5 into the actual codes is shown in FIG. 7. The capacity of the image data shown in FIGS. 4A to 4C is 256 bits whereas the data capacity of the code string shown in FIG. 7 is 171 bits. The use of the algorithm of the first data compression method according to the present invention results in the compression of the original image data to about 67%.

Figure 9:
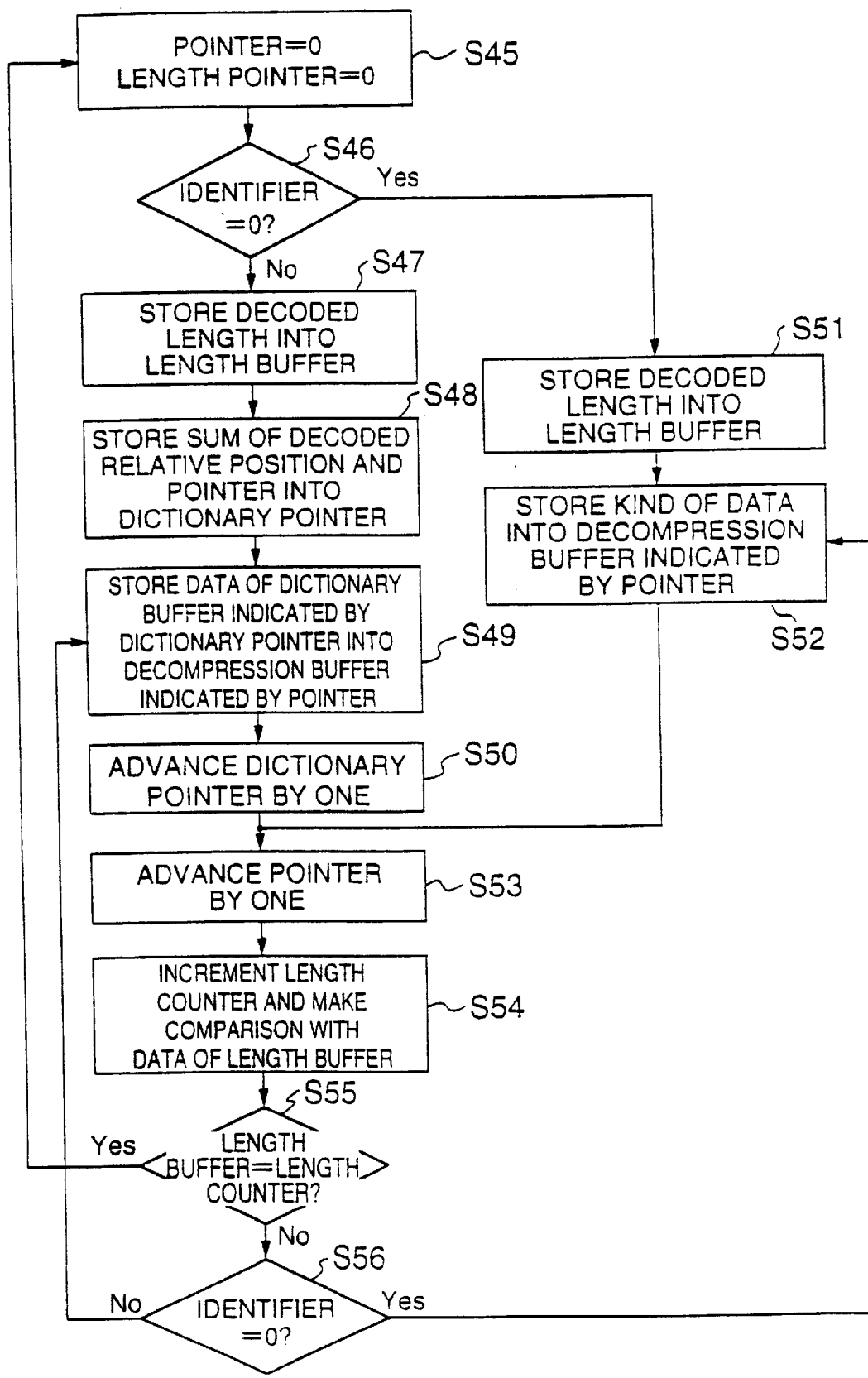
FIG. 9 is a flow chart showing the operation of data decompression in the data decompression circuit shown in FIG. 8.

A procedure for decompressing or expanding the code compressed in accordance with the above manner will be shown using FIGS. 8 and 9. FIG. 8 is a block diagram showing an example of the construction of a decompression circuit. FIG. 9 is a flow chart of a data decompression algorithm. In FIG. 8, reference numeral 29 denotes an input buffer, numeral 30 an identifier buffer, numeral 31 a run-length decoder, numeral 32 a dictionary decoder, numerals 33 and 34 selectors, numeral 35 a length buffer, numeral 36 a comparator, numeral 37 a length counter, numeral 38 an adder, numeral 39 a decompression buffer, numeral 40 a pointer, numeral 41 a dictionary pointer, numeral 42 a dictionary buffer, numeral 43 an input signal line, and numeral 44 an output signal line.

First, the compressed data is taken into the input buffer 29 through the input signal line 43. One bit at the beginning is stored into the identifier buffer. In step S45, the pointer 40 and the length counter 37 are initialized to 0. Then, the flow goes to step S46. If the content of the identifier buffer 30 is 1, the succeeding data is data subjected to dictionary compression. Therefore, the data is passed through the dictionary decoder 32 and information of the decoded length is stored into the length buffer 35 (step S47). Information of the decoded relative position and the content of the pointer 40 are inputted to the adder 38, and the result of addition is stored into the dictionary pointer 41 (step S48). The flow goes to step S49 in which data of the dictionary buffer 42 indicated by the dictionary pointer 41 is stored into the decompression buffer 39 indicated by the pointer 40. Each of the dictionary pointer 41 and the pointer 40 is advanced by one (steps S50 and S53). The length counter 37 is incremented and the content of the length counter 37 and the content of the length buffer 35 are compared by the comparator 36 (step S54). If the content of the length buffer 35 and the content of the length counter 37 do not match (step S55), the flow goes to step S49 through step S56 so that steps S49, S50, S53 and S54 are successively repeated until the matching is obtained. If the matching is obtained, the flow goes to step S45 for decompression of a new code.

In the case where it is determined in step S46 that the identifier is 0, the flow goes to step S51 in which the decoded length is stored into the length buffer 35. Next, the kind of data is stored into the decompression buffer 39 indicated by the pointer 40 (step S52). The pointer 40 is advanced by one (step S53). The length counter 37 is incremented and the content of the length counter 37 and the content of the length buffer 35 are compared by the comparator 36 (step S54). If the content of the length buffer 35 and the content of the length counter 37 do not match (step S55), the flow goes to step S52 through step S56 so that steps S52, S53 and S54 are successively repeated until the matching is obtained. Also, if data stored in the decompression buffer 39 reaches data corresponding to one line of the image data, the contents of the decompression buffer 39 are all copied into the dictionary buffer 42 and the content of the dictionary buffer 42 or the restored data is outputted through the output signal line 44.

In the above-mentioned example of compression, the dictionary is searched in the dictionary reference range for the longest partial string existing on the dictionary and the searched-out partial string is encoded. However, there may also be considered the case where the longest partial string is divided into a plurality of partial strings and the divisional partial string is compressed after composition thereof with another partial string, and the case where partial strings, which are not the longest, are combined and compressed.

The former case is as follows. For example, the partial string b shown in FIG. 4B is divided into two parts or a partial string c "5543" and a partial string d "4" shown in FIG. 4C and the partial string d "4" and "3" at the 2nd row and 5th column are composed into a partial string e "43". A code for the partial string c is {1, 4} and a code for the partial string e "43" is {–1, 2} since the partial string e matches "43" continuing from the 1st row and 3rd column of the immediately preceding line. Accordingly, a code for the 2nd row results in {1, 4} {–1, 2} [5, 1] [4, 1]. This code will be referred to as code a'. The latter case is as follows. For example, a partial string "55" for the relative position 0 is selected for the 2nd row and 0th column and a partial string "434" for the relative position +1 is selected for the 2nd row and 2nd column. Thereby, a code for the 2nd row results in {0, 2} {1, 3} {–1, 1} [5, 1] [4, 1]. This code will be referred to as code b'.

Figure 6A:
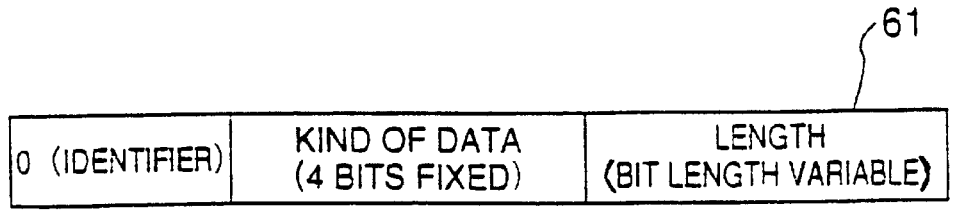
FIGS. 6A and 6B are diagrams representing actual codes.
Figure 6B:
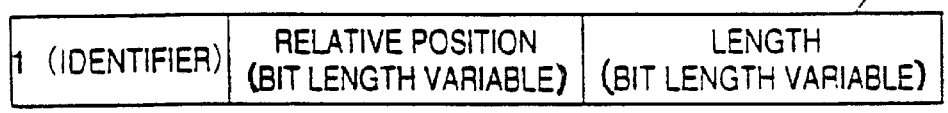

Thus, three patterns including the pattern shown in the above-mentioned example of compression may exist as the code for the 2nd row shown in FIG. 4A. The code for the 2nd row shown in FIG. 5 will be referred to as code c'. When the actual codes shown in FIGS. 6A and 6B are allotted to the codes a', b' and c', each of the codes a' and c' spans 24 bits and the code b' spans 26 bits. The codes a' and c' are efficient. However, when codes other than those shown in FIGS. 6A and 6B are allotted to the codes a', b' and c', a different result will be obtained and there may be the case where the code b' results in the shortest code. Accordingly, it does not necessarily follow that the best way includes searching for the longest partial string on the dictionary and encoding the longest partial string. It is desirable to select the combination of partial strings on the dictionary which provides the shortest code when the actual codes are allotted.

Even if the combination of partial strings on the dictionary is changed so that the resulting code becomes the shortest, as mentioned above, no influence is given on the data decompression method so long as the encoding rule (using the leading position and the length of the same partial length in the preceding line) is not changed.

(Second Data Compression/Decompression Method of the Invention)

Figure 10:
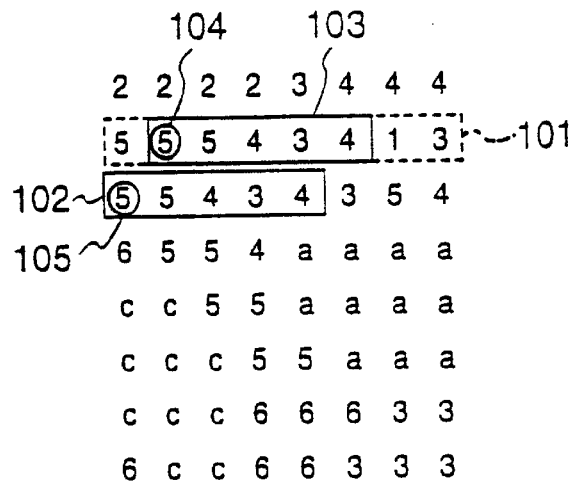
FIG. 10 is an explanatory diagram showing two-dimensional image data for explaining the principle of a second data compression and decompression method of the present invention.

In order to facilitate the understanding of a second data compression/decompression method of the present invention, the principle of the second data compression/decompression method will be explained using the drawings. In the second data compression/decompression method of the present invention, data of the immediately preceding line in successively scanned two-dimensional image data (shown in FIG. 10) is held as reference data, using a property that a certain pixel(s) in the image data is similar to a group of pixels in the neighborhood thereof. (A buffer for storing the reference data will hereinafter be referred to as "dictionary" 101.) The reference to the dictionary 101 of the immediately preceding line is made in connection with a partial string 102 of line data to be compressed. When the reference results in that the partial string matches a partial string in the dictionary 101 of the immediately preceding line to the longest possible extent, one table is selected from among tables which are prepared for the respective positions of a pixel of interest (or a leading pixel of a partial string to be compressed) on the current line and in which a different code is allotted in accordance with the relative position of a leading pixel of the partial string on the immediately preceding line and the pixel of interest and the length of the partial string on the immediately preceding line. The selected table corresponds to the position of the pixel 105 of interest on the current line. Referring to the selected table, a code corresponding to the leading position 104 and the length of the partial string 103 on the dictionary 101 is outputted, thereby performing data compression. At this time, the range of reference to the dictionary 101 is limited to fall within a range in which the degree of similarity of the partial string 102 to be compressed to the partial string on the dictionary 101 is high. Also, in the case where the partial string 102 to be compressed does not match the partial string on the dictionary 101, compression such as run-length compression is applied to the partial string 102 to be compressed. In the case the run-length compression is applied, it is preferable to perform data compression in such a manner that a code corresponding to the length of the same continuous data is outputted by selecting, from among run-length tables which are prepared for the respective positions of a pixel of interest on the current line and in which a different code is allotted in accordance with the length of the same continuous data, a run-length table which corresponds to the position of the pixel of interest on the current line and referring to the selected run-length table. It is required that the code stored in the run-length table should be different from the code stored in the above-mentioned table. Also, it is preferable that the code stored in the table and the run-length table is not a fixed-length code but a variable-length code in order to enhance the compression ratio by allotting a short code to data which has a high probability of occurrence.

In the second data compression/decompression method of the present invention, a dictionary is required to store only the immediately preceding line, as mentioned above. Therefore, the capacity of the dictionary is very small. Also, the reference to the dictionary is made within a range in which the degree of similarity is high, and the reference is made to a longest possible partial string. Therefore, a high compression ratio can be attained and a processing for compression/decompression can be performed at a high speed. By applying compression such as run-length compression to the first line of the image data and a partial string for which the reference to the dictionary is impossible, a higher compression ratio is obtained.

Figure 11:
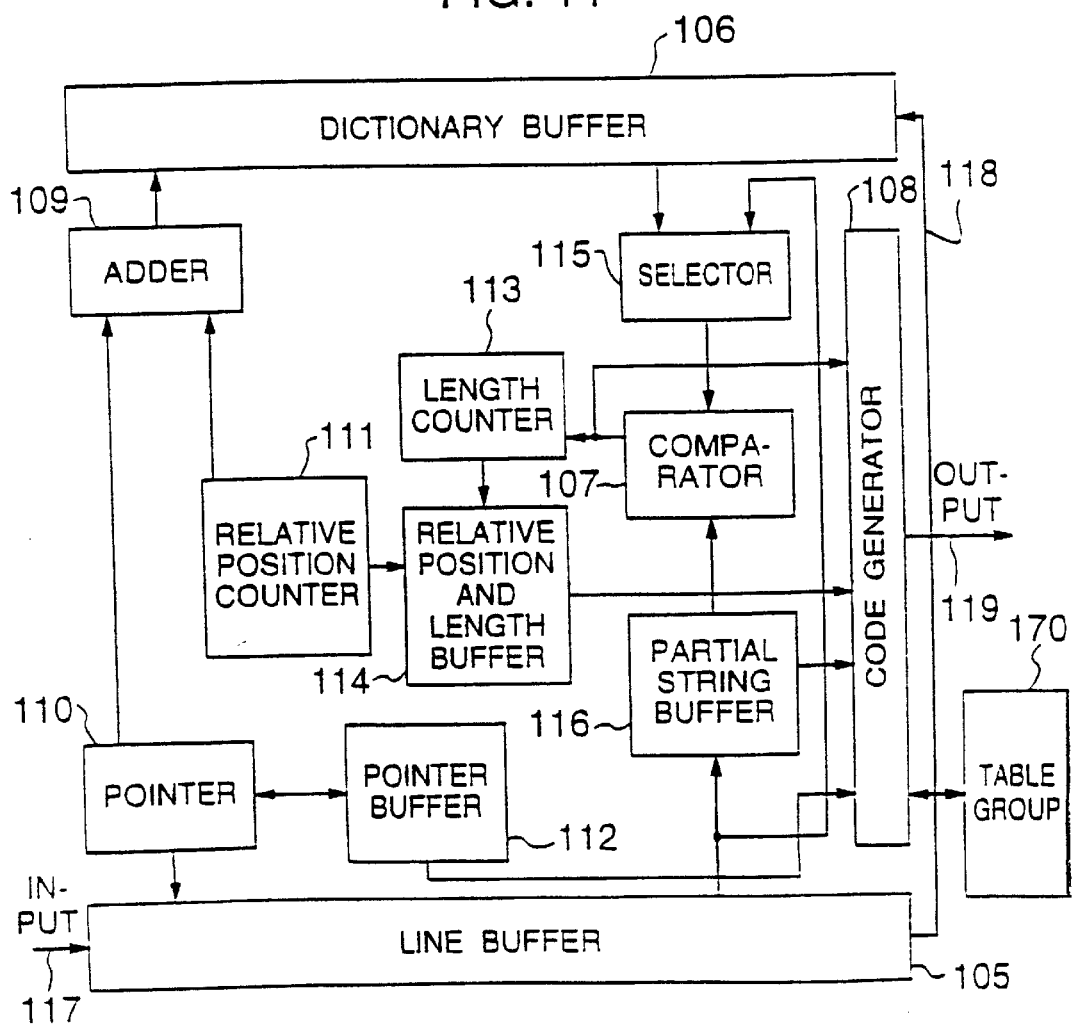
FIG. 11 is a block diagram showing a data compression circuit according to an embodiment of a second data compression apparatus for realizing the second data compression method of the present invention.

An embodiment of the second data compression/decompression method of the present invention will now be explained. As shown in FIG. 11, a data compression circuit according to an embodiment of a second data compression apparatus for realizing the second data compression method of the present invention includes a line buffer 105, a dictionary buffer 106 for holding data of the immediately preceding line, a comparator 107, a code generator 108, an adder 109, a pointer 110, a relative position counter 111, a pointer buffer 112, a length counter 113, a relative position and length buffer 114, a selector 115, a partial string buffer 116, and a group 170 of tables prepared for the respective positions of a pixel of interest (or a leading pixel of a partial string to be compressed) on the current line. Codes for encoding a partial string to be compressed are stored in the group 170 of tables. In FIG. 11, reference numeral 117 denotes a line buffer input signal line, reference numeral 118 a dictionary buffer input signal line, and reference numeral 119 a code output line.

Figure 12:
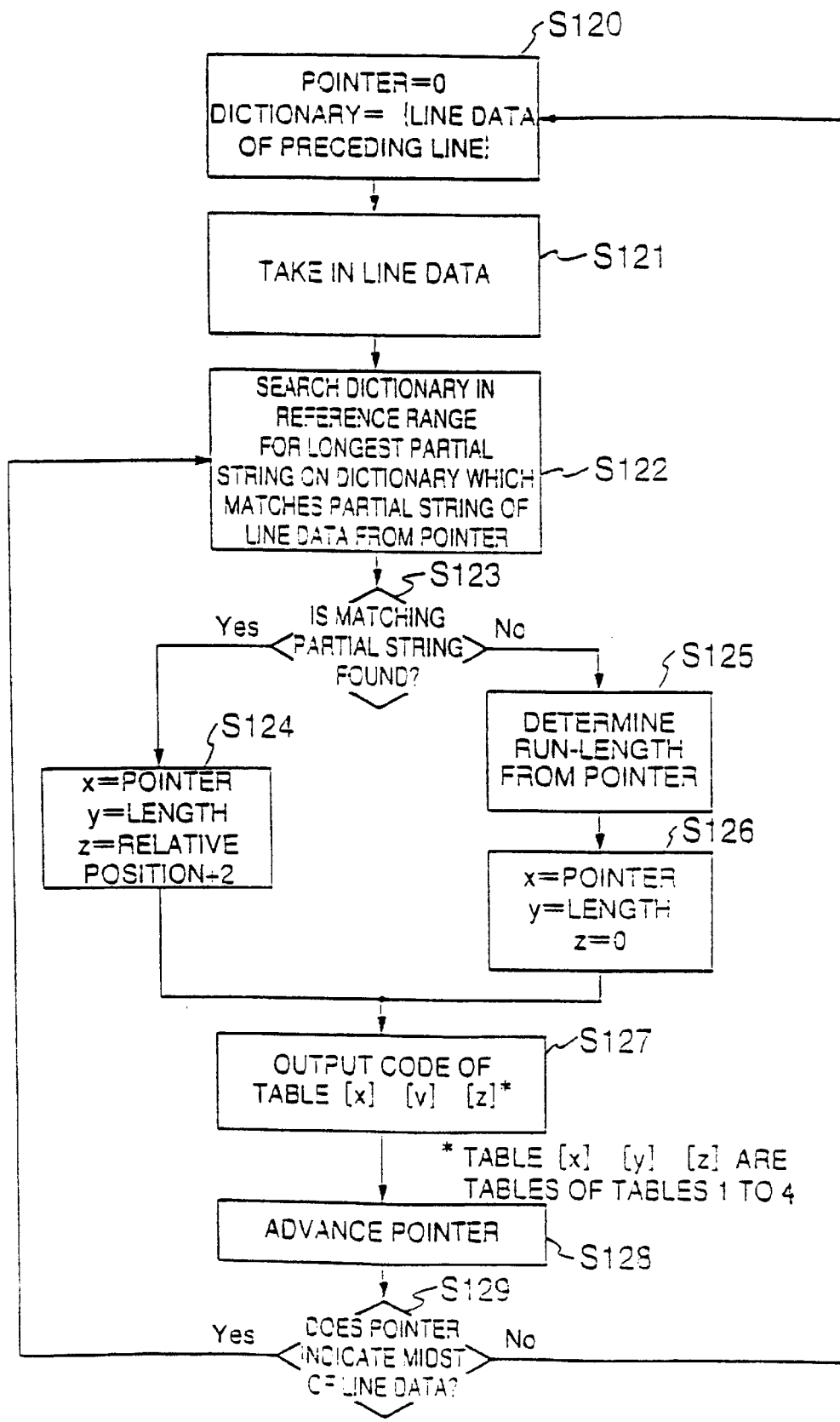
FIG. 12 is a flow chart showing the operation of data compression in the data compression circuit shown in FIG. 11.

Next, the operation of the data compression circuit having the above construction will be explained referring to FIG. 12. First or in step S120, the pointer 110 is initialized, and data pushed out of the line buffer 105 is stored into the dictionary buffer 106 through the dictionary buffer input signal line 118. Next or in step S121, successively inputted image data are stored into the line buffer 105 through the line buffer input signal line 117.

Next or in step S122, a search for the longest partial string is made. The search for the longest partial string shown as one flow step S122 in FIG. 12 is made in accordance with the following procedure. The concept of the search for the longest partial string will be explained using 8×8 image data shown in FIGS. 13A to 13C by way of example. In the present embodiment, the judgement of whether or not a line preceding by one line to a partial string made the object of search (as which data of continuous pixels selected from data of the current line will be defined) includes the same partial string as the partial string made the object of search, is made by performing a search as to whether or not the same pixel as the leading pixel of the partial string made the object of search exists between a position returned by one from the leading pixel position of the partial string made the object of search (defined as relative position −1) and a position advanced by one therefrom (defined as relative position +1). The compression in step S122 is performed in the case where the same pixel string exists in the immediately preceding line within a range shifted by one pixel to the right and left.

Speaking in conjunction with FIG. 13A, (1) an example of relative position −1 is a partial string "554" continuing from "5" at the 3rd row and 1st column. Since this partial string "554" is the same as a partial string "554" continuing from "5" at the 2nd row and 0th column, it is determined that the same partial string exists at a position shifted by one pixel to the left. (2) An example of relative position 0 is a partial string "34" continuing from "3" at the 1st row and 4th column. Since this partial string "34" is the same as a partial string "34" continuing from "3" at the 0th row and 4th column, it is determined that the same partial string exists at a position shifted by zero pixel. (3) An example of relative position +1 is a partial string "55434" continuing from "5" at the 2nd row and 0th column. Since this partial string "55434" is the same as a partial string "55434" continuing from "5" at the 1st row and 1st column, it is determined that the same partial string exists at a position shifted by one pixel to the right.

In step S122, data of the pointer 110 is first stored into the pointer buffer 112 and the relative position counter 111 is initialized. Next, data of one pixel is taken into the partial string buffer 116 from the line buffer 105 indicated by the pointer 110. Regarding the data of the one pixel in the current line taken in the partial string buffer 116 from the line buffer 105, a search is made as to whether or not a matching pixel exists for each of a pixel at the relative position −1, a pixel at the relative position 0 and a pixel at the relative position +1 in the immediately preceding line stored in the dictionary buffer 106. In the case where there is no matching pixel, the length "0" is written into the relative position and length buffer 114 for each relative position and the flow proceeds to step S123. In FIG. 13A, regarding "4" at the 1st row and 3rd column, the pixels at the 0th row and 2nd column and the 0th row and 3rd column are both "2" and the pixel at the 0th row and 4th column is "3". Accordingly, "0" is written as length data for a point (1, 3) into the relative position and length buffer 114 for all the relative positions −1, 0 and +1. In the case where there is a matching pixel, the pointer 110 and the length counter 115 are incremented and data of the next pixel is taken into the partial string buffer 116. At this time, the leading address of the partial string made the object of search under searching in the present search is remained in the pointer buffer 112.

In the case where the matching for the leading pixel of the partial string made the object of search is found at the relative position −1, a search regarding the next pixel is made in such a manner that data of a pixel at the relative position −1 in the data of the immediately preceding line is compared with the pixel taken in the partial string buffer 116. Also, in the case where the matching is found at the relative position 0, a search regarding the next pixel is made in such a manner that data of a pixel at the relative position 0 in the data of the immediately preceding line is compared with the pixel taken in the partial string buffer 116. Further, in the case where the matching is found at the relative position +1, a search regarding the next pixel is made in such a manner that data of a pixel at the relative position +1 in the data of the immediately preceding line is compared with the pixel taken in the partial string buffer 116. In the case where the result of each comparison indicates the matching, the next pixel pointer 110 is incremented to take data of the next pixel into the partial string buffer 116 and the length counter 115 is incremented. This operation is repeated until the matching ceases to be obtained. Thereby, the count value of the length counter 115, at a point of time when the matching ceases to be obtained, is measured as the length L of a partial data string which has the same data string as data of the immediately preceding line. This length information is counted for each of the relative position −1, the relative position 0 and the relative position +1. Namely, after the length L has been counted for the relative position −1 in a manner mentioned above, the length L is stored as length information of the relative position −1 into the relative position and length buffer 114 at the column of the relative position −1. Subsequently, in order to make a search regarding the relative position 0, the leading address of the partial string made the object of search temporarily stored in the pointer buffer 112 is returned into the pixel pointer 110 and the relative position counter 111 is incremented. With the pixel counter 110 being incremented, the comparison is similarly made for the next data of on the right side of the leading address of the partial string made the object of search until the data matching relevant to the relative position 0 ceases to be obtained. Thereby, the length information L is determined. Subsequently, a similar search is made regarding the relative position +1.

Considering a partial string which has "5" at the 2nd row and 0th column in FIG. 13A as its leading pixel, this pixel is at the lead of the current line and hence no data exist at the relative position −1 of the preceding line. Therefore, the length L for the relative position −1 is 0. Regarding to the relative position 0, "5" exists at the 1st row and 0th column. Therefore, the length counter 113 is incremented and data "5" of the 2nd row and 1st column next to "5" of the 2nd row and 0th column is taken into the partial string buffer 116 for comparison with "5" of the 1st row and 1st column. Since this comparison too indicates the matching, the length counter 113 is incremented and data "4" of the 2nd row and 2nd column next to "5" of the 2nd row and 1st column is taken into the partial string buffer 116 for comparison with "5" of the 1st row and 2nd column. Since this comparison indicates no matching, the number "2" of matching data until this point of time provides L=2 as the length L of the partial string with "5" at the 2nd row and 0th column as its leading pixel for the relative position 0.

Regarding the partial string having "5" at the 2nd row and 0th column as its leading pixel, "5" exists at the 1st row and 1st column and this data matches the leading pixel. Therefore, the comparison for the next pixel is also made for the relative position +1. Namely, data "5" of the 2nd row and 1st column next to "5" of the 2nd row and 0th column is taken into the partial string buffer 116 and is then compared with "5" of the 1st row and 2nd column which is at the relative position +1. Since this comparison indicates the matching, the comparison is repeated while successively taking in the next pixel on the right side. When the comparison of "3" at the 2nd row and 5th column and "1" at the 1st row and 6th column is made, no matching is found. Accordingly, the value "5" of the length counter 113 at this time provides L=5 as the length L of the partial string with "5" at the 2nd row and 0th column as its leading pixel for the relative position 1.

With the above, three lengths including L (relative position −1)=0, L (relative position 0)=2 and L (relative position +1)=5 are stored in the relative position and length buffer 114 as the length L of the partial string having "5" at the 2nd row and 0th column as its leading pixel. From thereamong is selected a partial string which has the greatest length L equal to 5. In the case of FIG. 13A, a partial string a (55) corresponds to the same partial string for the relative position 0 and a partial string b (55434) corresponds to the same partial string for the relative position +1, as shown in FIG. 13B. Since the length of the partial string a is 2 and the length of the partial string b is 5, the partial string b providing a high efficiency of compression is selected.

Namely, the flow goes through step S123 to step S124 in which the longest data among data stored in the relative position and length buffer 114, the relative position for the longest data and the position of the pixel of interest (as which the leading pixel of the partial string to be compressed is defined) on the current line stored in the pointer buffer 112 are inputted to the code generator 108. In step S127, the code generator 108 selects a corresponding table from the table group 170 on the basis of the position of the pixel of interest on the current line and refers to the selected table so that a code corresponding to the length of data and a relative position therefor is outputted from the code generator 108 through the code output line 119.

On the other hand, if step S122 determines that the lengths stored in the relative position and length buffer 114 are all 0, that is, if no matching partial string is found in the dictionary, the flow goes through step S123 to step S125 in which run-length compression is performed. Namely, a search is made as to whether or not the same pixels continuously exist on the same line. First, data of the line buffer 105 indicated by the pointer 110 is stored into the partial string buffer 116. Also, the pointer 110 is advanced by one so that the data of the line buffer 105 is inputted to the comparator 107 through the selector 115 for comparison with data of the partial string buffer 116. If the result of comparison indicates the matching, the length counter 113 is incremented and the next data indicated by the pointer 110 is inputted to the comparator 107 through the selector 115 for comparison with data of the partial string buffer 116. The comparison with data of the partial string buffer 116 is repeated with the pointer 110 being advanced one by one until the matching ceases to be obtained. When the matching ceases to be obtained, the flow goes to step S126 in which data of the length counter 113, data of the partial string buffer 116 and the position of the pixel of interest on line data to be compressed, which is stored in the pointer buffer 112, are inputted to the code generator 108. In step S127, the code generator 108 selects, on the basis of the position of the pixel of interest on the data line to be compressed, a corresponding table from the table group 170 and refers to the selected table so that a code corresponding to the length of data and the raw data to be repeated are outputted from the code generator 108 through the code output line 119.

The above operation is repeated up to the last line of the image data to perform the data compression or the encoding.

Next, explanation will be made of the data compression process of the 8×8 image data shown in FIGS. 13A to 13C. It is assumed that each data is represented by 4 bits. For convenience' sake, the coordinate of image data will be represented by (column, row) and the encoded code will be represented by {column of pixel of interest, relative position, length} or [column of pixel of interest, kind of data, length]. Namely, a portion enclosed by the brace { } shows a portion subjected to compression based on the second data compression method of the present invention and a portion enclosed by the bracket [ ] shows a portion subjected to compression based on the run-length compression method.

For example, a code corresponding to the column of a pixel of interest equal to 0, the relative position equal to 1 and the length equal to 3 results in {0, 1, 3} and a code corresponding to the column of a pixel of interest equal to 1, the kind of data equal to 5 and the length equal to 2 results in [1, 5, 2]. Provided that the coordinate of the pixel of interest is (x, y), the range of reference to the dictionary is (x−1, y−1), (x, y−1) and (x+1, y−1) in terms of relative position. In the case of FIG. 13A, the first line (or 0th row) is subjected to run-length compression since there is no dictionary to which the reference is to be made. Image data at (0, 0) to (3, 0) are all the same and 2, and hence the resulting code is [0, 2, 4]. Data at (4, 0) is 3 and only one of this data exists. Therefore, the resulting code is [4, 3, 1]. Data at (5, 0) to (7, 0) are all the same and 4, and hence the resulting code is [5, 4, 3]. Accordingly, the resulting codes for the first line (or 0th row) are [0, 2, 4] [4, 3, 1] [5, 4, 3], as shown by the first line (or 0th row) in FIG. 14.

A processing for the second line (or 1st row) is performed handling the first line (or 0th row) as a dictionary. Data at (0, 1) is compared with data at (0, 0) but this comparison indicates no matching. The data at (0, 1) is thereafter compared with data at (1, 0) but this comparison too indicates no matching. Therefore, on the determination that the dictionary includes no matching partial string, the run-length compression is applied. Data at (0, 1) to (2, 1) are all 5, and hence the resulting code is [0, 5, 3]. Data at (3, 1) is 4 and does not match data at (2, 0), (3, 0) and (4, 0). The run-length compression is applied and the resulting code is [3, 4, 1]. Data at (4, 1) is 3 and matches data at (4, 0) among (3, 0), (4, 0) and (5, 0), and data at (4, 1) to (5, 1) match data of the dictionary at (4, 0) to (5, 0). The resulting code is {4, 0 2}. Data at (6, 1) and data at (7, 1) do not match data of the dictionary. The resulting codes are [6, 1, 1] and [7, 3, 1], respectively. Accordingly, the resulting codes for the second line (or 1st row) are [0, 5, 3] [3, 4, 1] {4, 0, 2} [6, 1, 1] [7, 3, 1], as shown by the second line (or 1st row) in FIG. 14.

A processing for the third line (or 2nd row) is performed handling the second line (or 1st row) as a dictionary. Data at (0, 2) matches data of the dictionary at (0, 1) which is the relative position 0 and also matches data of the dictionary at (1, 1) which is the relative position 1. The length of a matching partial string of the dictionary in the case of the relative position 0 is (0, 1) to (1, 1) or 2 whereas the length of a matching partial string of the dictionary in the case of the relative position 1 is (1, 1) to (5, 1) or 5. Namely, the length of the partial string of the dictionary for the relative position 1 is greater than that for the relative position 0. The resulting code is {0, 1, 5}. The above processing is repeated up to the last line. As a result, a code string shown in FIG. 14 is obtained for the image data shown in FIGS. 13A to 13C.

Next, actual codes are allotted to the code string of FIG. 14 by use of tables shown in FIGS. 15 to 22. FIGS. 15 to 22 show tables which are prepared for the respective values of x and in which a different code is allotted in accordance with the value of y and the value of z. Here, x is the column of a pixel of interest and y is the length of a partial string to be compressed. Also, z is 0 in the case where a code string is enclosed by a bracket [ ], that is, in the case where the run-length compression is made. In the case where the code string is enclosed by a brace { }, that is, in the case where the dictionary compression based on the second data compression method of the present invention is made, z is 1 when the relative position is −1, 2 when the relative position is 0, and 3 when the relative position is +1. The code stored in each table is not a fixed-length code but a variable-length code in order to enhance the compression ratio by allotting a short code to data which has a high probability of occurrence. The maximum value of y in each table is limited to a bit string length between a column at which the pixel of interest is positioned and the maximum value which the column can take (7 in the image data shown in FIGS. 13A to 13C). Accordingly, for example, in the table of x=1 shown in FIG. 16, y is limited to 1 to 7. In the table of x=5 shown in FIG. 20, y is limited to 1 to 3. Thereby, the redundancy of coding can be improved. Also, in the present embodiment which is directed to the compression of image data, the size of the table is made small in such a manner that in the case of dictionary compression, the dictionary compression is performed for only data which is in a line immediately preceding a line including a pixel of interest and is adjacent to the pixel of interest (or data which is at the relative positions −1, 0 and +1). Thereby, a high compression ratio can be expected. It is preferable that the table prepared in the table group 170 is a table of Huffman codes constructed beforehand in compliance with data to be compressed and decompressed or a table optimized so that the redundancy is reduced with the compression/decompression. In FIGS. 15 to 22, a hyphen "-" shows that no variable-length code is allotted.

First, one of the tables shown in FIGS. 15 to 22 is selected on the basis of the value of x. For example, the table of x=0 shown in FIG. 15 is selected in the case where [0, 2, 4] is to be encoded, and the table of x=5 shown in FIG. 20 is selected in the case where {5, −1, 1} is to be encoded. Next, a code corresponding to the values y and z is selected from the selected table. For example, in the case where [0, 2, 4] is to be encoded, a code 10110 corresponding to y=4 and z=0 is selected from the table of x=0 shown in FIG. 15. In the case where {5, −1, 1} is to be encoded, a code 0011 corresponding to y=1 and z=1 is selected from the table of x=5 shown in FIG. 20. In the case where z=0, that is, in the case where the run-length compression is made, raw data to be repeated (or 4-bit fixed color code information in the present embodiment or luminance data for each color in the case of certain image) is added after a code selected from a table. For example, in the case where [0, 2, 4] is to be encoded, 0010 is added after the code 10110 corresponding to y=4 and z=0 selected from the table of x=0 shown in FIG. 15. Accordingly, the resulting code for [0, 2, 4] is 101100010.

The result of transformation of the code string of FIG. 14 into the actual codes is shown in FIG. 23. The capacity of the image data shown in FIGS. 13A to 13C is 256 bits whereas the data capacity of the code string shown in FIG. 23 is 160 bits. The use of the algorithm of the second data compression method according to the present invention results in the compression of the original image data to 62.5%.

Figure 24:
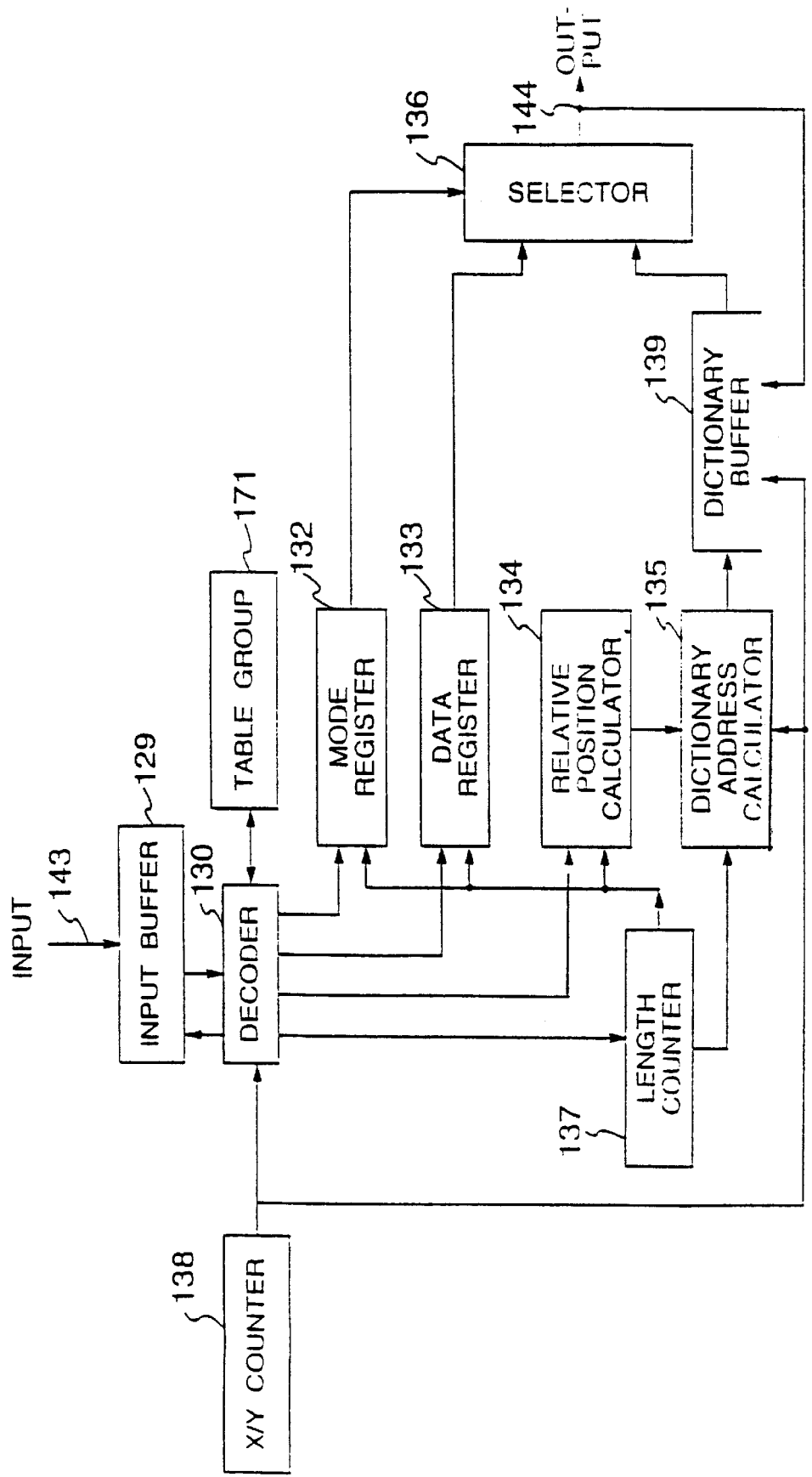
FIG. 24 is a block diagram showing a data decompression circuit according to an embodiment of a second data decompression apparatus for realizing the second data decompression method of the present invention.
Figure 25:
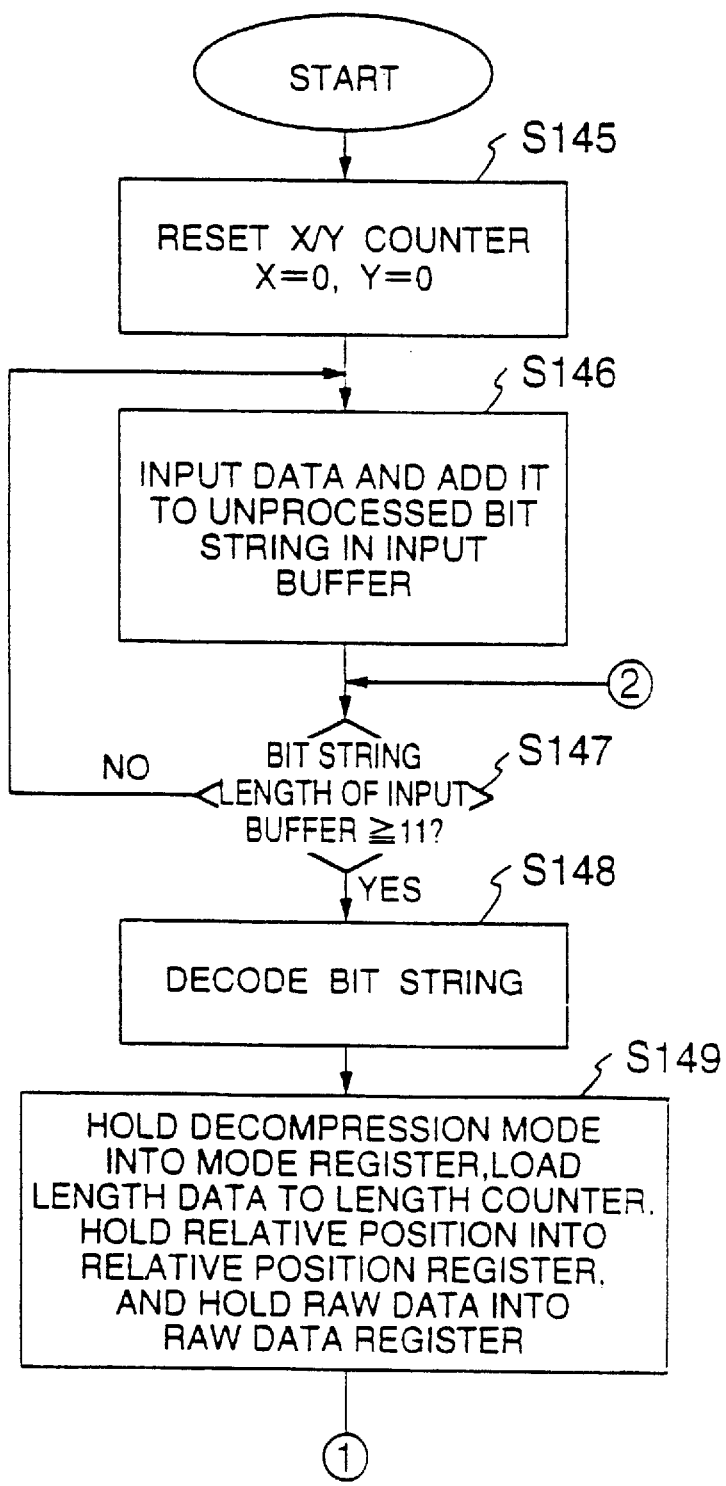
FIG. 25 is a flow chart showing the operation of data decompression in the data decompression circuit shown in FIG. 24.
Figure 26:
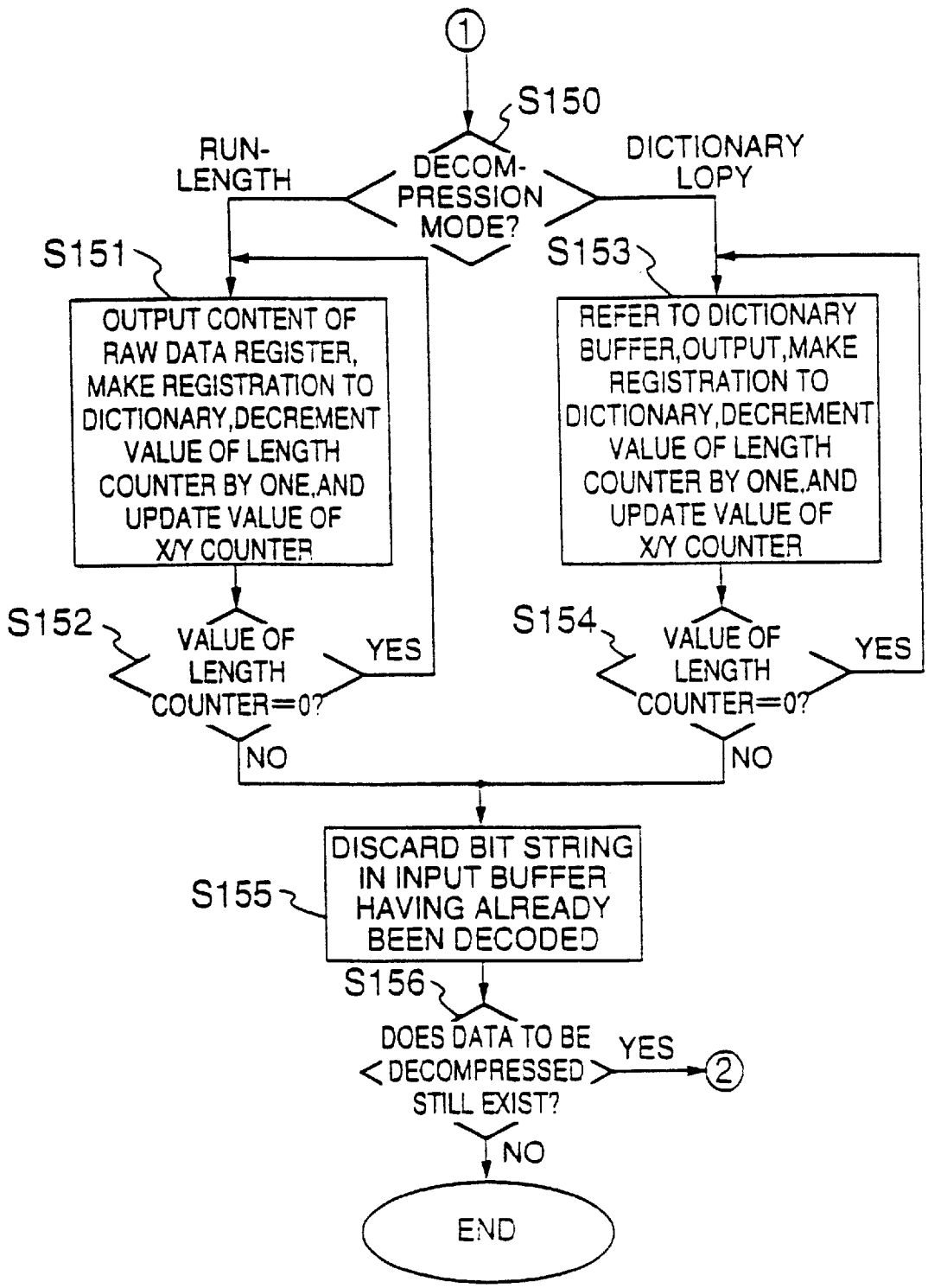
FIG. 26 is a flow chart showing the operation of data decompression in the data decompression circuit shown in FIG. 24.

A procedure for decompressing the code compressed in accordance with the above manner will be shown using FIGS. 24 to 26. FIG. 24 is a block diagram showing an example of the construction of a decompression circuit. FIGS. 25 and 26 are flow charts of a data decompression algorithm. In FIG. 24, reference numeral 129 denotes an input buffer, numeral 130 a decoder, numeral 132 a mode register, numeral 133 a data register, numeral 134 a relative position register, numeral 135 a dictionary address calculator, numeral 136 a selector, numeral 137 a length counter, numeral 138 an X/Y counter for specifying the position of data to be decompressed on a two-dimensional space, numeral 139 a dictionary buffer in which data made the object of reference in copying of the dictionary is stored, numeral 171 a group of tables prepared for the respective X coordinate positions of a pixel of interest (or a leading pixel of a partial string to be decompressed) specified by the X/Y counter 138, numeral 143 an input signal line, and numeral 144 an output signal line. The table group 171 includes eight tables. Each table is a table including variable-length codes in which a decompression mode of run-length/dictionary copy, the relative position and the length are taken as parameters. In the case where the position of the pixel of interest on the X coordinate is x shown in FIGS. 15 to 22, each table includes the same information as that in a corresponding one of the tables shown in FIGS. 15 to 22. Though it is not necessary to impose restrictions on a value on the Y coordinate which the X/Y counter 138 can take, it is required that a value on the X coordinate should be limited to a certain range in a relation with the number of prepared tables. In the present embodiment, the value on the X coordinate, which the X/Y counter 138 can take, is limited to the range of 0 to 7 since eight tables are prepared in the table group 171.

Next, the operation of the decompression circuit having the above construction will be explained referring to FIGS. 25 and 26. First or in step S145, the X/Y counter 138 is initialized. Next, the compressed data is taken into the input buffer 129 through the input signal line 143 (step S146). In the second and subsequent decompression processings, the compressed data is taken in after an unprocessed bit string of data stored in the input buffer 129. The input buffer 129 comprises an FIFO, shift register or the like. In step 147, the judgement is made of whether or not the length of a bit string stored in the input buffer 129 is not smaller than 11 bits. This is because the bit string length delivered from the input buffer 129 to the decoder 111 must be not smaller than the longest bit string length of data compressed by the data compression circuit. In the compression method according to the present embodiment, when a code selected from the tables shown in FIGS. 15 to 22 includes 7 bits in the case where the run-length compression is made, raw data (4 bits fixed) is added to the 7 bits and hence the resulting bit length comes to the longest or 11 bits. When the bit string length stored in the input buffer 129 is not smaller than 11 bits, the flow goes to step S148. When the bit string length is smaller than 11 bits, the flow returns to step S146.

In step S148, a portion of 11 bits from the lead of a bit string stored in the input buffer 129 is delivered to the decoder 130. On the basis of the X coordinate position of a pixel of interest specified by the X/Y counter 138, the decoder 130 selects a corresponding table from the table group 171. The selected table is searched for a variable-length code which matches a received bit string to the longest extent of the bit string length from the leading position. For example, in the case where data 01010010110 in the 1st row of the code string of FIG. 23 from the leading position to the 11th bit is delivered from the input buffer 129 to the decoder 130, a table including the same information as that in the table shown in FIG. 15 is selected from the table group 171 on the basis of the X coordinate position of a pixel of interest specified by the X/Y counter 138 (in this case, the X coordinate position of the pixel of interest is 0). All variable-length codes held in the selected table are compared with the input data 01010010110 one by one from the leading bit. A matching variable-length code, immediately before none of the subsequent variable-length codes match the input data, is regarded as a variable-length which is to be determined and is hidden in the 11-bit input data. Namely, the table is searched for a variable-length code which matches the input data to the longest extent of the bit string length from the leading position of the input data. In this case, a variable-length code 01010 corresponding to the decompression mode of the run-length mode and the length equal to 3 is searched out, as can be conjectured from FIG. 15. Also, in the case where data 01111110011 in the 2nd row of the code string of FIG. 23 from the leading position to the 11th bit is delivered from the input buffer 129 to the decoder 130, a table including the same information as that in the table shown in FIG. 15 is selected from the table group 171 on the basis of the X coordinate position of a pixel of interest specified by the X/Y counter 138 (in this case, the X coordinate position of the pixel of interest is 0). The selected table is searched for a variable-length code which matches the data 01111110011 to the longest extent of the bit string length from the leading position. In this case, a variable-length code 0111111 corresponding to the decompression mode of the dictionary copy mode, the relative position equal to 1 and the length equal to 5 is searched out, as can be conjectured from FIG. 15. In each table, the maximum value of the length parameter is limited to a bit string length from the position of the pixel of interest on the X coordinate to the maximum value of X coordinate values which the X/Y counter 138 can take. Thereby, the redundancy of coding can be improved. Also, in the present embodiment which is directed to the decompression of image data, the size of the table is made small in such a manner that in the case of dictionary copy mode, the dictionary copy is performed for only data which is in a line immediately preceding a line including the pixel of interest and is adjacent to the pixel of interest (or data which is at the relative positions −1, 0 and +1). Thereby, a high compression ratio can be expected. It is preferable that the table prepared in the table group 171 is a table of Huffman codes constructed beforehand in compliance with data to be compressed and decompressed or a table optimized so that the redundancy is reduced with the compression/decompression.

On the basis of the variable-length code for which the selected table is searched, the decoder 130 outputs a mode flag discriminative of a run-length mode or a dictionary copy mode to the mode register 132 and length data to the length counter 137 and outputs relative position data to the relative position register 134 in the case where the mode flag is the dictionary copy mode (step S149). Also, the decoder 130 outputs the decoded bit string length to the input buffer 129 and outputs raw data to the data register 133 in the case where the mode flag is the run-length mode. For example, in the case where in the case where data 01010010110 in the 1st row of the code string of FIG. 23 from the leading position to the 11th bit is delivered from the input buffer 129 to the decoder 130, the parameters of the variable-length code 01010 searched out in step S148 are such that the decompression mode is the run-length mode and the length is 3. Accordingly, the decoder 130 outputs the run-length mode as the mode flag to the mode register 132, the value 3 of length data to the length counter 137, a four-bit portion 0101 (raw data) succeeding the variable-length code 01010 searched out in step S148 to the data register 133, and the decoded bit string length or nine bits corresponding to the addition of the bit string length (five bits) of the searched-out variable-length code and the bit string length (four bits fixed) of the raw data to the input buffer 129. Also, in the case where in the case where data 01111110011 in the 2nd row of the code string of FIG. 23 from the leading position to the 11th bit is delivered from the input buffer 129 to the decoder 130, the parameters of the variable-length code 0111111 searched out in step S148 are such that the decompression mode is the dictionary copy mode, the relative position is 1 and the length is 5. Accordingly, the decoder 130 outputs the dictionary copy mode as the mode flag to the mode register 132, the value 5 of length data to the length counter 137, the value 1 of relative position data to the relative position register 134, and or the decoded bit string length or seven bits of the bit string length of the searched-out variable-length code 0111111 to the input buffer 129. The reason why the decoded bit string length is outputted to the input buffer 129 is that data having the same bit string length as the bit string length decoded by the decoder 130 is added after an unprocessed bit string of data stored in the input buffer 129.

The flow goes to step S151 in the case where the mode flag outputted from the decoder 130 is the run-length mode and goes to step S153 in the case where it is the dictionary copy mode. The mode flag outputted from the decoder 130 is held in the mode register 132 until one decompression operation is completed. When one decompression operation is completed, a new mode flag outputted from the decoder 130 is held in the mode register 132 and the next decompression operation is started.

Figure 27:
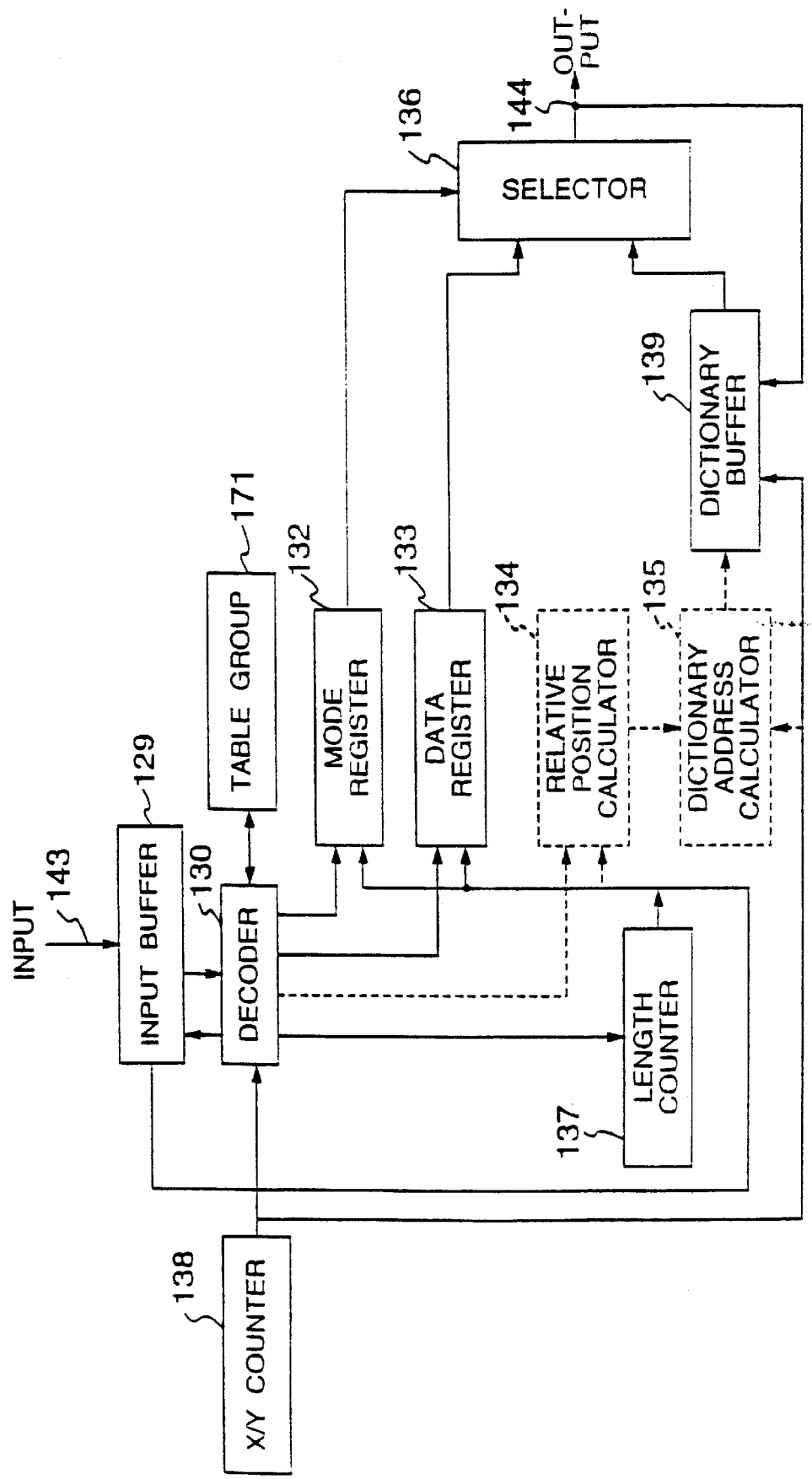
FIG. 27 is a diagram for explaining the operation of the data decompression circuit of FIG. 24 in a run-length mode.

In step S151, a decompression processing in the run-length mode is performed. In the decompression processing in the run-length mode, the relative position register 134 and the dictionary address calculator 135 do not operate, as shown in FIG. 27. First, the data register 133 holds raw data outputted from the decoder 130 while the length counter 137 loads length data outputted from the decoder 130 as an initial value. Next, the raw data held in the data register 133 is outputted through the selector 136 to the output signal line 144 on the basis of the mode flag of run-length held in the mode register 132 (operation 1). Next, in order to produce a dictionary to which the reference is to be made in performing the decompression processing of the next line data, the same data as the outputted data is registered into the dictionary buffer 139 at an address thereof corresponding to X and Y coordinate values specified by the X/Y counter 138 (operation 2), the length counter 137 is decremented (operation 3), and the X coordinate value of the X/Y counter 138 is updated by one (operation 4). As mentioned above, the range of possible X coordinate values of the X/Y counter 138 is 0 to 7. Accordingly, in the case where the X coordinate value of the X/Y counter 138 is 7, the updating of the X coordinate value by one results in that the X coordinate value turns to 0 and the Y coordinate value is updated by one. In step S152, the above operations 1 to 4 are repeated until the value of the length counter 137 comes to 0. Thereby, there is generated decompressed data in which the raw data outputted from the decoder 130 continues to the extent of a length corresponding to the length data outputted from the decoder 130.

Figure 28:
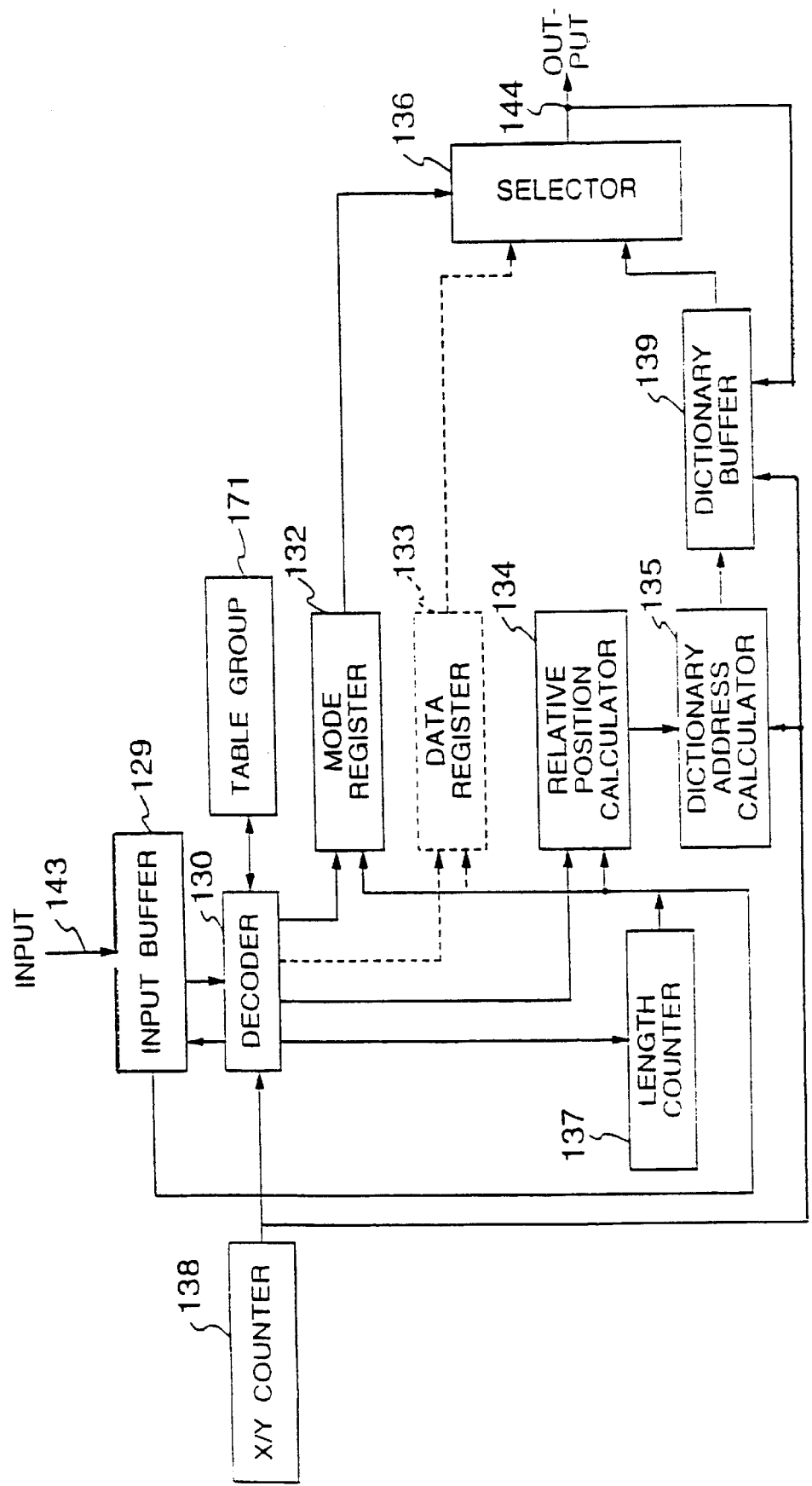
FIG. 28 is a diagram for explaining the operation of the data decompression circuit of FIG. 24 in a dictionary copy mode.

In step S153, a decompression processing in the dictionary copy mode is performed. In the decompression processing in the dictionary copy mode, the data register 133 does not operate, as shown in FIG. 28. First, the relative position register 153 holds relative position data outputted from the decoder 130 while the length counter 137 loads length data outputted from the decoder 130 as an initial value. Next, on the basis of an X coordinate value specified by the X/Y counter 138 and the relative position data held in the relative position register 134, the dictionary address calculator 135 determines the address of that data among data stored in the dictionary buffer 139 to which the reference is to be made (operation 5). That data among data stored in the dictionary buffer 139, which is at the address specified by the dictionary address calculator 135, is outputted through the selector 136 to the output signal line 144 on the basis of the mode flag of dictionary copy held in the mode register 132 (operation 6). Next, in order to produce a dictionary to which the reference is to be made in performing the decompression processing of the next line data, the same data as the outputted data is registered into the dictionary buffer 139 at an address thereof corresponding to X and Y coordinate values specified by the X/Y counter 138 (operation 7), the length counter 137 is decremented (operation 8), and the X coordinate value of the X/Y counter 138 is updated by one (operation 9). In step S154, the above operations 5 to 9 are repeated until the value of the length counter 137 comes to 0. Thereby, there is generated decompressed data in which the data outputted from the dictionary buffer 139 continues to the extent of a length corresponding to the length data outputted from the decoder 130.

In step S155, there is discarded that bit string inclusive of the lead of the bit string stored in the input buffer 129 which has already been decoded by the decoder 130. The flow returns to step S147 in the case where data to be decompressed still exists, and the flow is completed in the case where it does not exist (step S156).

In the above-mentioned example of compression, the dictionary is searched in the dictionary reference range for the longest partial string existing on the dictionary and the searched-out partial string is encoded. However, there may also be considered the case where the longest partial string is divided into a plurality of partial strings and the divisional partial string is compressed after composition thereof with another partial string, and the case where partial strings, which are not the longest, are combined and compressed.

The former case is as follows. For example, the partial string b shown in FIG. 13B is divided into two parts or a partial string c "5543" and a partial string d "4" shown in FIG. 13C and the partial string d "4" and "3" at the 2nd row and 5th column are composed into a partial string e "43". A code for the partial string c is {0, 1, 4} and a code for the partial string e "43" is {4, −1, 2} since the partial string e matches "43" continuing from the 1st row and 4th column of the immediately preceding line. Accordingly, a code for the 2nd row results in ({0, 1, 4} {4, −1, 2} [6, 5, 1] [7, 4, 1]. This code will be referred to as code a'. The latter case is as follows. For example, a partial string "55" for the relative position 0 is selected for the 2nd row and 0th column and a partial string "434" for the relative position +1 is selected for the 2nd row and 2nd column. Thereby, a code for the 2nd row results in {0, 0, 2} {2, 1, 3} {5, −1, 1} [6, 5, 1] [7, 4, 1]. This code will be referred to as code b'.

Thus, three patterns including the pattern shown in the above-mentioned example of compression may exist as the code for the 2nd row shown in FIG. 13A. The code for the 2nd row shown in FIG. 14 will be referred to as code c'. When the actual codes shown in FIGS. 15 to 22 are allotted to the codes a', b' and c', the codes a' spans 23 bits, the code b' spans 26 bits and the code c' spans 22 bits. The code c' are efficient. However, when codes other than those shown in FIG. 15 are allotted to the codes a', b' and c', a different result will be obtained and there may be the case where the code a' or the code b' results in the shortest code. Accordingly, it does not necessarily follow that the best way includes searching for the longest partial string on the dictionary and encoding the longest partial string. It is desirable to select the combination of partial strings on the dictionary which provides the shortest code when the actual codes are allotted.

Even if the combination of partial strings on the dictionary is changed so that the resulting code becomes the shortest, as mentioned above, no influence is given on the data decompression method so long as the encoding rule (using the position of a pixel of interest on the current line, and the leading position and the length of the same partial length in the immediately preceding line) is not changed.

As explained in detail in the foregoing, according to the second data compression/decompression method of the present invention, a dictionary is required to store only the immediately preceding line. Therefore, the capacity of the dictionary is very small. Also, the reference to the dictionary is made within a range in which the degree of similarity is high, and the reference is made to a longest possible partial string. Therefore, a high compression ratio can be attained and a processing for compression/decompression can be performed at a high speed. Further, data compression is performed in such a manner that tables in which a different code is allotted in accordance with the relative position of a leading pixel of a partial string on the immediately preceding line and a pixel of interest and the length of the partial string on the immediately preceding line are prepared for the respective positions of the pixel of interest on the current line, and a code corresponding to the relative position and the length of the partial string is outputted from a table selected in accordance with the position of the pixel of interest on the current line. Each table is a table of Huffman codes constructed beforehand in compliance with data to be compressed and decompressed or a table optimized so that the redundancy is reduced with the compression/decompression. Thereby, a higher compression ratio is obtained. Furthermore, compression such as run-length compression is applied to the first line of the image data and a partial string for which the reference to the dictionary is impossible. Thereby, a still higher compression ratio is obtained.

(Third Data Compression/Decompression Method of the Invention)

In order to facilitate the understanding of a third data compression/decompression method of the present invention, the principle of the third data compression/ decompression method will be explained using the drawings. In the third data compression/decompression method of the present invention, data of the immediately preceding in successively scanned two-dimensional image data (shown in FIG. 29) is held as reference data, using a property that a certain pixel(s) in the image data is similar to a group of pixels in the neighborhood thereof. (A buffer for storing the reference data will hereinafter be referred to as "dictionary" 201.) The reference to the dictionary 201 of the immediately preceding line is made to detect whether or not the dictionary includes a partial string which is the same as a partial string 202 on line data to be compressed to the extent of at least one or more pixels.

In the case where it is detected that the dictionary 201 includes a partial string which matches the partial string 202 to be compressed, a partial string 203 is detected which matches the partial string 202 to be compressed to the longest possible extent within the range of the preset maximum detection string length N. (In the present example, it is assumed that N=8.) Next, assume that the number of pixels in one line of the two-dimensional image data is H and the position of a pixel of interest (or a leading pixel of the partial string to be compressed) on the current line is x ($0 \leq x \leq H-1$). Then, one table is selected from among tables which are prepared for the respective values of T, T being T=0 when x=0, T=1 when $1 \leq x \leq H-N$, and T=x-H-N+1 when $H-N+1 \leq x \leq H-1$ and in which a different code is allotted in accordance with the relative position of a leading pixel of the partial string on the immediately preceding line and the pixel of interest and the length of the partial string on the immediately preceding line. The selected table corresponds to the value of T (T=0 in the shown example) determined on the basis of the position x (x=0 in the shown example) of the pixel 205 of interest on the current line from a leading pixel thereof. The reference to the selected table is made, and a code corresponding to the leading position 204 of the partial string 203 on the dictionary 201 and the length of the partial string 203 (five dots in the shown example) is outputted, thereby performing data compression. At this time, it is preferable that the range of reference to the dictionary 201 is limited to fall within a range in which the degree of similarity of the partial string 202 to be compressed to the partial string on the dictionary 201 is high. In order to improve the compression/decompression speed, it is also preferable that the maximum detection string length N is set to be greater when the same partial string existing on adjacent lines in the two-dimensional image data is relatively long and to be smaller when it is short. However, if N is set to an extremely great value, the number of tables is increased so that the compression/decompression speed is lowered on the contrary. On the other hand, if N is set to an extremely small value, the number of tables is reduced but the compression ratio is deteriorated since the length of a partial string made the object of reference is small. Though FIG. 29 shows the two-dimensional image data in which the number H of pixels in one line is 16 bits, the range of values which T can take is constant irrespective of the value of the number H of pixels in one line so long as the maximum detection string length N is smaller than the number H of pixels in one line. Namely, the possible values of T are $0 \leq T \leq x-H+N+1$ but there ultimately results in $0 \leq T \leq N$ since the maximum possible value of the position x of the pixel of interest on the current line is H-1. Accordingly, even when the number H of pixels in one line of the two-dimensional image data is increased, the number of tables always comes to N+1 (always 9 in the present example in which N=8 is assumed).

In the case where a partial string matching the partial string 202 to be compressed is not detected in the dictionary 201, compression such as run-length compression is applied to the partial string 202 to be compressed. In the case the run-length compression is applied, it is preferable to perform data compression in such a manner that a corresponding code is outputted by selecting, from among run-length tables which are prepared for the respective values of T mentioned above and in which a different code is allotted in accordance with the length of the same continuous data, a run-length table which corresponds to the value of T determined on the basis of the position x of the pixel 205 of interest on the current line from the leading pixel thereof and referring to the selected run-length table. It is required that the codes stored in the run-length table should be different from the codes stored in the above-mentioned table. Also, it is preferable that the code stored in the table and the run-length table is not a fixed-length code but a variable-length code in order to enhance the compression ratio by allotting a short code to data which has a high probability of occurrence.

In the third data compression/decompression method of the present invention, a dictionary is required to store only the immediately preceding line, as mentioned above. Therefore, the capacity of the dictionary is very small. Also, the reference to the dictionary is made within a range in which the degree of similarity is high, and the reference is made to a longest possible partial string within the range of the maximum detection string length N. Therefore, a high compression ratio can be attained and a processing for compression/decompression can be performed at a high speed. Further, the number of tables to be prepared is always N (the maximum detection string length) plus 1 irrespective of the number of pixels in one line of the two-dimensional image data. Therefore, when the number of pixels in one line of the two-dimensional image data is increased, it is possible to prevent the lowering of the processing speed which may occur due to the increase of the capacity of the table. By applying compression such as run-length compression to the first line of the image data and a partial string for which the reference to the dictionary is impossible, a higher compression ratio is obtained.

An embodiment of the third data compression/ decompression method of the present invention will now be explained. As shown in FIG. 30, a data compression circuit according to an embodiment of a third data compression apparatus for realizing the third data compression method of the present invention includes a line buffer 205, a dictionary buffer 206 for holding data of the immediately preceding line, a comparator 207, a code generator 208, an adder 209, a pointer 210, a relative position counter 211, a pointer buffer 212, a length counter 213, a relative position and length buffer 214, a selector 215, a partial string buffer 216, and a table group 270 including tables shown in FIGS. 34 to 42. In FIG. 30, reference numeral 217 denotes a line buffer input signal line, reference numeral 218 a dictionary buffer input signal line, reference numeral 219 a code output line, and reference numeral 272 an input signal line for the number Hsize of pixels in one line of the two-dimensional image data.

The tables shown in FIGS. 34 to 42 are prepared for the respective values of T (which will be mentioned later on) determined on the basis of the position of a pixel of interest (or a leading pixel of a partial string to be compressed) on the current line from a leading pixel thereof. In each table, a different code is allotted and stored in accordance with the relative position of a leading pixel of the same partial string as the partial string to be compressed in the two-dimensional image data successively inputted through the line buffer input signal line 217 and the pixel of interest on the immediately preceding line and the length of the partial string to be compressed on the immediately preceding line.

Next, the outline of the operation of the data compression circuit having the above construction will be shown on the basis of a flow shown in FIG. 31. First or in step S220, the number H (Hsize) of pixels in one line of two-dimensional image data is inputted to the code generator 208. Next or in step S221, the pointer 210 is initialized, and data pushed out of the line buffer 205 is stored into the dictionary buffer 206 through the dictionary buffer input signal line 218. Thereafter, the two-dimensional image data successively inputted image data are stored into the line buffer 205 through the line buffer input signal line 217 (step S222).

Next, a search is made for the longest partial string on the dictionary which matches a partial string to be compressed (as which data of continuous pixels selected from data of the current line stored in the line buffer 205 will be defined) to the longest possible extent within the range of the preset maximum detection string length N ($1 \leq N \leq H$) (step S223). In order to improve the compression/decompression speed, it is preferable that the maximum detection string length N is set to be greater when the same partial string existing on adjacent lines in the two-dimensional image data successively inputted through the line buffer input line 217 is relatively long and to be smaller when it is short. However, if N is set to an extremely great value, the number of tables is increased so that the compression/decompression speed is lowered on the contrary. On the other hand, if N is set to an extremely small value, the number of tables is reduced but the compression ratio is deteriorated since the length of a partial string made the object of reference is small. In the present embodiment, N is selected to be 8. A search for the longest partial string shown as one flow step S223 in FIG. 31 is made in accordance with the following procedure. The concept of the search for the longest partial string will be explained using 16×8 image data shown in FIGS. 32A to 32C by way of example. In the present embodiment, the judgement of whether or not a line preceding by one line to the partial string made the object of search includes the same partial string as the partial string made the object of search, is made by performing a search as to whether or not the same pixel as the leading pixel of the partial string made the object of search exists between a position returned by one from the leading pixel position of the partial string made the object of search (defined as relative position −1) and a position advanced by one therefrom (defined as relative position +1). The compression in step S223 is performed in the case where the same pixel string exists in the immediately preceding line within a range shifted by one pixel to the right and left.

Speaking in conjunction with FIG. 32A, (1) an example of relative position −1 is a partial string "554" continuing from "5" at the 3rd row and 1st column. Since this partial string "554" is the same as a partial string "554" continuing from "5" at the 2nd row and 0th column, it is determined that the same partial string exists at a position shifted by one pixel to the left. (2) An example of relative position 0 is a partial string "34" continuing from "3" at the 1st row and 4th column. Since this partial string "34" is the same as a partial string "34" continuing from "3" at the 0th row and 4th column, it is determined that the same partial string exists at a position shifted by zero pixel. (3) An example of relative position +1 is a partial string "55434" continuing from "5" at the 2nd row and 0th column. Since this partial string "55434" is the same as a partial string "55434" continuing from "5" at the 1st row and 1st column, it is determined that the same partial string exists at a position shifted by one pixel to the right.

In step S223, data of the pointer 210 is first stored into the pointer buffer 212 and the relative position counter 211 is initialized. Next, data of one pixel is taken into the partial string buffer 216 from the line buffer 205 indicated by the pointer 210. Regarding the data of the one pixel in the current line taken in the partial string buffer 216 from the line buffer 205, a search is made as to whether or not a matching pixel exists for each of a pixel at the relative position −1, a pixel at the relative position 0 and a pixel at the relative position +1 in the immediately preceding line stored in the dictionary buffer 206. In the case where there is no matching pixel, the length "0" is written into the relative position and length buffer 214 for each relative position and the flow proceeds to step S224. In FIG. 32A, regarding "4" at the 1st row and 3rd column, the pixels at the 0th row and 2nd column and the 0th row and 3rd column are both "2" and the pixel at the 0th row and 4th column is "3". Accordingly, "0" is written as length data for a point (1, 3) into the relative position and length buffer 114 for all the relative positions −1, 0 and +1. In the case where there is a matching pixel, the pointer 210 and the length counter 215 are incremented and data of the next pixel is taken into the partial string buffer 216. At this time, the leading address of the partial string made the object of search under searching in the present search is remained in the pointer buffer 212.

In the case where the matching for the leading pixel of the partial string made the object of search is found at the relative position −1, a search regarding the next pixel is made in such a manner that data of a pixel at the relative position −1 in the data of the immediately preceding line is compared with the pixel taken in the partial string buffer 216. Also, in the case where the matching is found at the relative position 0, a search regarding the next pixel is made in such a manner that data of a pixel at the relative position 0 in the data of the immediately preceding line is compared with the pixel taken in the partial string buffer 216. Further, in the case where the matching is found at the relative position +1, a search regarding the next pixel is made in such a manner that data of a pixel at the relative position +1 in the data of the immediately preceding line is compared with the pixel taken in the partial string buffer 216. In the case where the result of each comparison indicates the matching, the next pixel pointer 210 is incremented to take data of the next pixel into the partial string buffer 216 and the length counter 215 is incremented. This operation is repeated until the result of each comparison indicates no matching or the count value of the length counter 215 becomes the maximum detection string length N (N=8 in the present embodiment). Thereby, in the case where the result of comparison indicates no matching, the count value of the length counter 215, at a point of time when the matching ceases to be obtained, is measured as the length L of a partial data string which has the same data string as data of the immediately preceding line. In the case where the count value of the length counter 215 becomes the maximum detection string length N, the maximum detection string length N is measured as the length L of a partial data string which has the same data string as data of the immediately preceding line. This length information is counted for each of the relative position −1, the relative position 0 and the relative position +1. Namely, after the length L has been counted for the relative position −1 in a manner mentioned above, the length L is stored as length information of the relative position −1 into the relative position and length buffer 214 at the column of the relative position −1. Subsequently, in order to make a search regarding the relative position 0, the leading address of the partial string as the object of search temporarily stored in the pointer buffer 212 is returned into the pixel pointer 210 and the relative position counter 211 is incremented. With the pixel counter 210 being incremented, the comparison is similarly made for the next data of on the right side of the leading address of the partial string made the object of search until the data matching relevant to the relative position 0 ceases to be obtained or the count value of the length counter 215 becomes the maximum detection string length N. Thereby, the length information L is determined. Subsequently, a similar search is made regarding the relative position +1.

Considering a partial string which has "5" at the 2nd row and 0th column in FIG. 32A as its leading pixel, this pixel is at the lead of the current line and hence no data exist at the relative position −1 of the preceding line. Accordingly, the length L for the relative position −1 is 0. Regarding to the relative position 0, "5" exists at the 1st row and 0th column. Therefore, the length counter 213 is incremented and data "5" of the 2nd row and 1st column next to "5" of the 2nd row and 0th column is taken into the partial string buffer 216 for comparison with "5" of the 1st row and 1st column. Since this comparison too indicates the matching, the length counter 213 is incremented and data "4" of the 2nd row and 2nd column next to "5" of the 2nd row and 1st column is taken into the partial string buffer 216 for comparison with "5" of the 1st row and 2nd column. This comparison indicates no matching. The value of the length counter 213 at this time is "2" and does not reach the maximum partial string length N=8. Accordingly, the length L of the partial string with "5" at the 2nd row and 0th column as its leading pixel for the relative position 0 comes to 2.

Regarding the partial string having "5" at the 2nd row and 0th column as its leading pixel, "5" exists at the 1st row and 1st column and this data matches the leading pixel. Therefore, the comparison for the next pixel is also made for the relative position +1. Namely, data "5" of the 2nd row and 1st column next to "5" of the 2nd row and 0th column is taken into the partial string buffer 216 and is then compared with "5" of the 1st row and 2nd column which is at the relative position +1. Since this comparison indicates the matching, the comparison is repeated while successively taking in the next pixel on the right side. When the comparison of "3" at the 2nd row and 5th column and "1" at the 1st row and 6th column is made, no matching is found. The value of the length counter 213 at this time is "5" and does not reach the maximum partial string length N=8. Accordingly, the length L of the partial string with "5" at the 2nd row and 0th column as its leading pixel for the relative position 1 comes to 5.

With the above, three lengths including L (relative position −1)=0, L (relative position 0)=2 and L (relative position +1)=5 are stored in the relative position and length buffer 214 as the length L of the partial string having "5" at the 2nd row and 0th column as its leading pixel. From thereamong is selected a partial string which has the greatest length L equal to 5. In the case of FIG. 32A, a partial string a (55) corresponds to the same partial string for the relative position 0 and a partial string b (55434) corresponds to the same partial string for the relative position +1, as shown in FIG. 32B. Since the length of the partial string a is 2 and the length of the partial string b is 5, the partial string b providing a high efficiency of compression is selected.

Namely, the flow goes through step S224 to step S225 in which x, y and z are inputted to the code generator 208, where x is the position of a pixel of interest on the current line stored in the pointer buffer 212, y is the length of the longest data among data stored in the relative position and length buffer 214, and z is a value corresponding to the addition of 2 to the relative position of the longest data.

In step S228, the code generator 208 determines the value of T from the position x of the pixel of interest on the current line. The value of T is T=0 when x=0, T=1 when $1 \leq x \leq H-N$, and T=x−H+N+1 when $H-N+1 \leq x \leq H-1$, where H is the number of pixels in one line of the two-dimensional image data inputted to the code generator 208 at step S220 and N is the preset maximum detection string length. In the present embodiment, H is 16 and N is set to 8 beforehand, as mentioned above. Accordingly, the value of T is T=0 when x=0 (step S229), T=1 when $1 \leq x \leq 8$ (step S230), and T=x−7 when $9 \leq x \leq 15$ (step S231).

In step S232, the code generator 208 selects a corresponding table from the table group 270 on the basis of the value of T determined from the position x of the pixel of interest on the current line and refers to the selected table so that a code corresponding to the length y of data and the value z of addition of 2 to the relative position of that data is outputted from the code generator 208 through the code output line 219.

On the other hand, if step S224 determines that the lengths stored in the relative position and length buffer 214 are all 0, that is, if no matching partial string is found in the dictionary, the flow goes through step S224 to step S226 in which run-length compression is performed. Namely, a search is made for a partial string on the current line including the same pixels which continue to the longest possible extent within the range of the maximum detection string length N (N=8 in the present embodiment). First, data of the line buffer 205 indicated by the pointer 210 is stored into the partial string buffer 216. Also, the pointer 210 is advanced by one so that the data of the line buffer 205 is inputted to the comparator 207 through the selector 215 for comparison with data of the partial string buffer 216. If the result of comparison indicates the matching, the length counter 213 is incremented and the next data indicated by the pointer 210 is inputted to the comparator 207 through the selector 215 for comparison with data of the partial string buffer 216. The comparison with data of the partial string buffer 216 is repeated with the pointer 210 being advanced one by one until the result of comparison indicates no matching or the count value of the length counter 215 becomes the maximum detection string length N. In the case where the result of comparison indicates no matching, the count value of the length counter 215, at the point of time when the matching ceases to be obtained, is measured as the length L of the partial data string on the current line including the same continuous pixels. In the case where the count value of the length counter 215 becomes the maximum detection string length N, the maximum detection string length N is measured as the length L of the partial data string on the current line including the same continuous pixels.

Next or in step 227, data stored in the partial string buffer 216 is inputted together with the values of x, y and z to the code generator 208, where x is the position of a pixel of interest on the current line stored in the pointer buffer 212, y is the length of the partial data string with the same continuous pixels counted by the length counter 213, and z is 0.

Next, a corresponding table is selected from the table group 270 on the basis of the value of T determined from the position x of the pixel of interest on the current line and refers to the selected table so that a code corresponding to the length y of data and z=0 and raw data to be repeated is outputted through the code output line 219 (step S232).

The above operation is repeated through step S233 and step S234 up to the last line of the two-dimensional image data to perform the data compression or the encoding.

Next, explanation will be made of the data compression process of the 16×8 image data shown in FIGS. 32A to 32C. It is assumed that each data is represented by 4 bits. For convenience' sake, the coordinate of image data will be represented by (column, row) and the encoded code will be represented by {T, relative position, length} or [T, kind of data, length]. Namely, a portion enclosed by the brace { } shows a portion subjected to compression based on the third data compression method of the present invention and a portion enclosed by the bracket [ ] shows a portion subjected to compression based on the run-length compression method. Here, T is the value determined from the position x of the pixel of interest on the current line in step S228. Namely, in the present embodiment, T is 0 in the case where the pixel of interest is positioned at the 0th column, 1 in the case where it is positioned at the 1st to 8th columns, 2 in the case where it is positioned at the 9th column, 3 in the case where it is positioned at the A-th column, 4 in the case where it is positioned at the B-th column, 5 in the case where it is positioned at the C-th column, 6 in the case where it is positioned at the D-th column, 7 in the case where it is positioned at the E-th column, and 8 in the case where it is positioned at the F-th column.

For example, a code corresponding to the column of the pixel of interest equal to 0, the relative position equal to 1 and the length equal to 3 results in {0, 1, 3} and a code corresponding to the column of the pixel of interest equal to 1, the kind of data equal to and the length equal to 2 results in [1, 5, 2]. Provided that the coordinate of the pixel of interest is (x, y), the range of reference to the dictionary is (x−1, y−1), (x, y−1) and (x+1, y−1) in terms of relative position. In the case of FIG. 32A, the 0th row is subjected to run-length compression since there is no dictionary to which the reference is to be made. Image data at (0, 0) to (3, 0) are all the same and 2, and hence the resulting code is [0, 2, 4]. Data at (4, 0) is 3 and only one of this data exists. Therefore, the resulting code is [1, 3, 1]. Data at (5, 0) to (7, 0) are all the same and 4, and hence the resulting code is [1, 4, 3]. Data at (8, 0) is 6 and only one of this data exists. Therefore, the resulting code is [1, 6, 1]. Data at (9, 0) and (A, 0) are both the same and C, and hence the resulting code is [2, C, 2]. Data at (B, 0) and (C, 0) are both the same and 6, and hence the resulting code is [4, 6, 2]. Data at (D, 0) to (F, 0) are all the same and 3, and hence the resulting code is [6, 3, 3]. Accordingly, the resulting codes for the 0th row are [0, 2, 4] [1, 3, 1] [1, 4, 3] [1, 6, 1] [2, C, 2] [4, 6, 2] [6, 3, 3], as shown by the 0th row in FIG. 33.

A processing for the 1st row shown in FIG. 32A is performed handling the 0th row as a dictionary. Data at (0, 1) is compared with data at (0, 0) but this comparison indicates no matching. The data at (0, 1) is thereafter compared with data at (1, 0) but this comparison too indicates no matching. Therefore, on the determination that the dictionary includes no matching partial string, the run-length compression is applied. Data at (0, 1) to (2, 1) are all 5, and hence the resulting code is [0, 5, 3]. Data at (3, 1) is 4 and does not match data at (2, 0), (3, 0) and (4, 0). The run-length compression is applied and the resulting code is [1, 4, 1]. Data at (4, 1) is 3 and matches data at (4, 0) among (3, 0), (4, 0) and (5, 0), and data at (4, 1) to (5, 1) match data of the dictionary at (4, 0) to (5, 0). The resulting code is {1, 0, 2}. Data at (6, 1) and data at (7, 1) do not match data of the dictionary. The resulting codes are [1, 1, 1] and [1, 3, 1], respectively. Data at (8, 1) is C and matches data at (9, 0) among (7, 0), (8, 0) and (9, 0), and data at (8, 1) to (9, 1) match data of the dictionary at (9, 0) to (A, 0). The resulting code is {1, 1, 2}. Data at (A, 1) is C and matches data at (9, 0) and (A, 0) among (9, 0), (A, 0) and (B, 0). Here, data at (B, 1) and data at (A, 0) do not match but data at (A, 1) to (C, 1) match data of the dictionary at (A, 0) to (C, 0). The resulting code is {3, 0, 3}. Data at (D, 1) is 6 and matches data at (C, 0) among (C, 0), (D, 0) and (E, 0), and data at (D, 1) to (F, 1) match data of the dictionary at (C, 0) to (E, 0). The resulting code is {6, −1, 3}. Accordingly, the resulting codes for the 1st row are [0, 5, 3] [1, 4, 1] {1, 0, 2} [1, 1, 1] [1, 3, 1] {1, 1, 2} {3, 0, 3} {6, −1, 3}, as shown by the 1st row in FIG. 33.

A processing for the 2nd row shown in FIG. 32A is performed handling the 1st row as a dictionary. Data at (0, 2) matches data of the dictionary at (0, 1) which is the relative position 0 and also matches data of the dictionary at (1, 1) which is the relative position 1. The length of a matching partial string of the dictionary in the case of the relative position 0 is (0, 1) to (1, 1) or 2 whereas the length of a matching partial string of the dictionary in the case of the relative position 1 is (1, 1) to (5, 1) or 5. Namely, the length of the partial string of the dictionary for the relative position 1 is greater than that for the relative position 0. The resulting code is {0, 1, 5}. The above processing is repeated up to the last line. As a result, a code string shown in FIG. 33 is obtained for the image data shown in FIGS. 32A to 32C.

Next, actual codes are allotted to the code string of FIG. 33 by use of tables shown in FIGS. 34 to 42. FIGS. 34 to 42 show tables which are prepared for the respective values of T and in which a different code is allotted in accordance with the value of y and the value of z. Here, T is the value determined in step S228 from the position x of a pixel of interest on the current line and y and z are the values inputted to the code generator 208 in step S225 or step S227. The value y is the length of a partial string to be compressed. Also, the value z is 0 in the case where a code string is enclosed by a bracket [ ], that is, in the case where the run-length compression is made and is equal to the addition of 2 to the relative position in the case where the code string is enclosed by a brace { }, that is, in the case where the dictionary compression based on the third data compression method of the present invention is made.

The code stored in each table is not a fixed-length code but a variable-length code in order to enhance the compression ratio by allotting a short code to data which has a high probability of occurrence. The reason why the tables are prepared for the respective values of T is as follows. In principle, the number of tables to be prepared may be one. However, when the tables are united into one, different codes must be allotted in accordance with all values which y and z can take. By the way, the possible values of y and z differ depending on the position x of the pixel of interest on the current line from the leading pixel thereof. For example, the maximum value of y in each table comes to a bit string length from the pixel of interest to a pixel positioned at the last of the current line. Also, in the case of x=0, it is not necessary to allot codes for z=1 (or the case where the relative position is −1). Accordingly, if the tables are united into one, the redundancy of coding is increased. On the other hand, in the case where the tables are prepared for the respective values x of the pixel of interest on the current line from the leading pixel thereof, the redundancy of coding can be improved by limiting the maximum value of y in each table to a bit string length from the pixel of interest to a pixel positioned at the last of the current line. However, in the case where the number H of pixels in one line of the two-dimensional image is increased, new tables must be added and hence the table capacity is increased, thereby lowering the compression/decompression speed. Thus, in the present embodiment, the maximum detection string length N of a partial string to be compressed is set beforehand. In the case of x=0, an exclusive table is prepared since it is not necessary to allot codes for z=1. In the case of $1 \leq x \leq H-N$, tables are united to one or one table is prepared since the maximum possible values of y are all N and the possible values of z are all 0 to 3. In the case of $H-N+1 \leq x \leq H-1$, tables for the exclusive use for the respective values of x are prepared since the possible values of z are all 0 to 3 but the maximum possible value of y is a bit string length from the pixel of interest to a pixel positioned at the last of the current line. Namely, the tables are prepared for the respective values of T, T being set to T=0 when x=0, T=1 when $1 \leq x \leq H-N$, and T=x-H-N+1 when $H-N+1 \leq x \leq H-1$. With such setting of the value of T, the range of possible values of T is constant irrespective of the value of the number H of pixels in one line so long as the maximum detection string length N is smaller than the number H of pixels in one line. Namely, the possible values of T are $0 \leq T \leq x-H+N+1$ but there ultimately results in $0 \leq T \leq N$ since the maximum possible value of the position x of the pixel of interest on the current line is H-1. Accordingly, even when the number H of pixels in one line of the two-dimensional image data is increased, the number of tables is always N+1 and it is therefore possible to prevent the table capacity from increasing with the lowering of the compression/decompression speed.

Also, in the present embodiment which is directed to the compression of image data, the size of the table is made small in such a manner that in the case of dictionary compression, the dictionary compression is performed for only data which is in a line immediately preceding a line including a pixel of interest and is adjacent to the pixel of interest (or data which is at the relative positions −1, 0 and +1). Thereby, a high compression ratio can be expected. It is preferable that the table prepared in the table group 270 is a table of Huffman codes constructed beforehand in compliance with data to be compressed and decompressed or a table optimized so that the redundancy is reduced with the compression/decompression. In FIGS. 34 to 42, a hyphen "-" shows that no variable-length code is allotted.

First, one of the tables shown in FIGS. 34 to 42 is selected on the basis of the value of T. For example, the table of T=0 shown in FIG. 34 is selected in the case where [0, 2, 4] is to be encoded, and the table of T=1 shown in FIG. 35 is selected in the case where {1, −1, 1} is to be encoded. Next, a code corresponding to the values y and z is selected from the selected table. For example, in the case where [0, 2, 4] is to be encoded, a code 0110110111 corresponding to y=4 and z=0 is selected from the table of T=0 shown in FIG. 34. In the case where {1, −1, 1} is to be encoded, a code 0111 corresponding to y=1 and z=1 is selected from the table of T=1 shown in FIG. 35. In the case where z=0, that is, in the case where the run-length compression is made, raw data to be repeated (or 4-bit fixed color code information in the present embodiment or luminance data for each color in the case of certain image) is added after a code selected from a table. For example, in the case where [0, 2, 4] is to be encoded, 0010 is added after the code 0110110111 corresponding to y=4 and z=0 selected from the table of T=0 shown in FIG. 34. Accordingly, the resulting code for [0, 2, 4] is 01101101110010.

The result of transformation of the code string of FIG. 33 into the actual codes is shown in FIG. 43. The capacity of the image data shown in FIGS. 32A to 32C is 512 bits whereas the data capacity the code string shown in FIG. 43 is 404 bits. The use of the algorithm of the third data compression method according to the present invention results in the compression of the original image data to 78.9%.

Figure 44:
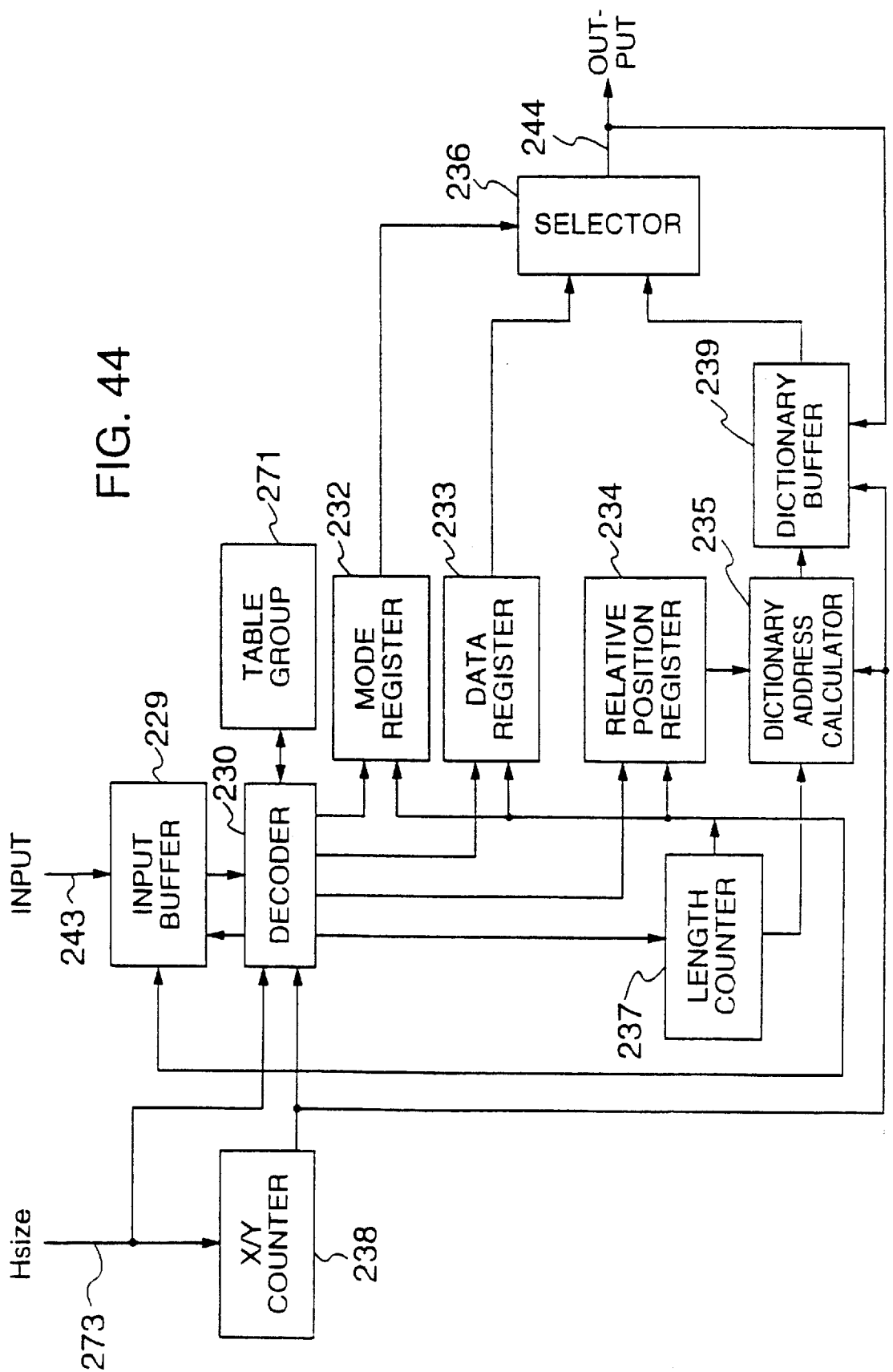
FIG. 44 is a block diagram showing a data decompression circuit according to an embodiment of a third data decompression apparatus for realizing the third data decompression method of the present invention.
Figure 45:
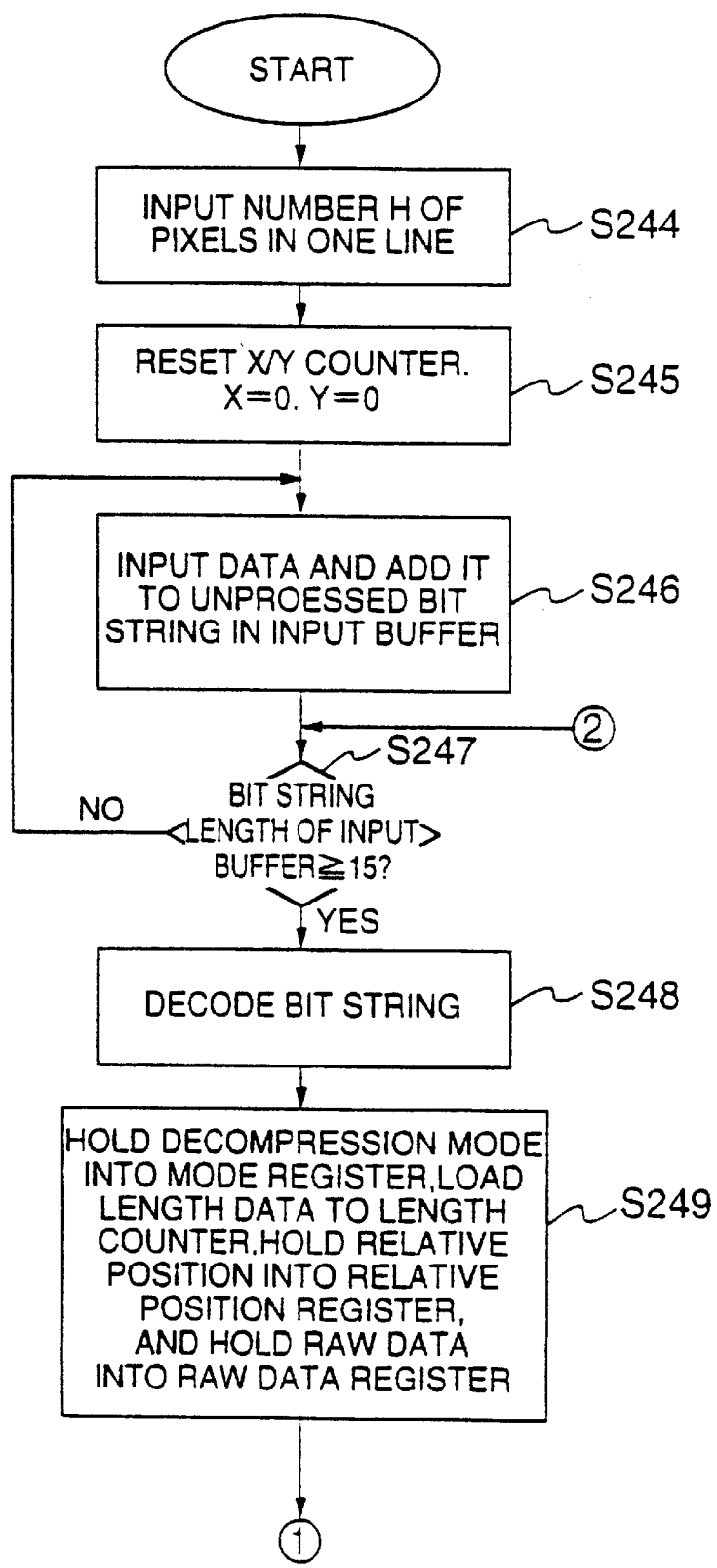
FIG. 45 is a flow chart showing the operation of data decompression in the data decompression circuit shown in FIG. 44.
Figure 46:
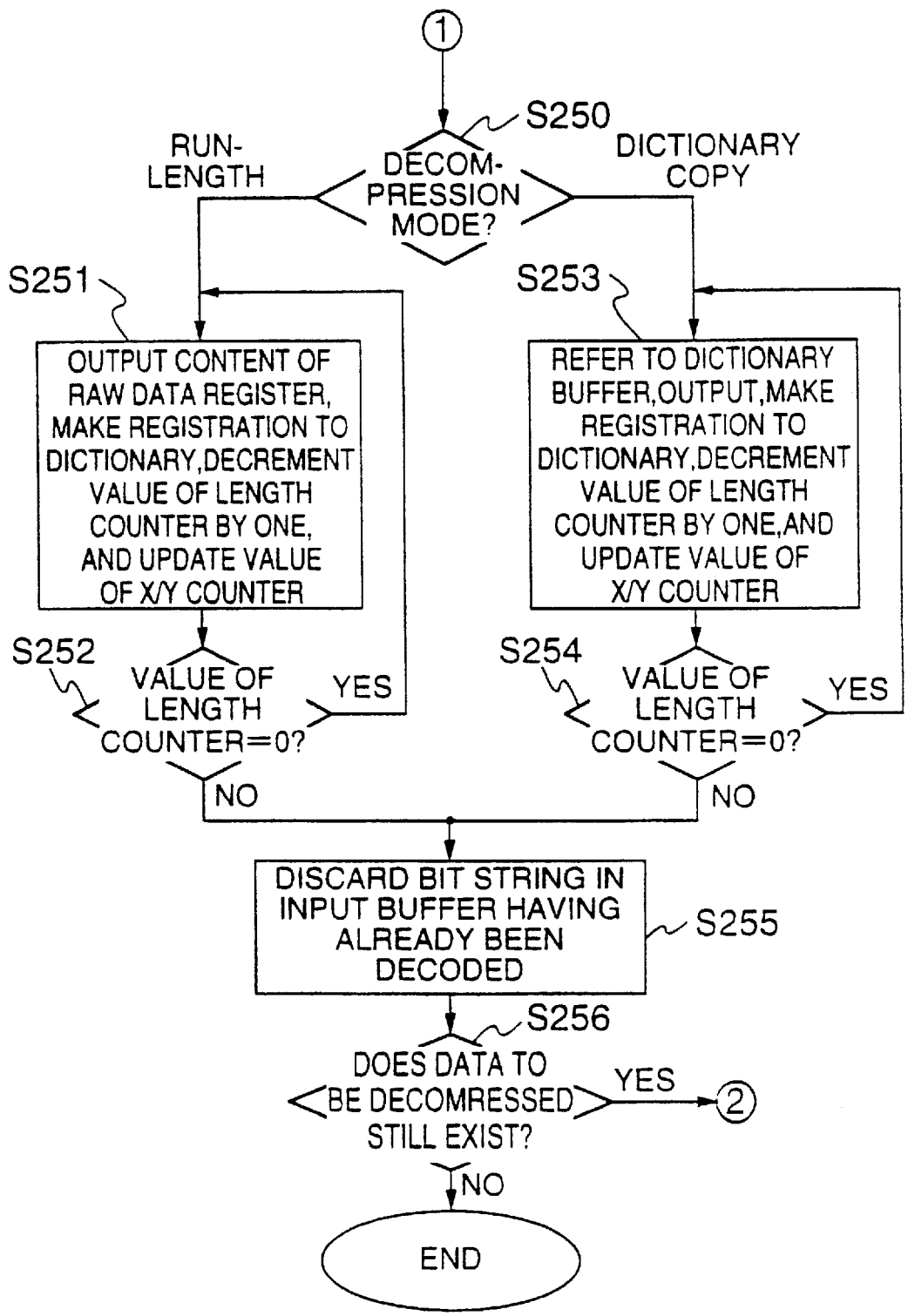
FIG. 46 is a flow chart showing the operation of data decompression in the data decompression circuit shown in FIG. 44.

A procedure for decompressing the code compressed in accordance with the above manner will be shown using FIGS. 44 to 46. FIG. 44 is a block diagram showing an example of the construction of a decompression circuit. FIGS. 45 and 46 are flow charts of a data decompression algorithm. In FIG. 44, reference numeral 229 denotes an input buffer, numeral 230 a decoder, numeral 232 a mode register, numeral 233 a data register, numeral 234 a relative position register, numeral 235 a dictionary address calculator, numeral 236 a selector, numeral 237 a length counter, numeral 238 an X/Y counter for specifying the position of data to be decompressed on a two-dimensional space, numeral 239 a dictionary buffer in which data made the object of reference in copying of the dictionary is stored, numeral 271 a group of tables prepared for the respective values of T, numeral 243 an input signal line to the input buffer 229, numeral 244 an output signal line, and numeral 273 an input signal line for the number Hsize of pixels in one line of two-dimensional image data. The value of T in the table group 217 is determined in the same manner as that in step S228 shown in FIG. 31, when the position of a pixel of interest (or a leading pixel of a partial string to be decompressed) on the X coordinate specified by the X/Y counter 238 is x. In each table is stored the same information as that in the table of FIGS. 34 to 42 for each value of T determined on the basis of the value of x of the pixel of interest on the X coordinate. Though it is not necessary to impose restrictions on a value on the Y coordinate which the X/Y counter 238 can take, a value on the X coordinate is limited 0 to H−1 in the case where the number of pixels in one line of the two-dimensional image data is H. In the present embodiment, the value on the X coordinate, which the X/Y counter 238 can take, is limited to 0 to 15 since the number H of pixels in one line of the two-dimensional image data is 16.

Next, the outline of the operation of the decompression circuit having the above construction will be shown. First or in step S244, the number H (Hsize) of pixels in one line of two-dimensional image data to be decompressed is inputted to the X/Y counter 238 and the decoder 230. Next or in step S245, the X/Y counter 238 is initialized. Thereafter, the compressed data is taken into the input buffer 229 through the input signal line 243 (step S246). In the second and subsequent decompression processings, the compressed data is taken in after an unprocessed bit string of data stored in the input buffer 229. The input buffer 229 comprises an FIFO, shift register or the like. In step S247, the judgement is made of whether or not the length of a bit string stored in the input buffer 229 is not smaller than 15 bits. This is because the bit string length delivered from the input buffer 229 to the decoder 211 must be not smaller than the longest bit string length of data compressed by the data compression circuit. In the compression method according to the present embodiment, when a code selected from the tables shown in FIGS. 34 to 42 includes 11 bits in the case where the run-length compression is made, raw data (4 bits fixed) is added to the 11 bits and hence the resulting bit length comes to the longest or 15 bits. When the bit string length stored in the input buffer 229 is not smaller than 15 bits, the flow goes to step S248. When the bit string length is smaller than 15 bits, the flow returns to step S246.

In step S248, a portion of 15 bits from the lead of a bit string stored in the input buffer 229 is delivered to the decoder 230. On the basis of the position x of a pixel of interest on the X coordinate which is specified by the X/Y counter 238, the number H of pixels in one line of the two-dimensional image data to be decompressed which is inputted in step S244 (H=16 in the present embodiment) and the maximum detection string length N which is used in the compression circuit (N=8 in the present embodiment), the decoder 230 determines the value of T in the same manner as that in step S228 shown in FIG. 31 and thereafter selects a table corresponding to the value of T from the table group 271. The selected table is searched for a variable-length code which matches a received bit string to the longest extent of the bit string length from the leading position. For example, in the case where data 011011011100101 in the 0th row of the code string of FIG. 43 from the leading position to the 15th bit is delivered from the input buffer 229 to the decoder 230, a table including the same information as that in the table shown in FIG. 34 is selected from the table group 271 on the basis of the value of T determined from the position x of a pixel of interest on the X coordinate specified by the X/Y counter 238 (in this case, T=0 since x=0). All variable-length codes held in the selected table are compared with the input data 011011011100101 one by one from the leading bit. A matching variable-length code, immediately before none of the subsequent variable-length codes match the input data, is regarded as a variable-length which is to be determined and is hidden in the 15-bit input data. Namely, the table is searched for a variable-length code which matches the input data to the longest extent of the bit string length from the leading position of the input data. In this case, a variable-length code 0110110111 corresponding to the decompression mode of the run-length mode and the length equal to 4 is searched out, as can be conjectured from FIG. 34. Also, in the case where data 011011100111100 in the 2nd row of the code string of FIG. 43 from the leading position to the 15th bit is delivered from the input buffer 229 to the decoder 230, a table including the same information as that in the table shown in FIG. 34 is selected from the table group 271 on the basis of the value of T determined from the position x of a pixel of interest on the X coordinate specified by the X/Y counter 238 (in this case, T=0 since x=0). The selected table is searched for a variable-length code which matches the data 011011100111100 to the longest extent of the bit string length from the leading position. In this case, a variable-length code 01101110 corresponding to the decompression mode of the dictionary copy mode, the relative position equal to 1 and the length equal to 5 is searched out, as can be conjectured from FIG. 34.

On the basis of the variable-length code for which the selected table is searched, the decoder 230 outputs a mode flag discriminative of a run-length mode or a dictionary copy mode to the mode register 232 and length data to the length counter 237 and outputs relative position data to the relative position register 234 in the case where the mode flag is the dictionary copy mode (step S249). Also, the decoder 230 outputs the decoded bit string length to the input buffer 229 and outputs raw data to the data register 233 in the case where the mode flag is the run-length mode. For example, in the case where in the case where data 011011011100101 in the 0th row of the code string of FIG. 43 from the leading position to the 15th bit is delivered from the input buffer 229 to the decoder 230, the parameters of the variable-length code 0110110111 searched out in step S248 are such that the decompression mode is the run-length mode and the length is 4. Accordingly, the decoder 230 outputs the run-length mode as the mode flag to the mode register 232, the value 4 of length data to the length counter 237, a four-bit portion 0010 (raw data) succeeding the variable-length code 0110110111 searched out in step S248 to the data register 233, and the decoded bit string length or fourteen bits corresponding to the addition of the bit string length (ten bits) of the searched-out variable-length code and the bit string length (four bits fixed) of the raw data to the input buffer 229. Also, in the case where in the case where data 011011100111100 in the 2nd row of the code string of FIG. 43 from the leading position to the 15th bit is delivered from the input buffer 229 to the decoder 230, the parameters of the variable-length code 01101110 searched out in step S248 are such that the decompression mode is the dictionary copy mode, the relative position is 1 and the length is 5. Accordingly, the decoder 230 outputs the dictionary copy mode as the mode flag to the mode register 232, the value 5 of length data to the length counter 237, the value 1 of relative position data to the relative position register 234, and the decoded bit string length or seven bits of the bit string length of the searched-out variable-length code 01101110 to the input buffer 229. The reason why the decoded bit string length is outputted to the input buffer 229 is that data having the same bit string length as the bit string length decoded by the decoder 230 is added after an unprocessed bit string of data stored in the input buffer 229.

The flow goes to step S251 through step S250 in the case where the mode flag outputted from the decoder 230 is the run-length mode and goes to step S253 through step S250 in the case where it is the dictionary copy mode. The mode flag outputted from the decoder 230 is held in the mode register 232 until one decompression operation is completed. When one decompression operation is completed, a new mode flag outputted from the decoder 230 is held in the mode register 232 and the next decompression operation is started.

Figure 47:
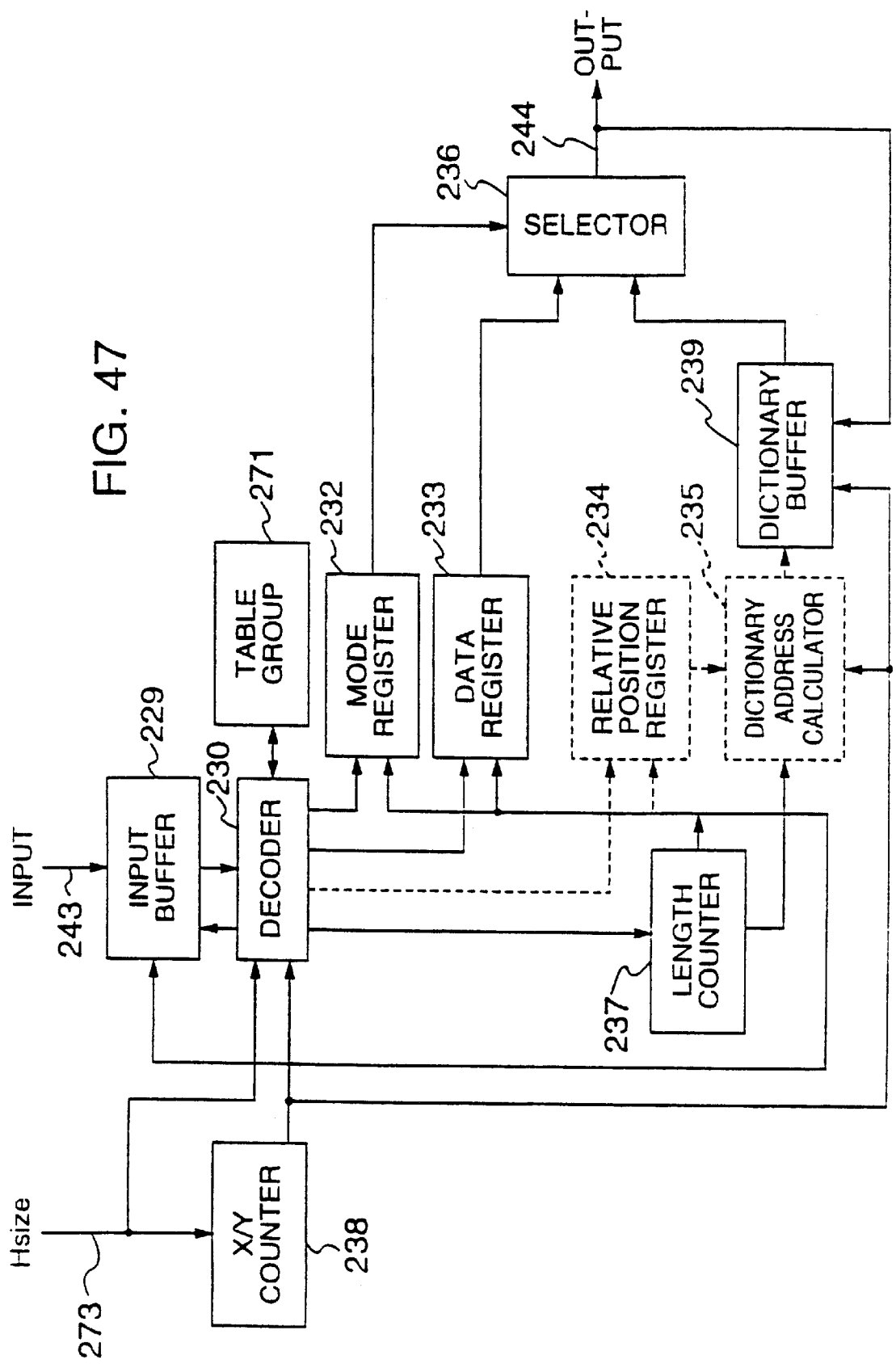
FIG. 47 is a diagram for explaining the operation of the data decompression circuit of FIG. 44 in a run-length mode.

In step S251, a decompression processing in the run-length mode is performed. In the decompression processing in the run-length mode, the relative position register 234 and the dictionary address calculator 235 do not operate, as shown in FIG. 47. First, the data register 233 holds raw data outputted from the decoder 230 while the length counter 237 loads length data outputted from the decoder 230 as an initial value. Next, the raw data held in the data register 233 is outputted through the selector 236 to the output signal line 244 on the basis of the mode flag of run-length held in the mode register 232 (operation 1). Next, in order to produce a dictionary to which the reference is to be made in performing the decompression processing of the next line data, the same data as the outputted data is registered into the dictionary buffer 239 at an address thereof corresponding to X and Y coordinate values specified by the X/Y counter 238 (operation 2), the length counter 237 is decremented (operation 3), and the X coordinate value of the X/Y counter 238 is updated by one (operation 4). In the case of the present embodiment, the range of possible X coordinate values of the X/Y counter 238 is 0 to 15, as mentioned above. Accordingly, in the case where the X coordinate value of the X/Y counter 238 is 15, the updating of the X coordinate value by one results in that the X coordinate value turns to 0 and the Y coordinate value is updated by one. In step S252, the above operations 1 to 4 are repeated until the value of the length counter 237 comes to 0. Thereby, there is generated decompressed data in which the raw data outputted from the decoder 230 continues to the extent of a length corresponding to the length data outputted from the decoder 230.

Figure 48:
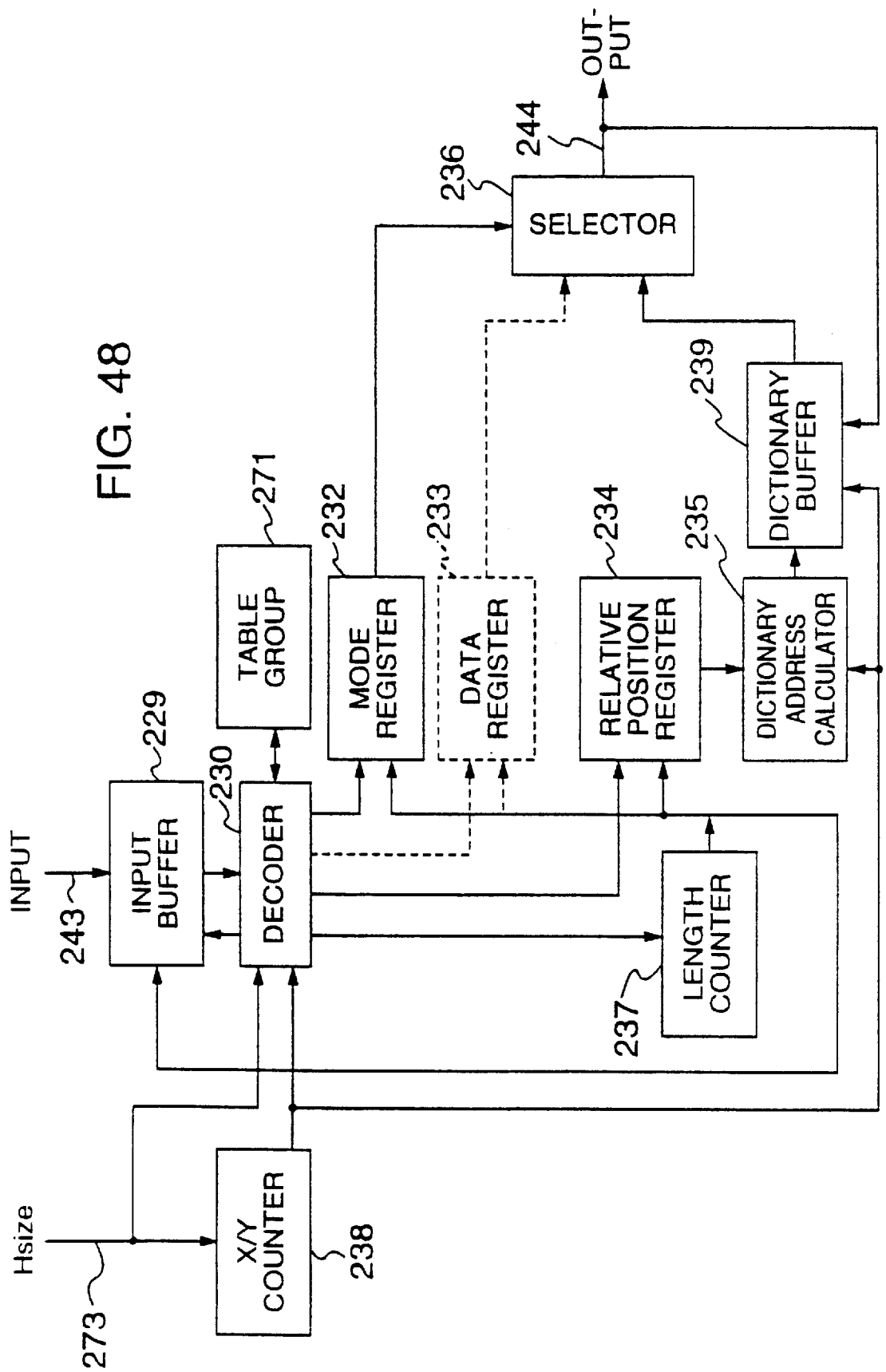
FIG. 48 is a diagram for explaining the operation of the data decompression circuit of FIG. 44 in a dictionary copy mode.

In step S253, a decompression processing in the dictionary copy mode is performed. In the decompression processing in the dictionary copy mode, the data register 233 does not operate, as shown in FIG. 48. First, the relative position register 253 holds relative position data outputted from the decoder 230 while the length counter 237 loads length data outputted from the decoder 230 as an initial value. Next, on the basis of an X coordinate value specified by the X/Y counter 238 and the relative position data held in the relative position register 253, the dictionary address calculator 235 determines the address of that data, to which the reference is to be made (operation 5), among data stored in the dictionary buffer 239. That data among data stored in the dictionary buffer 239, which is at the address specified by the dictionary address calculator 235, is outputted through the selector 236 to the output signal line 244 on the basis of the mode flag of dictionary copy mode held in the mode register 232 (operation 6). Next, in order to produce a dictionary to which the reference is to be made in performing the decompression processing of the next line data, the same data as the outputted data is registered into the dictionary buffer 239 at an address thereof corresponding to X and Y coordinate values specified by the X/Y counter 238 (operation 7), the length counter 237 is decremented (operation 8), and the X coordinate value of the X/Y counter 238 is updated by one (operation 9). In step S254, the above operations 5 to 9 are repeated until the value of the length counter 237 comes to 0. Thereby, there is generated decompressed data in which the data outputted from the dictionary buffer 239 continues to the extent of a length corresponding to the length data outputted from the decoder 230.

In step S255, there is discarded that bit string inclusive of the lead of the bit string stored in the input buffer 229 which has already been decoded by the decoder 230. The flow returns to step S247 in the case where data to be decompressed still exists, and the flow is completed in the case where it does not exist (step S256).

In the above-mentioned embodiment of compression, the dictionary is searched in the dictionary reference range for the longest partial string existing on the dictionary within the range of the maximum detection string length N and the searched-out partial string is encoded. However, there may also be considered the case where the longest partial string existing on the dictionary is divided into a plurality of partial strings, the divisional partial string is composed with another partial string to produce a partial string within the range of the maximum detection string length N, and the produced partial string is in turn compressed, and the case where partial strings, which are not the longest, are combined to produce a partial string within the range of the maximum detection string length N and the produced partial string is compressed.

The former case is as follows. For example, the partial string b shown in FIG. 32B is divided into two parts or a partial string c "5543" and a partial string d "4" shown in FIG. 32C and the partial string d "4" and "3" at the 2nd row and 5th column are composed into a partial string e "43". A code for the partial string c is {0, 1, 4} and a code for the partial string e "43" is {1, −1, 2} since the partial string e matches "43" continuing from the 1st row and 4th column of the immediately preceding line. Accordingly, a code for the 2nd row results in {0, 1, 4} {1, −1, 2} [1, 5, 1] [1, 4, 1] {1, 0, 3} [4, 5, 2] [6, A, 3]. This code will be referred to as code a'. The latter case is as follows. For example, a partial string "55" for the relative position 0 is selected for the 2nd row and 0th column and a partial string "434" for the relative position +1 is selected for the 2nd row and 2nd column. Thereby, a code for the 2nd row results in {0, 0, 2} {1, 1, 3} {1, −1, 1} [1, 5, 1] [1, 4, 1] {1, 0, 3} [4, 5, 2] [6, A, 3]. This code will be referred to as code b'.

Thus, three patterns including the pattern shown in the above-mentioned example of compression may exist as the code for the 2nd row shown in FIG. 32A. The code for the 2nd row shown in FIG. 33 will be referred to as code c'. When the actual codes shown in FIGS. 34 to 42 are allotted to the codes a', b' and c', the codes a' spans 49 bits, the code b' spans 50 bits and the code c' spans 48 bits. The code c' are efficient. However, when codes other than those shown in FIGS. 34 to 42 are allotted to the codes a', b' and c', a different result will be obtained and there may be the case where the code a' or the code b' results in the shortest code. Accordingly, it does not necessarily follow that the best way includes searching for the longest partial string within the range of the maximum detection string length N and encoding the longest partial string. It is desirable to produce and select, within the range of the maximum detection string length N, the combination of partial strings on the dictionary which provides the shortest code when the actual codes are allotted.

Even if the combination of partial strings on the dictionary is changed so that the resulting code becomes the shortest, as mentioned above, no influence is given on the data decompression method so long as the encoding rule (using the value of T determined the position x of a pixel of interest on the current line, and the leading position and the length of the same partial length in the immediately preceding line) is not changed.

As explained in detail in the foregoing, according to the third data compression/decompression method of the present invention, a dictionary is required to store only the immediately preceding line. Therefore, the capacity of the dictionary is very small. Also, the reference to the dictionary is made within a range in which the degree of similarity is high, and the reference is made to a longest possible partial string within the range of the maximum detection string length. Therefore, a high compression ratio can be attained and a processing for compression/decompression can be performed at a high speed. Further, data compression is performed in such a manner that tables in which a different code is allotted in accordance with the relative position of a leading pixel of a partial string on the immediately preceding line and a pixel of interest and the length of the partial string on the immediately preceding line, are prepared for the respective values of T, T being T=0 when x=0, T=1 when $1 \leq x \leq H-N$, and T=x−H+N+1 when $H-N+1 \leq x \leq H-1$ where H is the number of pixels in one line of two-dimensional image data, N is the maximum detection string length ($1 \leq N \leq H$) and x is the position of the pixel of interest on the current line from a leading pixel ($0 \leq x \leq H-1$), the value of T is determined on the basis of the position x of the pixel of interest on the current line from the leading pixel, and a code corresponding to the relative position and the length of the partial string is outputted from a table selected in accordance with the determined value of T. Each table is a table of Huffman codes constructed beforehand in compliance with data to be compressed and decompressed or a table optimized so that the redundancy is reduced with the compression/decompression. Thereby, a higher compression ratio is obtained. Furthermore, compression such as run-length compression is applied to the first line of the image data and a partial string for which the reference to the dictionary is impossible. Thereby, a still higher compression ratio is obtained. In addition, the possible value of T is always $0 \leq T \leq$ maximum detection string length N. Therefore, when the number H of pixels in one line of the two-dimensional image data is increased, it is possible to prevent the table capacity from increasing with the lowering of the compression/decompression speed.

(Fourth Data Compression/Decompression Method of the Invention)

In order to facilitate the understanding of a fourth data compression/decompression method of the present invention, the principle of the fourth data compression/decompression method will be explained using the drawings. In the fourth data compression/decompression method of the present invention, data of the immediately preceding in successively scanned two-dimensional image data (shown in FIG. 49) is held as reference data, using a property that a certain pixel(s) in the image data is similar to a group of pixels in the neighborhood thereof. (A buffer for storing the reference data will hereinafter be referred to as "dictionary" A.) The reference to the dictionary A is made to detect a partial data string B (defined as a partial data string to be compressed) on the current line which matches data on the dictionary A to the longest possible extent. Next, there are outputted a code which differs in accordance with the relative position on a two-dimensional space of a pixel of interest C (as which a leading pixel of the partial data string B to be compressed will be defined) and a leading pixel E of a partial data string D (defined as an immediately preceding partial data string) on the dictionary A which matches the partial data string B to be compressed, and a code which differs in accordance with the length of the immediately preceding partial data string D (five dots in the shown example) for each value of a position $x_1$ and/or a position $x_2$ where $x_1$ is the position of the pixel of interest C from a leading pixel of the current line ($x_1=0$ in the shown example) and $x_2$ is the position of the leading pixel E from a leading pixel of the dictionary A ($x_2=1$ in the shown example). Thereby, the data compression of the partial data string B to be compressed is performed. It is preferable that the code is not a fixed-length code but a variable-length code in order to enhance the compression ratio by allotting a short code to data which has a high probability of occurrence. Regarding the code according to the length of the immediately preceding partial data string, the reason why a different code is allotted in accordance with the length of the immediately preceding partial data string for each value of the position $x_1$ and/or the position $x_2$ is as follows. In principle, if a different code is allotted in accordance with the length of the immediately preceding partial data string, it is not necessary to allot the code for each value of the position $x_1$ and/or the position $x_2$. However, the maximum value which the length of the immediately preceding partial data string can take never exceeds a dot length from the pixel of interest to a pixel positioned at the last of the current line. Namely, the maximum possible value of the length of the immediately preceding partial data string differs depending on the value of $x_1$. Also, the maximum value which the length of the immediately preceding partial data string can take never exceeds a dot length from a pixel on the immediately preceding line corresponding to the pixel of interest to a pixel positioned at the last of the immediately preceding line. Namely, the maximum possible value of the length of the immediately preceding partial data string also differs depending on the value of $x_2$. In the fourth data compression/decompression method of the present invention, therefore, the code representing to the length of the immediately preceding partial data string is prepared for each value of the position $x_1$ and/or the position $x_2$, so that the uselessness of the allotment of codes for values outside of the range of values which the length can take is reduced, thereby improving the redundancy of coding to enhance the compression ratio. In particular, a different code is allotted in accordance with the length of the immediately preceding partial data string for each value of T which is a larger one of the position $x_1$ and the position $x_2$, so that the uselessness of the allotment of codes for values outside of the range of values which the length can take is completely eliminated, thereby further improving the redundancy of coding to enhance the compression ratio.

It is preferable that the range of reference to the dictionary is limited to fall within a range in which the degree of similarity of a partial data string on the current line to a partial data string on the dictionary is high. Also, in the case where a partial data string to be compressed does not a partial data string on the dictionary, compression such as run-length compression is applied to the partial data string to be compressed.

In the fourth data compression/decompression method of the present invention, a dictionary is required to store only the immediately preceding line, as mentioned above. Therefore, the capacity of the dictionary is very small. Also, the reference to the dictionary is made within a range in which the degree of similarity is high, and the reference is made to a longest possible partial data string. Therefore, a high compression ratio can be attained and a processing for compression/decompression can be performed at a high speed. Further, a different code is allotted in accordance with the length of the immediately preceding partial data string for each value of the position $x_1$ and/or the position $x_2$. Therefore, it is possible to improve the redundancy of the code representing the length of the immediately preceding partial data string, thereby enhancing the compression ratio. Furthermore, by applying compression such as run-length compression to the first line of the image data and a partial string for which the reference to the dictionary is impossible, a higher compression ratio is obtained.

Figures 49, 50:
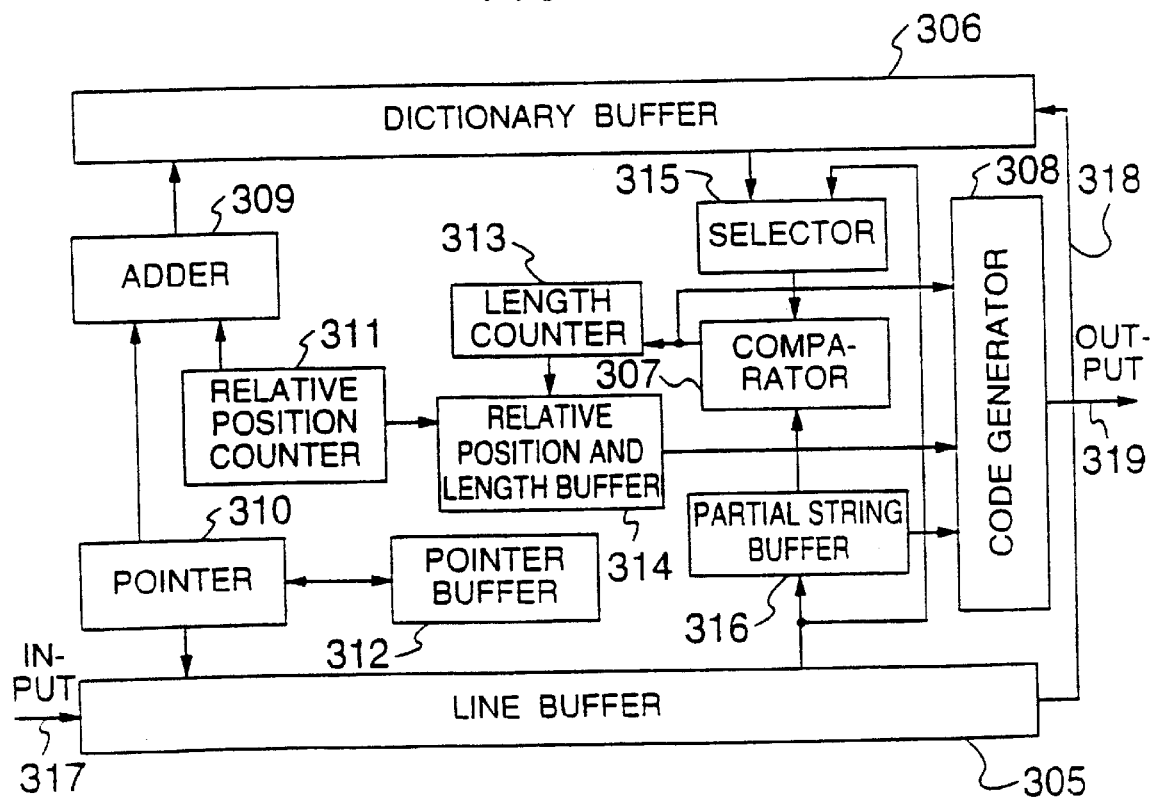
FIG. 49 is an explanatory diagram showing two-dimensional image data for explaining the principle of a fourth data compression and decompression method of the present invention.
FIG. 50 is a block diagram showing a data compression circuit according to an embodiment of a fourth data compression apparatus for realizing the fourth data compression method of the present invention.

An embodiment of the fourth data compression/decompression method of the present invention will now be explained. As shown in FIG. 50, a data compression circuit according to an embodiment of a fourth data compression apparatus for realizing the fourth data compression method of the present invention includes a line buffer 305, a dictionary buffer 306 for holding data of the immediately preceding line, a comparator 307, a code generator 308, an adder 309, a pointer 310, a relative position counter 311, a pointer buffer 312, a length counter 313, a relative position and length buffer 314, a selector 315, and a partial string buffer 316. In FIG. 50, reference numeral 317 denotes a line buffer input signal line, reference numeral 318 a dictionary buffer input signal line, and reference numeral 319 a code output line.

Figure 51:
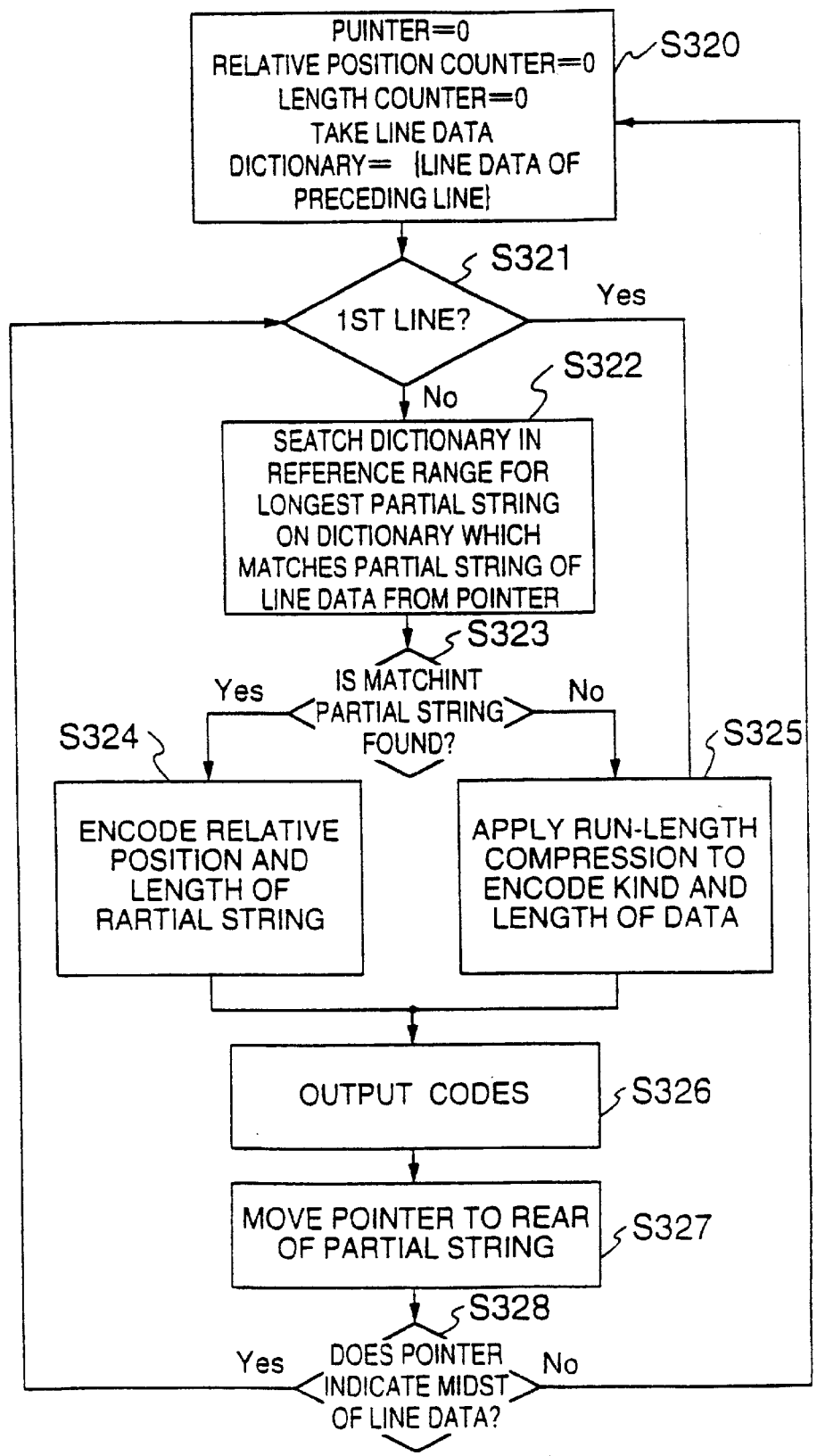
FIG. 51 is a flow chart showing the operation of data compression in the data compression circuit shown in FIG. 50.

Next, the outline of the operation of the data compression circuit having the above construction will be shown on the basis of a flow shown in FIG. 51. First or in step S320, the pointer 310 and so forth are initialized, and successively inputted image data is stored into the line buffer 305 through the line buffer input signal line 317. At this time, data pushed out of the line buffer 305 is stored into the dictionary buffer 306 through the dictionary buffer input signal line 318. Next or in step S321, the judgement is made of whether or not line data inputted to the line buffer 305 is data of the first line. In the case where the line data inputted to the line buffer 305 is data of the first line, run-length compression is performed (step S325) since data to which the reference is to be made is not still stored in the dictionary buffer 306. Namely, a search is made for a partial data string on the current line which continues to the longest possible extent. First, data of the line buffer 305 indicated by the pointer 310 is stored into the partial string buffer 316. Also, the pointer 310 is advanced by one so that the data of the line buffer 305 is inputted to the comparator 307 through the selector 315 for comparison with data of the partial string buffer 316. If the result of comparison indicates the matching, the length counter 313 is incremented and the next data indicated by the pointer 310 is inputted to the comparator 307 through the selector 315 for comparison with data of the partial string buffer 316. The comparison with data of the partial string buffer 316 is repeated with the pointer 310 being advanced one by one until the matching ceases to be obtained. Thereby, the count value of the length counter 313, at the point of time when the result of comparison indicates no matching, is measured as the length L of a partial data string on the current line which includes the same continuous pixels. Next, data of the length L of the partial data string counted by the length counter 313 and raw data stored in the partial string buffer 316 are inputted to the code generator 308. The code generator 308 encodes the data of the length L of the partial data string and the raw data and outputs the resulting code through the code output line 319 (step S326). Thus, all data of the first line are processed.

If line data inputted to the line buffer 305 is data of the second or subsequent line (step S321), a search is made for the longest partial data string on the dictionary which matches a partial data string made the object of search (as which data of continuous pixels selected from data of the current line stored in the line buffer 305 will be defined) to the longest possible extent (step S322). The search for the longest partial data string shown as one flow step S322 in FIG. 51 is made in accordance with the following procedure. The concept of the search for the longest partial data string will be explained using 8×8 image data shown in FIGS. 52A to 52C by way of example. In the present embodiment, the judgement of whether or not a line preceding by one line to the partial data string made the object of search includes the same partial data string as the partial data string made the object of search, is made by performing a search as to whether or not the same pixel as a leading pixel of the partial data string made the object of search exists between a position returned by one from the leading pixel position of the partial data string made the object of search (defined as relative position −1) and a position advanced by one therefrom (defined as relative position +1). Namely, the compression in step S324 is performed in the case where the same pixel string exists in the immediately preceding line within a range shifted by one pixel to the right and left.

Speaking in conjunction with FIG. 52A, (1) an example of relative position −1 is a partial data string "554" continuing from "5" at the 3rd row and 1st column. Since this partial data string "554" is the same as a partial data string "554" continuing from "5" at the 2nd row and 0th column, it is determined that the same partial data string exists at a position shifted by one pixel to the left. (2) An example of relative position 0 is a partial data string "34" continuing from "3" at the 1st row and 4th column. Since this partial data string "34" is the same as a partial data string "34" continuing from "3" at the 0th row and 4th column, it is determined that the same partial data string exists at a position shifted by zero pixel. (3) An example of relative position +1 is a partial data string "55434" continuing from "5" at the 2nd row and 0th column. Since this partial data string "55434" is the same as a partial data string "55434" continuing from "5" at the 1st row and 1st column, it is determined that the same partial data string exists at a position shifted by one pixel to the right.

In step S322, data of the pointer 310 is first stored into the pointer buffer 312 and the relative position counter 311 is initialized. Next, data of one pixel is taken into the partial string buffer 316 from the line buffer 305 indicated by the pointer 310. Regarding the data of the one pixel in the current line taken in the partial string buffer 316 from the line buffer 305, a search is made as to whether or not a matching pixel exists for each of a pixel at the relative position −1, a pixel at the relative position 0 and a pixel at the relative position +1 in the immediately preceding line stored in the dictionary buffer 306. In the case where there is no matching pixel, the length "0" is written into the relative position and length buffer 314 for each relative position and the flow proceeds to step S323. In FIG. 52A, regarding "4" at the 1st row and 3rd column, the pixels at the 0th row and 2nd column and the 0th row and 3rd column are both "2" and the pixel at the 0th row and 4th column is "3". Accordingly, "0" is written as length data for a point (1, 3) into the relative position and length buffer 314 for all the relative positions −1, 0 and +1. In the case where there is a matching pixel, the pointer 310 and the length counter 315 are incremented and data of the next pixel is taken into the partial string buffer 316. At this time, the leading address of the partial data string made the object of search under searching in the present search is remained in the pointer buffer 312.

In the case where the matching for the leading pixel of the partial data string made the object of search is found at the relative position −1, a search regarding the next pixel is made in such a manner that data of a pixel at the relative position −1 in the data of the immediately preceding line is compared with the pixel taken in the partial string buffer 316. Also, in the case where the matching is found at the relative position 0, a search regarding the next pixel is made in such a manner that data of a pixel at the relative position 0 in the data of the immediately preceding line is compared with the pixel taken in the partial string buffer 316. Further, in the case where the matching is found at the relative position +1, a search regarding the next pixel is made in such a manner that data of a pixel at the relative position +1 in the data of the immediately preceding line is compared with the pixel taken in the partial string buffer 316. In the case where the result of each comparison indicates the matching, the next pixel pointer 310 is incremented to take data of the next pixel into the partial string buffer 316 and the length counter 315 is incremented. This operation is repeated until the result of each comparison indicates no matching. Thereby, the count value of the length counter 315, at a point of time when the result of comparison indicates no matching, is measured as the length L of a partial data string which has the same data string as data of the immediately preceding line. This length information L is counted for each of the relative position −1, the relative position 0 and the relative position +1. Namely, after the length L has been counted for the relative position −1 in a manner mentioned above, the length L is stored as length information of the relative position −1 into the relative position and length buffer 314 at the column of the relative position −1. Subsequently, in order to make a search regarding the relative position 0, the leading address of the partial data string made the object of search temporarily stored in the pointer buffer 312 is returned into the pixel pointer 310 and the relative position counter 311 is incremented. With the pixel counter 310 being incremented, the comparison is similarly made for the next data of on the right side of the leading address of the partial data string made the object of search until the data matching relevant to the relative position 0 ceases to be obtained. Thereby, the length information L is determined. Subsequently, a similar search is made regarding the relative position +1.

Considering a partial data string which has "5" at the 2nd row and 0th column in FIG. 52A as its leading pixel, this pixel is at the lead of the current line and hence no data exist at the relative position −1 of the preceding line. Therefore, the length L for the relative position −1 is 0. Regarding to the relative position 0, "5" exists at the 1st row and 0th column. Therefore, the length counter 313 is incremented and data "5" of the 2nd row and 1st column next to "5" of the 2nd row and 0th column is taken into the partial string buffer 316 for comparison with "5" of the 1st row and 1st column. Since this comparison too indicates the matching, the length counter 313 is incremented and data "4" of the 2nd row and 2nd column next to "5" of the 2nd row and 1st column is taken into the partial string buffer 316 for comparison with "5" of the 1st row and 2nd column. Since this comparison indicates no matching, the number "2" of matching data until this point of time provides L=2 as the length L of the partial string with "5" at the 2nd row and 0th column as its leading pixel for the relative position 0.

Regarding the partial data string having "5" at the 2nd row and 0th column as its leading pixel, "5" exists at the 1st row and 1st column and this data matches the leading pixel. Therefore, the comparison for the next pixel is also made for the relative position +1. Namely, data "5" of the 2nd row and 1st column next to "5" of the 2nd row and 0th column is taken into the partial string buffer 316 and is then compared with "5" of the 1st row and 2nd column which is at the relative position +1. Since this comparison indicates the matching, the comparison is repeated while successively taking in the next pixel on the right side. When the comparison of "3" at the 2nd row and 5th column and "1" at the 1st row and 6th column is made, no matching is found. Accordingly, the value "5" of the length counter 313 at this time provides L=5 as the length L of the partial string with "5" at the 2nd row and 0th column as its leading pixel for the relative position +1.

With the above, three lengths including L (relative position −1)=0, L (relative position 0)=2 and L (relative position +1)=5 are stored in the relative position and length buffer 314 as the length L of the partial data string having "5" at the 2nd row and 0th column as its leading pixel. From thereamong is selected a partial data string which has the greatest length L equal to 5. In the case of FIG. 52A, a partial data string a (55) corresponds to the same partial data string for the relative position 0 and a partial data string b (55434) corresponds to the same partial data string for the relative position +1, as shown in FIG. 52B. Since the length of the partial data string a is 2 and the length of the partial data string b is 5, the partial data string b providing a high efficiency of compression is selected.

Namely, the flow goes through step S323 to step S324 in which the longest data among data stored in the relative position and length buffer 314 and data of the relative position for the longest data are inputted to the code generator 308. The code generator 308 encodes the data of the relative position and the data of the length L of the partial data string to output the code through the code output line 319 (step S326).

On the other hand, if the lengths stored in the relative position and length buffer 314 are all 0, that is, if no matching partial data string is found in the dictionary, the flow goes through step S323 to step S325 in which the above-mentioned run-length compression is performed.

The above operation is repeated through steps S327 and S328 up to the last line of the two-dimensional image data to perform the data compression or the encoding.

Next, explanation will be made of the data compression process of the 8×8 image data shown in FIGS. 52A to 52C. It is assumed that each data is represented by 4 bits. For convenience' sake, the coordinate of image data will be represented by (column, row) and the encoded code will be represented by {relative position, length} or [kind of data, length]. Namely, a portion enclosed by the brace { } shows a portion subjected to compression based on the fourth data compression method of the present invention and a portion enclosed by the bracket [ ] shows a portion subjected to compression based on the run-length compression method.

For example, a code corresponding to the relative position equal to 1 and the length equal to 3 results in {1, 3} and a code corresponding to the kind of data equal to 5 and the length equal to 2 results in [5, 2]. Provided that the coordinate of data of interest is (x, y), the range of reference to the dictionary is (x−1, y−1), (x, y−1) and (x+1, y−1) in terms of relative position. In the case of FIG. 52A, the 0th row is subjected to run-length compression since there is no dictionary to which the reference is to be made. Data at the coordinates (0, 0) to (3, 0) of the image data are all the same and 2, and hence the resulting code is [2, 4]. Data at (4, 0) is 3 and only one of this data exists. Therefore, the resulting code is [3, 1]. Data at (5, 0) to (7, 0) are all the same and 4, and hence the resulting code is [4, 3]. Accordingly, the resulting codes for the 0th row are [2, 4] [3, 1] [4, 3], as shown by the 0th row in FIG. 53.

A processing for the 1st row shown in FIG. 52A is performed handling the 0th row as a dictionary. Data at (0, 1) is compared with data at (0, 0) but this comparison indicates no matching. The data at (0, 1) is thereafter compared with data at (1, 0) but this comparison too indicates no matching. Therefore, on the determination that the dictionary includes no matching partial data string, the run-length compression is applied. Data at (0, 1) to (2, 1) are all 5, and hence the resulting code is [5, 3]. Data at (3, 1) is 4 and does not match data at (2, 0), (3, 0) and (4, 0). The run-length compression is applied and the resulting code is [4, 1]. Data at (4, 1) is 3 and matches data at (4, 0) among (3, 0), (4, 0) and (5, 0), and data at (4, 1) to (5, 1) match data of the dictionary at (4, 0) to (5, 0). The resulting code is {0, 2}. Data at (6, 1) and data at (7, 1) do not match data of the dictionary. The resulting codes are [1, 1] and [3, 1], respectively. Accordingly, the resulting codes for the 1st row are [5, 3] [4, 1] {0, 2} [1, 1] [3, 1], as shown by the 1st row in FIG. 53.

A processing for the 2nd row shown in FIG. 52A is performed handling the 1st row as a dictionary. Data at (0, 2) matches data of the dictionary at (0, 1) which is the relative position 0 and also matches data of the dictionary at (1, 1) which is the relative position 1. The length of a matching partial data string of the dictionary in the case of the relative position 0 is (0, 1) to (1, 1) or 2 whereas the length of a matching partial data string of the dictionary in the case of the relative position 1 is (1, 1) to (5, 1) or 5. Namely, the length of the partial string of the dictionary for the relative position 1 is greater than that for the relative position 0. The resulting code is {1, 5}. The above processing is repeated up to the last line. As a result, a code string shown in FIG. 53 is obtained for the image data shown in FIGS. 52A to 52C.

Next, actual codes are allotted to the code string of FIG. 53 by use of codes shown in FIG. 54 and FIGS. 55A and 55B. A code 361 in the case of the run-length compression is composed of identifier plus kind of data plus length, as shown in FIG. 55A. The identifier is represented by one bit fixed and is allotted with 0 in the case of the run-length compression. Regarding the first line, however, only the run-length compression is involved and hence the identifier is omitted. The kind of data means raw data. In the present embodiment, one pixel is represented by four bits fixed. With the length being represented by a variable-length code, a code 361a shown in FIG. 55A is allotted in the accordance with the length. For example, [2, 4] at the 0th row of the code string shown in FIG. 53 results in 000101110.

A code 362 in the case of the dictionary compression is composed of identifier plus relative position plus length, as shown in FIG. 55B. In the case of the dictionary compression, the identifier is allotted with 1. With the relative position being represented by a variable-length code, a code 362a shown in FIG. 55B is allotted in the accordance with the relative position. With the length too being represented by a variable-length code, a code shown in FIG. 54 is allotted, in the accordance with the length of a partial data string to be compressed (that is, the length of the partial data string on the immediately preceding line), for each value of T which is a larger one of $x_1$ and $x_2$ (T=MAX($x_1, x_2$)) where $x_1$ is the position of a pixel of interest from a leading pixel of the current line ($0 \leq x_1 \leq 7$ in the present embodiment) and $x_2$ is the position of a leading pixel of a partial data string on the immediately preceding line from a leading pixel of the immediately preceding line ($0 \leq x_2 \leq 7$ in the present embodiment). For example, {0, 2} in the 5th row of the code string shown in FIG. 53 is such that $x_1$ is 0 and $x_2$ is 0 since the relative position is 0. Accordingly, $T=x_1=x_2=0$. In the case of T=0, a code corresponding to the length equal to 2 is 10, as shown in FIG. 54. Therefore, {0, 2} in the 5th row of the code string shown in FIG. 53 results in 1010. Also, {−1, 6} in the 5th row of the code string shown in FIG. 53 is such that $x_1$ is 2 and $x_2$ is 1 since the relative position is −1. Accordingly, $T=x_1=2$. In the case of T=2, a code corresponding to the length equal to 6 is 1111, as shown in FIG. 54. Therefore, {1, 6} in the 5th row of the code string shown in FIG. 53 results in 1111111.

The reason why a code corresponding to the length is prepared for each value of T in the case of the dictionary compression is as follows. In principle, if a different code is allotted in accordance with the length, it is not necessary to allot the code for each value of T. However, the maximum value, which the length of a partial data string to be compressed or the length of a partial data string on the immediately preceding line string can take, never becomes larger than a dot length from a pixel of interest to a pixel positioned at the last of the current line and never becomes larger than a dot length from a pixel on the immediately preceding line corresponding to the pixel of interest to a pixel positioned at the last of the immediately preceding line. Accordingly, the maximum possible value of the length of the partial data string to be compressed or the length of the partial data string on the immediately preceding line string is the value of a smaller one of the dot length from the pixel of interest to the pixel positioned at the last of the current line and the dot length from the pixel on the immediately preceding line corresponding to the pixel of interest to the pixel positioned at the last of the immediately preceding line. In the present embodiment, therefore, a larger one of the position $x_1$ and the position $x_2$ is taken as T and and a different code is allotted in accordance with the length of the partial data string for each value of T, so that the uselessness of the allotment of codes for values outside of the range of values which the length can take is completely eliminated, thereby improving the redundancy of coding to enhance the compression ratio. In FIG. 54, a hyphen "-" shows that no variable-length code is allotted. The reason why no variable-length code is allotted when T=7, is that the length is always 1 in the case of T=7.

Figures 56, 57:
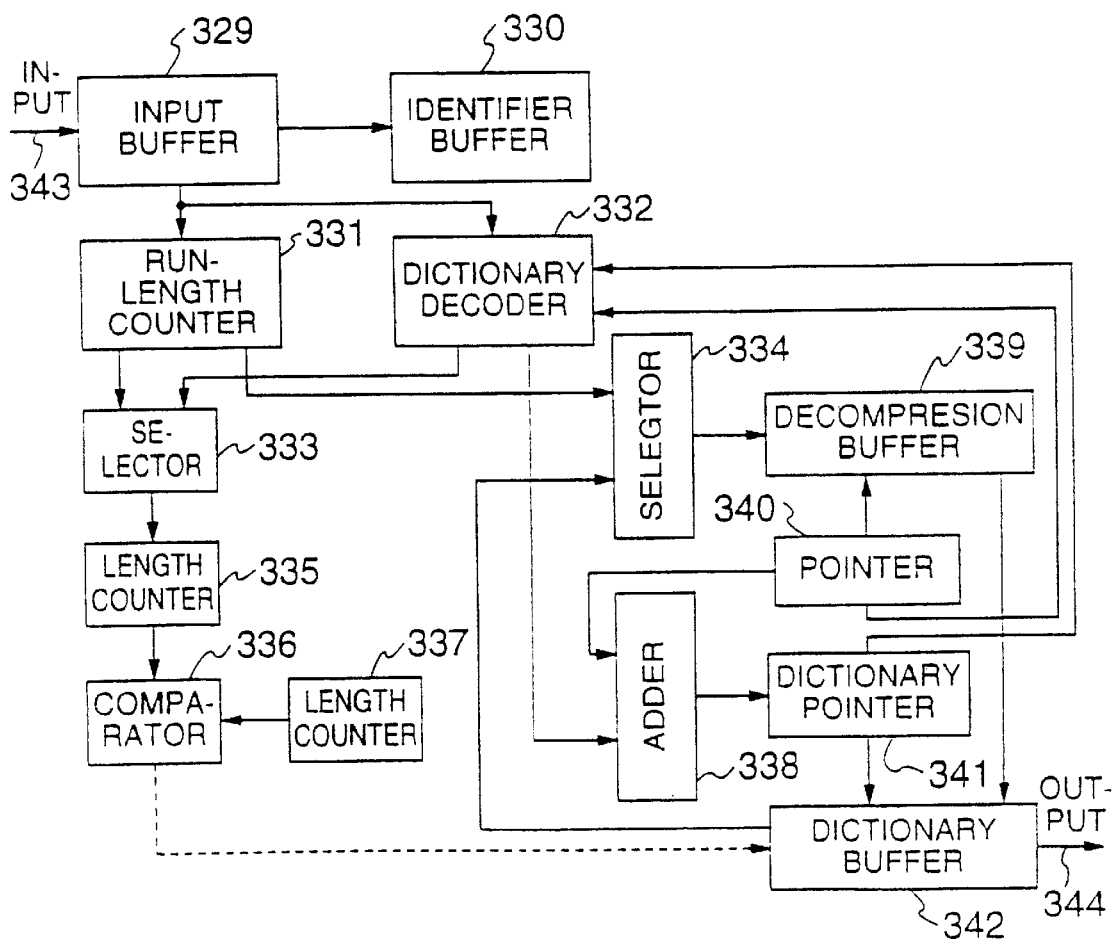
FIG. 56 is an explanatory diagram showing image data after data compression in which the actual codes are allotted.
FIG. 57 is a block diagram showing a data decompression circuit according to an embodiment of a fourth data decompression apparatus for realizing the fourth data decompression method of the present invention.

The result of transformation of the code string of FIG. 53 into the actual codes is shown in FIG. 56. The capacity of the image data shown in FIGS. 52A to 52C is 256 bits whereas the data capacity of the code string shown in FIG. 56 is 163 bits. The use of the algorithm of the fourth data compression method according to the present invention results in the compression of the original image data to about 64%.

Figure 58:
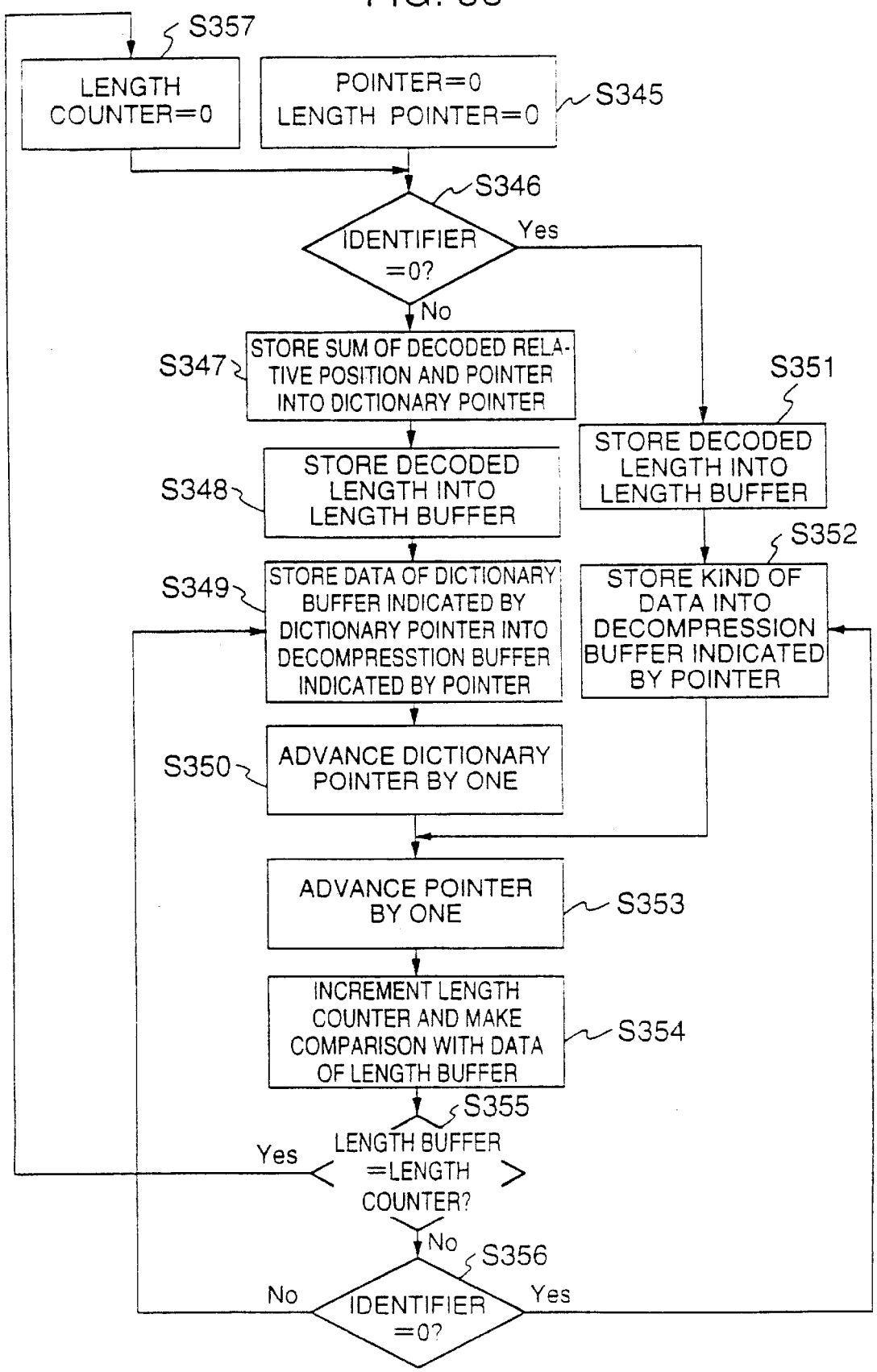
FIG. 58 is a flow chart showing the operation of data decompression in the data decompression circuit shown in FIG. 57.

A procedure for decompressing or expanding the code compressed in accordance with the above manner will be shown using FIGS. 57 and 58. FIG. 57 is a block diagram showing an example of the construction of a decompression circuit. FIG. 58 is a flow chart of a data decompression algorithm. In FIG. 57, reference numeral 329 denotes an input buffer, numeral 330 an identifier buffer, numeral 331 a run-length decoder, numeral 332 a dictionary decoder, numerals 333 and 334 selectors, numeral 335 a length buffer, numeral 336 a comparator, numeral 337 a length counter, numeral 338 an adder, numeral 339 a decompression buffer, numeral 340 a pointer, numeral 341 a dictionary pointer, numeral 342 a dictionary buffer, numeral 343 an input signal line, and numeral 344 an output signal line.

Next, the outline of the operation of the decompression circuit having the above construction will be shown on the basis of a flow shown in FIG. 58. First, the compressed data is taken into the input buffer 329 through the input signal line 343. One bit at the beginning is stored into the identifier buffer. In step S345, the pointer 340 and the length counter 337 are initialized to 0. Then, the flow goes to step S346. If the content of the identifier buffer 330 is 1, the succeeding data is data subjected to dictionary compression. Therefore, the data is passed through the dictionary decoder 332 to decode relative position information and length information. First, the relative position information is extracted from a bit string length including the 2nd and subsequent bits succeeding the beginning 1st bit. The decoded relative position information (−1, 0 or 1) and the content of the pointer 340 (0 in the instant case) are inputted to the adder 338 to determine the position $x_2$ of a leading pixel of a partial data string on the dictionary and this position $x_2$ is stored into the dictionary pointer 341 (step S347). Next, the value of T (T=MAX($x_1, x_2$)) is determined on the basis of the position $x_1$ of a pixel of interest on the current line indicated by the pointer 340 and the position $x_2$ of the leading pixel of the partial data string on the dictionary determined by the adder 338. The length information is extracted from a bit string length succeeding the bit string length representing the relative position on the basis of the determined value of T and the length buffer (step S348).

In step S349, data of the dictionary buffer 342 indicated by the dictionary pointer 341 is stored into the decompression buffer 339 indicated by the pointer 340. Next, each of the dictionary pointer 341 and the pointer 340 is advanced by one (steps S350 and S353). The length counter 337 is incremented and the content of the length counter 337 and the content of the length buffer 335 are compared through the comparator 336 (step S354). If the content of the length buffer 335 and the content of the length counter 337 do not match (step S355), the flow goes to step S349 through step S356 so that steps S349, S350, S353 and S354 are successively repeated until the matching is obtained. In the case where the matching is obtained, the length counter 337 is initialized to 0 (step S357) and the flow thereafter goes to step S346 for decompression of a new code.

In the case where it is determined in step S346 that the identifier is 0, the succeeding data is data subjected to run-length compression. Therefore, the data is passed through the run-length decoder 331 to decode raw data and length information. First, the raw data is extracted from a bit string length including the 2nd to 5th bits succeeding the beginning 1st bit. Next, the length information is extracted from a bit string length including the 6th and subsequent bits. The decoded length information is stored into the length buffer 335 (step S351) and the raw data is stored into the decompression buffer 339 indicated by the pointer 340 (step S352). Next, the pointer 340 is advanced by one (step S353). The length counter 337 is incremented and the content of the length counter 337 and the content of the length buffer 335 are compared through the comparator 336 (step 354). If the content of the length buffer 335 and the content of the length counter 337 do not match (step S355), the flow goes to step S352 through step S356 so that steps S352, S353 and S354 are successively repeated until the matching is obtained. In the case where the matching is obtained, the length counter 337 is initialized to 0 (step S357) and the flow thereafter goes to step S346 for decompression of a new code. In the case where the inputted data is the compressed data of the first line, the identifier is omitted but the data includes only data subjected to run-length compression. In this case, the flow goes to step S351 without making the judgement of the identifier in step S346.

The above processing is repeated up to the last code. If data stored in the decompression buffer 339 reaches data corresponding to one line of the image data, the contents of the decompression buffer 339 are all copied into the dictionary buffer 342 and the content of the dictionary buffer 342 or the restored data is outputted through the output signal line 344. Thereby, the decompression operation for image data corresponding to one line is completed. When the decompression for the next line is to be made, the flow goes to step S354 again.

In the above-mentioned example of compression, the dictionary is searched in the dictionary reference range for the longest partial data string existing on the dictionary and the searched-out partial data string is encoded. However, there may also be considered the case where the longest partial data string is divided into a plurality of partial data strings and the divisional partial data string is compressed after composition thereof with another partial data string, and the case where partial data strings, which are not the longest, are combined and compressed.

The former case is as follows. For example, the partial data string b shown in FIG. 52B is divided into two parts or a partial data string c "5543" and a partial string data d "4" shown in FIG. 52C and the partial data string d "4" and "3" at the 2nd row and 5th column are composed into a partial data string e "43". A code for the partial data string c is {1, 4} and a code for the partial data string e "43" is {−1, 2} since the partial data string e matches "43" continuing from the 1st row and 4th column of the immediately preceding line. Accordingly, a code for the 2nd row results in {1, 4} {−1, 2} [5, 1] [4, 1]. This code will be referred to as code a'. The latter case is as follows. For example, a partial data string "55" for the relative position 0 is selected for the 2nd row and 0th column and a partial data string "434" for the relative position +1 is selected for the 2nd row and 2nd column. Thereby, a code for the 2nd row results in {0, 2} {1, 3} {−1, 1} [5, 1] [4, 1]. This code will be referred to as code b'.

Thus, three patterns including the pattern shown in the above-mentioned example of compression may exist as the code for the 2nd row shown in FIG. 52A. The code for the 2nd row shown in FIG. 53 will be referred to as code c'. When the actual codes shown in FIG. 54 and FIGS. 55A and 55B are allotted to the codes a', b' and c', the code a' spans 25 bits, the code b' spans 26 bit and the code c' spans 24 bits. The code c' is efficient. However, when codes other than those shown in FIG. 54 and FIGS. 55A and 55B are allotted to the codes a', b' and c', a different result will be obtained and there may be the case where the code a' or b' results in the shortest code. Accordingly, it does not necessarily follow that the best way includes searching for the longest partial data string on the dictionary and encoding the longest partial data string. It is desirable to select the combination of partial data strings on the dictionary which provides the shortest code when the actual codes are allotted.

Even if the combination of partial data strings on the dictionary is changed so that the resulting code becomes the shortest, as mentioned above, no influence is given on the data decompression method so long as the encoding rule (using the leading position and the length of the same partial data length in the immediately preceding line) is not changed.

As explained in detail in the foregoing, according to the fourth data compression/decompression method of the present invention, a dictionary is required to store only the immediately preceding line. Therefore, the capacity of the dictionary is very small. Also, the reference to the dictionary is made within a range in which the degree of similarity is high, and the reference is made to a longest possible partial data string. Therefore, a high compression ratio can be attained and a processing for compression/decompression can be performed at a high speed. Further, a different code is allotted in accordance with the length of an immediately preceding partial data string for each value of the position $x_1$ and/or the position x2. Therefore, the redundancy of the code representing the length of the immediately preceding partial data string can be improved, thereby enhancing the compression ratio. Furthermore, compression such as run-length compression is applied to the first line of the image data and a partial data string for which the reference to the dictionary is impossible. Thereby, a higher compression ratio is obtained.

(Fifth Data Compression/Decompression Method of the Invention)

Figure 59:
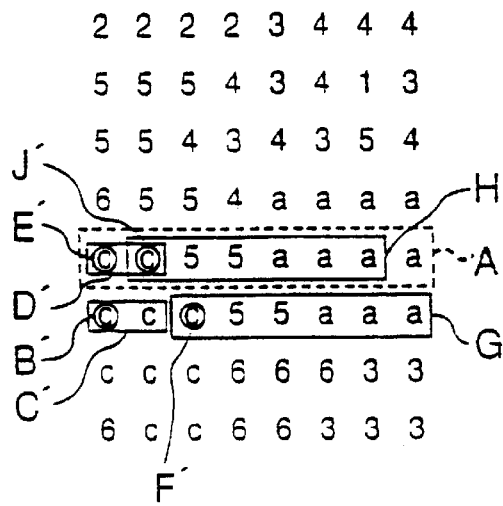
FIG. 59 is an explanatory diagram showing two-dimensional image data for explaining the principle of a fifth data compression and decompression method of the present invention.

In order to facilitate the understanding of a fifth data compression/decompression method of the present invention, the principle of the fifth data compression/decompression method will be explained using the drawings. In the fifth data compression/decompression method of the present invention, data of the immediately preceding in successively scanned two-dimensional image data (shown in FIG. 59) is held as reference data, using a property that a certain pixel(s) in the image data is similar to a group of pixels in the neighborhood thereof. (A buffer for storing the reference data will hereinafter be referred to as "dictionary" A'.) The reference to the dictionary A' is made to detect from the current line a partial data string C' to be compressed which is a partial data string having a pixel of interest B' as its leading pixel and a length equal to one or more pixels and matches data of the dictionary A' to the longest extent. Next, there are outputted a code which differs in accordance with the relative position on a two-dimensional space of the pixel of interest B' and a leading pixel E' of an immediately preceding partial data string D' on the dictionary A' corresponding to the partial data string C' to be compressed, and a code which differs in accordance with the length of the immediately preceding partial data string D' (two dots in the shown example). Thereby, the data compression of the partial data string C' to be compressed is performed. Also, in the case where the above data compression is performed continuously two or more times, that is, in the case where a partial data string G' to be compressed is detected which has, as a pixel of interest, data F' succeeding the the partial data string C' to be compressed, a code corresponding to a relative position to be outputted as the compressed data of the partial data string G' to be compressed is allotted with a code which differs, in accordance with the relative position on the two-dimensional space of the pixel of interest F' and a leading pixel J' of an immediately preceding partial data string H' on the dictionary A' corresponding to the partial data string G' to be compressed, for each value of T' which is the previously outputted relative position of the compressed data of the partial data string C' to be compressed. (In the shown example, T'=0 since the pixel of interest B' and the leading pixel E' of the immediately preceding partial data string D' takes the same pixel position.) It is preferable that the code is not a fixed-length code but a variable-length code in order to enhance the compression ratio by allotting a short code to data which has a high probability of occurrence. In the fifth data compression/decompression method of the present invention, there is detected from the current line a partial data string to be compressed which is a partial data string having a pixel of interest as its leading pixel and a length equal to one or more pixels and matches data of the dictionary to the longest extent. Therefore, in the case where the above-mentioned data compression continues on the same line two or more times, a relative position in the second or subsequent data compression never matches a relative position in the data compression performed immediately before. For example, in the case where the relative position of the immediately preceding partial data string to be compressed takes the same pixel position (T'=0), the relative position of the present partial data string to be compressed never takes the same pixel position. Accordingly, in the case where the above-mentioned data compression continues on the same line two or more times, it is not required that in the second or subsequent data compression, a code should be allotted to the same relative position as a relative position in the data compression performed immediately before. In the fifth data compression/decompression method of the present invention, therefore, in the case where the above-mentioned data compression continues on the same line two or more times, a code representing a relative position in data compression to be presently performed is prepared for each value of T' in the second or subsequent data compression where T' is a relative position in the data compression performed immediately before. Therefore, the uselessness of the allotment of the code to the relative position upon data compression performed immediately before is eliminated, thereby improving the redundancy of coding to enhance the compression ratio.

In the case where a pixel of interest is positioned at the lead of the current line, a leading pixel of an immediately preceding partial data string is never positioned on the left side of the pixel of interest. In the above-mentioned data compression, therefore, in the case where the pixel of interest is positioned at the lead of the current line, it is not necessary to allot a code to a relative position at which the leading pixel of the immediately preceding partial data string is placed on the left side of the pixel of interest. Also, in the case where a pixel of interest is positioned at the last of the current line, a leading pixel of an immediately preceding partial data string is never positioned on the right side of the pixel of interest. In the above-mentioned data compression, therefore, in the case where the pixel of interest is positioned at the last of the current line, it is not necessary to allot a code to a relative position at which the leading pixel of the immediately preceding partial data string is placed on the right side of the pixel of interest. In the fifth data compression/decompression method of the present invention, therefore, it is preferable that a code representing a relative position is prepared for each value of S' which is S'=0 when x'=0, S'=1 when $1 \leq x' \leq H'-2$, and S'=2 when x'=H'-1 where H' is the number of pixels in one line of two-dimensional image data and x' is the position of a pixel of interest from a leading pixel of the current line ($0 \leq x' \leq H'-1$), and the code is prepared for each value of T' and S' in the case where the above-mentioned data compression continues on the same line two or more times. Thereby, the uselessness of the allotment of a code to an impossible relative position in the case where the pixel of interest is positioned at the lead or the last of the current line, is eliminated so that the redundancy of coding is further improved to enhance the compression ratio.

It is preferable that the range of reference to the dictionary is limited to fall within a range in which the degree of similarity of a partial data string with a pixel of interest as its leading pixel to a partial data string on the dictionary is high. Also, in the case where a partial data string having a pixel of interest as its leading pixel does not match a partial data string on the dictionary, run-length compression or the like is applied.

In the fifth data compression/decompression method of the present invention, a dictionary is required to store only the immediately preceding line, as mentioned above. Therefore, the capacity of the dictionary is very small. Also, the reference to the dictionary is made within a range in which the degree of similarity is high, and the reference is made to a longest possible partial data string. Therefore, a high compression ratio can be attained and a processing for compression/decompression can be performed at a high speed. Further, in the case where the detection of a partial data string to be compressed continues on the same line two or more times, a code corresponding to a relative position to be outputted as the compressed data of the partial data string to be compressed which is subjected to the second or subsequent detection is allotted with a code which differs in accordance with a relative position for each value of T'. Therefore, it is possible to improve the redundancy of the code representing the relative position, thereby enhancing the compression ratio. Furthermore, by applying compression such as run-length compression to the first line of the image data and a partial string for which the reference to the dictionary is impossible, a higher compression ratio is obtained.

Figure 60:
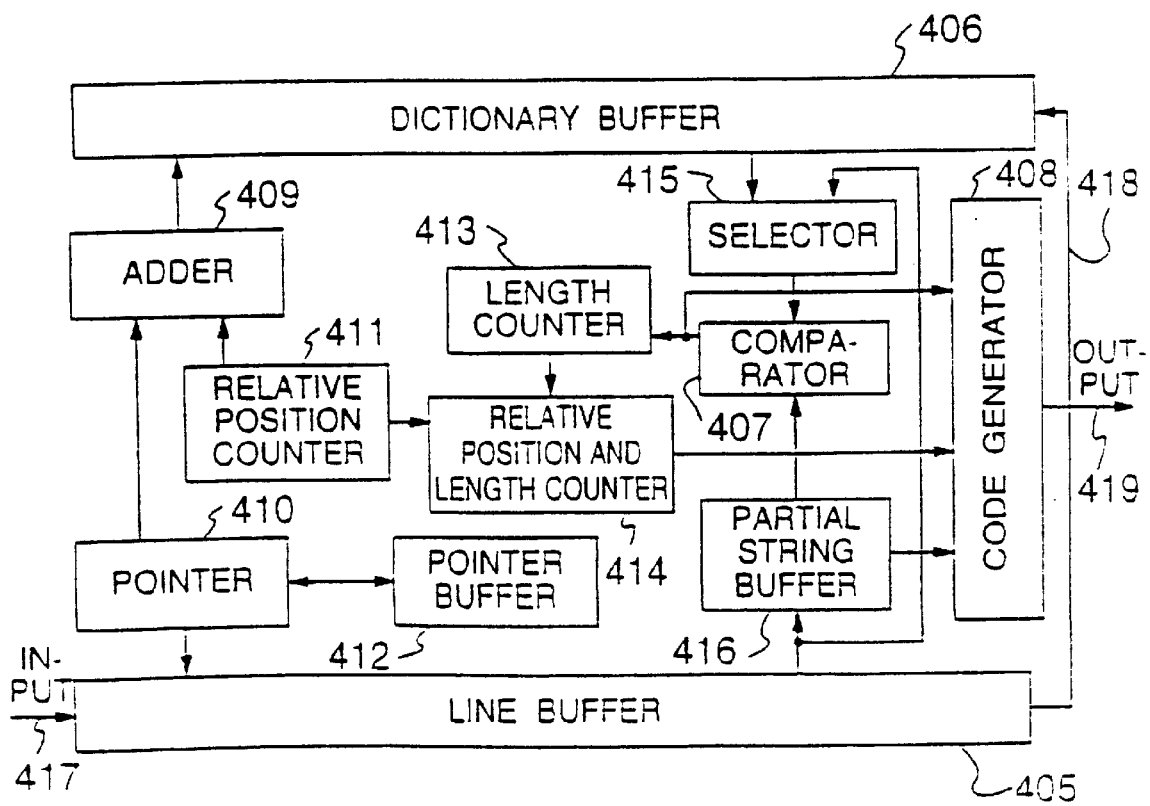
FIG. 60 is a block diagram showing a data compression circuit according to an embodiment of a fifth data compression apparatus for realizing the fifth data compression method of the present invention.

An embodiment of the fifth data compression/decompression method of the present invention will now be explained. As shown in FIG. 60, a data compression circuit according to an embodiment of a fifth data compression apparatus for realizing the fifth data compression method of the present invention includes a line buffer 405, a dictionary buffer 406 for holding data of the immediately preceding line, a comparator 407, a code generator 408, an adder 409, a pointer 410, a relative position counter 411, a pointer buffer 412, a length counter 413, a relative position and length buffer 414, a selector 415, and a partial string buffer 416. In FIG. 60, reference numeral 417 denotes a line buffer input signal line, reference numeral 418 a dictionary buffer input signal line, and reference numeral 419 a code output line.

Figure 61:
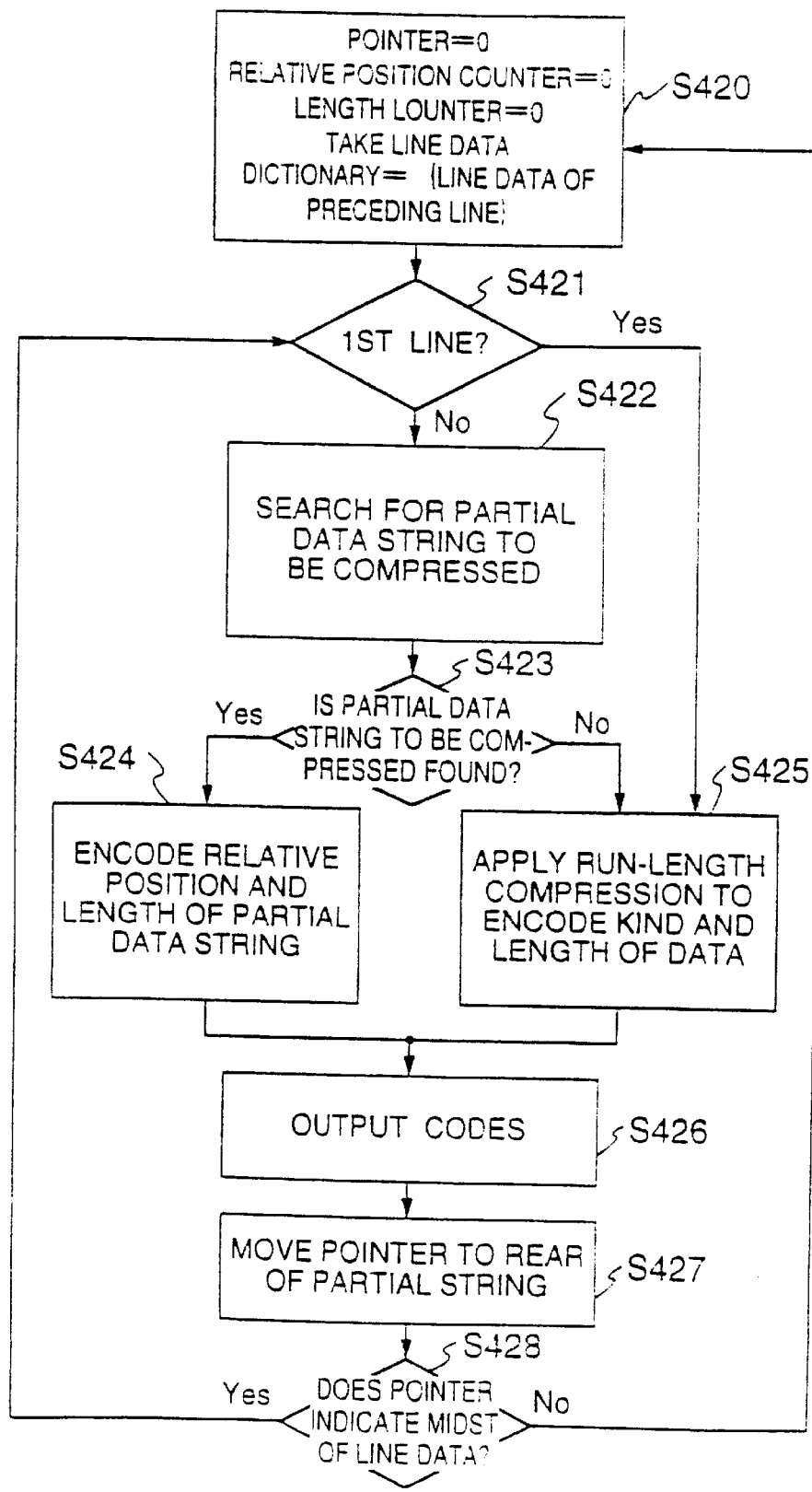
FIG. 61 is a flow chart showing the operation of data compression in the data compression circuit shown in FIG. 60.

Next, the outline of the operation of the data compression circuit having the above construction will be shown on the basis of a flow shown in FIG. 61. First or in step S420, the pointer 410 and so forth are initialized, and successively inputted image data is stored into the line buffer 405 through the line buffer input signal line 417. At this time, data pushed out of the line buffer 405 is stored into the dictionary buffer 406 through the dictionary buffer input signal line 418. Next or in step S421, the judgement is made of whether or not line data inputted to the line buffer 405 is data of the first line. In the case where the line data inputted to the line buffer 405 is data of the first line, run-length compression is performed (step S425) since data to which the reference is to be made is not still stored in the dictionary buffer 406. Namely, a search is made for a partial data string on the current line which continues to the longest possible extent. First, data of the line buffer 405 indicated by the pointer 410 is stored into the partial string buffer 416. Also, the pointer 410 is advanced by one so that the data of the line buffer 405 is inputted to the comparator 407 through the selector 415 for comparison with data of the partial string buffer 416. If the result of comparison indicates the matching, the length counter 413 is incremented and the next data indicated by the pointer 410 is inputted to the comparator 407 through the selector 415 for comparison with data of the partial string buffer 416. The comparison with data of the partial string buffer 416 is repeated with the pointer 410 being advanced one by one until the matching ceases to be obtained. Thereby, the count value of the length counter 413, at the point of time when the result of comparison indicates no matching, is measured as the length L of a partial data string on the current line which includes the same continuous pixels. Next, data of the length L of the partial data string counted by the length counter 413 and raw data stored in the partial string buffer 416 are inputted to the code generator 408. The code generator 408 encodes the data of the length L of the partial data string and the raw data and outputs the resulting code through the code output line 419 (step S426). Thus, all data of the first line are processed.

If line data inputted to the line buffer 405 is data of the second or subsequent line (step S421), data on the current line stored in the line buffer 405 is searched for a partial data string to be compressed which has data of the line buffer 405 indicated by the pointer 410 as its leading pixel and a length corresponding to one or more pixels and which matches data on the dictionary to the longest possible extent (step S422). (This partial data string will be defined as partial data string made the object of search.) The search for the partial data string to be compressed, as shown as one flow step S422 in FIG. 61, is made in accordance with the following procedure. The concept of the search for the partial data string to be compressed will be explained using 8×8 image data shown in FIGS. 62A and 62B by way of example. In the present embodiment, the judgement of whether or not a line preceding by one line to the partial data string made the object of search includes the same partial data string as the partial data string made the object of search, is made by performing a search as to whether or not the same pixel as a leading pixel (defined as pixel of interest) of the partial data string made the object of search exists between a position returned by one from the pixel of interest (defined as relative position −1) and a position advanced by one therefrom (defined as relative position +1). Namely, the compression in step S424 is performed in the case where the same pixel string exists in the immediately preceding line within a range shifted by one pixel to the right and left.

Speaking in conjunction with FIG. 62A, (1) an example of relative position −1 is a partial data string "554" continuing from "5" at the 3rd row and 1st column. Since this partial data string "554" is the same as a partial data string "554" continuing from "5" at the 2nd row and 0th column, it is determined that the same partial data string exists at a position shifted by one pixel to the left. (2) An example of relative position 0 is a partial data string "34" continuing from "3" at the 1st row and 4th column. Since this partial data string "34" is the same as a partial data string "34" continuing from "3" at the 0th row and 4th column, it is determined that the same partial data string exists at a position shifted by zero pixel. (3) An example of relative position +1 is a partial data string "55434" continuing from "5" at the 2nd row and 0th column. Since this partial data string "55434" is the same as a partial data string "55434" continuing from "5" at the 1st row and 1st column, it is determined that the same partial data string exists at a position shifted by one pixel to the right.

In step S422, data of the pointer 410 is first stored into the pointer buffer 412 and the relative position counter 411 is initialized. Next, data of the line buffer 405 indicated by the pointer 410, that is, a pixel of interest is taken into the partial string buffer 416. A search is made as to whether or not a pixel matching the pixel of interest taken in the partial string buffer 416 exists for each of a pixel at the relative position −1, a pixel at the relative position 0 and a pixel at the relative position +1 in the immediately preceding line stored in the dictionary buffer 406. In the case where there is no matching pixel, the length "0" is written into the relative position and length buffer 414 for each relative position and the flow proceeds to step S423. In FIG. 62A, regarding "4" at the 1st row and 3rd column, the pixels at the 0th row and 2nd column and the 0th row and 3rd column are both "2" and the pixel at the 0th row and 4th column is "3". Accordingly, "0" is written as length data for a point (1, 3) into the relative position and length buffer 414 for all the relative positions −1, 0 and +1. In the case where there is a matching pixel, the pointer 410 and the length counter 415 are incremented and data of a pixel next to the pixel of interest is taken into the partial string buffer 416. At this time, the position of a leading pixel of the partial data string made the object of search under searching in the present search or the pixel of interest from a leading pixel of the current line is remained in the pointer buffer 412.

In the case where the matching for the pixel of interest is found at the relative position −1, a search regarding the pixel next to the pixel of interest is made in such a manner that data of a pixel at the relative position −1 in the data of the immediately preceding line is compared with the pixel taken in the partial string buffer 416. Also, in the case where the matching is found at the relative position 0, a search regarding the pixel next to the pixel of interest is made in such a manner that data of a pixel at the relative position 0 in the data of the immediately preceding line is compared with the pixel taken in the partial string buffer 416. Further, in the case where the matching is found at the relative position +1, a search regarding the pixel next to the pixel of interest is made in such a manner that data of a pixel at the relative position +1 in the data of the immediately preceding line is compared with the pixel taken in the partial string buffer 416. In the case where the result of each comparison indicates the matching, the next pixel pointer 410 is incremented to take data of the next pixel into the partial string buffer 416 and the length counter 415 is incremented. This operation is repeated until the result of each comparison indicates no matching. Thereby, the count value of the length counter 415, at a point of time when the result of comparison indicates no matching, is measured as the length L of a partial data string which has the same data string as data of the immediately preceding line. This length information L is counted for each of the relative position −1, the relative position 0 and the relative position +1. Namely, after the length L has been counted for the relative position −1 in a manner mentioned above, the length L is stored as length information of the relative position −1 into the relative position and length buffer 414 at the column of the relative position −1. Subsequently, in order to make a search regarding the relative position 0, the position of the pixel of interest from the leading pixel of the current line temporarily stored in the pointer buffer 412 is returned into the pixel pointer 410 and the relative position counter 411 is incremented. With the pixel counter 410 being incremented, the comparison is similarly made for the next data of on the right side of the pixel of interest until the data matching relevant to the relative position 0 ceases to be obtained. Thereby, the length information L is determined. Subsequently, a similar search is made regarding the relative position +1.

Considering a partial data string which has "5" at the 2nd row and 0th column in FIG. 62A as its leading pixel, this pixel is at the lead of the current line and hence no data exist at the relative position −1 of the preceding line. Therefore, the length L for the relative position −1 is 0. Regarding to the relative position 0, "5" exists at the 1st row and 0th column. Therefore, the length counter 413 is incremented and data "5" of the 2nd row and 1st column next to "5" of the 2nd row and 0th column is taken into the partial string buffer 416 for comparison with "5" of the 1st row and 1st column. Since this comparison too indicates the matching, the length counter 413 is incremented and data "4" of the 2nd row and 2nd column next to "5" of the 2nd row and 1st column is taken into the partial string buffer 416 for comparison with "5" of the 1st row and 2nd column. Since this comparison indicates no matching, the number "2" of matching data until this point of time provides L=2 as the length L of the partial string with "5" at the 2nd row and 0th column as its leading pixel for the relative position 0.

Regarding the partial data string having "5" at the 2nd row and 0th column as its leading pixel, "5" exists at the 1st row and 1st column and this data matches the leading pixel. Therefore, the comparison for the next pixel is also made for the relative position +1. Namely, data "5" of the 2nd row and 1st column next to "5" of the 2nd row and 0th column is taken into the partial string buffer 416 and is then compared with "5" of the 1st row and 2nd column which is at the relative position +1. Since this comparison indicates the matching, the comparison is repeated while successively taking in the next pixel on the right side. When the comparison of "3" at the 2nd row and 5th column and "1" at the 1st row and 6th column is made, no matching is found. Accordingly, the value "5" of the length counter 413 at this time provides L=5 as the length L of the partial string with "5" at the 2nd row and 0th column as its leading pixel for the relative position +1.

With the above, three lengths including L (relative position −1)=0, L (relative position 0)=2 and L (relative position +1)=5 are stored in the relative position and length buffer 414 as the length L of the partial data string having "5" at the 2nd row and 0th column as its leading pixel. From thereamong, a partial data string having the greatest length L equal to 5 is selected as the partial data string to be compressed. In the case of FIG. 62A, a partial data string a (55) corresponds to the same partial data string for the relative position 0 and a partial data string b (55434) corresponds to the same partial data string for the relative position +1, as shown in FIG. 62B. Since the length of the partial data string a is 2 and the length of the partial data string b is 5, the partial data string b providing a high efficiency of compression is selected as the partial data string to be compressed.

In the case where the partial string data to be compressed is found (step S422), the flow goes through step S423 to step S424 in which the longest data among data stored in the relative position and length buffer 414 and data of the relative position for the longest data are inputted to the code generator 408. The code generator 408 encodes the data of the relative position and the data of the length L of the partial data string to output the code through the code output line 419 (step S426).

On the other hand, if the lengths stored in the relative position and length buffer 414 are all 0, that is, if the partial data string to be compressed is not found, the flow goes through step S423 to step S425 in which the above-mentioned run-length compression is performed.

The above operation is repeated through steps S427 and 428 up to the last line of the two-dimensional image data to perform the data compression or the encoding.

Next, explanation will be made of the data compression process of the 8×8 image data shown in FIGS. 62A and 62B. It is assumed that each data is represented by 4 bits. For convenience' sake, the coordinate of image data will be represented by (column, row) and the encoded code will be represented by {relative position, length} or [kind of data, length]. Namely, a portion enclosed by the brace { } shows a portion subjected to compression based on the fifth data compression method of the present invention and a portion enclosed by the bracket [ ] shows a portion subjected to compression based on the run-length compression method.

For example, a code corresponding to the relative position equal to 1 and the length equal to 3 results in {1, 3} and a code corresponding to the kind of data equal to 5 and the length equal to 2 results in [5, 2]. Provided that the coordinate of data of interest is (x, y), the range of reference to the dictionary is (x−1, y−1), (x, y−1) and (x+1, y−1) in terms of relative position. In the case of FIG. 62A, the 0th row is subjected to run-length compression since there is no dictionary to which the reference is to be made. Data at the coordinates (0, 0) to (3, 0) of the image data are all the same and 2, and hence the resulting code is [2, 4]. Data at (4, 0) is 3 and only one of this data exists. Therefore, the resulting code is [3, 1]. Data at (5, 0) to (7, 0) are all the same and 4, and hence the resulting code is [4, 3]. Accordingly, the resulting codes for the first line are [2, 4] [3, 1] [4, 3], as shown by the 0th row in FIG. 63.

A processing for the 1st row shown in FIG. 62A is performed handling the 0th row as a dictionary. Data at (0, 1) is compared with data at (0, 0) but this comparison indicates no matching. The data at (0, 1) is thereafter compared with data at (1, 0) but the data at (0, 1) and the data (1, 0) do not match. Therefore, on the determination that there is no partial data string to be compressed which has a pixel of interest at the coordinate (0, 1) of the image data, the run-length compression is applied. Data at (0, 1) to (2, 1) are all 5, and hence the resulting code is [5, 3]. Data at (3, 1) is 4 and does not match data at (2, 0), (3, 0) and (4, 0). The run-length compression is applied and the resulting code is [4, 1]. Data at (4, 1) is 3 and matches data at (4, 0) among (3, 0), (4, 0) and (5, 0), and data at (4, 1) to (5, 1) match data of the dictionary at (4, 0) to (5, 0). The resulting code is {0, 2}. Data at (6, 1) and data at (7, 1) do not match data of the dictionary. The resulting codes are [1, 1] and [3, 1], respectively. Accordingly, the resulting codes for the 1st row are [5, 3] [4, 1] {0, 2} [1, 1] [3, 1], as shown by the 1st row in FIG. 63.

A processing for the 2nd row shown in FIG. 62A is performed handling the 1st row as a dictionary. Data at (0, 2) matches data of the dictionary at (0, 1) which is the relative position 0 and also matches data of the dictionary at (1, 1) which is the relative position 1. The length of a matching partial data string of the dictionary in the case of the relative position 0 is (0, 1) to (1, 1) or 2 whereas the length of a matching partial data string of the dictionary in the case of the relative position 1 is (1, 1) to (5, 1) or 5. Namely, the length of the partial string of the dictionary for the relative position 1 is greater than that for the relative position 0. A partial data string to be compressed which includes the image data (0, 2) as a pixel of interest, has the relative position equal to 1 and the length equal to 5. Accordingly, the resulting code is {1, 5}. The above processing is repeated up to the last line. As a result, a code string shown in FIG. 63 is obtained for the image data shown in FIGS. 62A and 62B.

Next, actual codes are allotted to the code string of FIG. 63 by use of codes shown in FIGS. 64A and 64B and FIGS. 65A and 65B. A code 461 in the case of the run-length compression is composed of identifier plus kind of data plus length, as shown in FIG. 64A. The identifier is represented by one bit fixed and is allotted with 0 in the case of the run-length compression. Regarding the first line, however, only the run-length compression is involved and hence the identifier is omitted. The kind of data means raw data. In the present embodiment, one pixel is represented by four bits fixed. With the length being represented by a variable-length code, a code shown in FIG. 66A is allotted in the accordance with the length. For example, [2, 4] at the 0th row of the code string shown in FIG. 63 results in 000101110.

A code 462 in the case of the dictionary compression is composed of identifier plus relative position plus length, as shown in FIG. 64B. In the case of the dictionary compression, the identifier is allotted with 1. The relative position is represented by a variable-length code. In the case where the compression previously performed on the same line is the run-length compression in step S425, a code shown in FIG. 65A is allotted in accordance with the relative position of a pixel of interest for each value of S' which is S'=0 when $x_1'$=0, S'=1 when $1 \leq x_1' \leq 6$, and S'=2 when $x_1'$=7 where H' is the number of pixels in one line of two-dimensional image data (H'=8 in the present embodiment) and $x_1'$ is the position of the pixel of interest from a leading pixel of the current line ($0 \leq x_1' \leq 7$ in the present embodiment). For example, {-1, 2} in the 4th row of the code string shown in FIG. 63 is allotted with the code shown in FIG. 65A since the compression performed immediately before is the run-length compression in step S425. The value of S' of {-1, 2} in the 4th row of the code string shown in FIG. 63 is 1 since $x_1'$=2, and hence the code thereof corresponding to the relative position -1 is 11. The reason why a different code is allotted in accordance with the relative position for each value of S' is as follows. In principle, if a different code is allotted in accordance with the relative position, it is not necessary to allot the code for each value of S'. However, in the case where S'=0, that is, in the case where a pixel of interest is positioned at the lead of the current line, a leading pixel of a partial data string (defined as immediately preceding partial data string) on the dictionary matching a partial data string to be compressed is never positioned on the left side of the pixel of interest. Accordingly, in the present embodiment, when S'=0, it is not necessary to allot a code to relative position -1 since the relative position never takes -1. Also, in the case where S'=2, that is, in the case where a pixel of interest is positioned at the last of the current line, a leading pixel of an immediately preceding partial data string is never positioned on the right side of the pixel of interest. Accordingly, in the present embodiment, when S'=2, it is not necessary to allot a code to relative position 1 since the relative position never takes 1. In the fifth data compression method of the present invention, therefore, a different code is allotted in accordance with a relative position for each value of S'. Thereby, the uselessness of the allotment of a code to an impossible relative position in the case where the pixel of interest is positioned at the lead or the last of the current line, is eliminated so that the redundancy of coding is improved to enhance the compression ratio. Thereby, in the present embodiment, the relative position when S'=0 and S'=2 can be represented by one bit, as shown in FIG. 65A.

On the other hand, in the case where the compression previously performed on the same line is the compression in step S424, that is, in the case where the dictionary compression in step S424 continues two or more time, a code shown in FIG. 65B is allotted in accordance with the relative position of a pixel of interest for each value of S' mentioned above and T' which is the relative position of the compressed data previously outputted. For example, {0, 4} in the 4th row of the code string shown in FIG. 63 is allotted with the code shown in FIG. 65B since the compression performed immediately before is the dictionary compression in step S424. For {0, 4} in the 4th row of the code string shown in FIG. 63, S' is 1 since $x_1'$=4 and T' is -1 since the relative position of data by the compression in step S424 performed immediately before is -1. Accordingly, a code for the relative position 0 results in 0. In the fifth data compression/decompression method of the present invention, there is detected from the current line a partial data string to be compressed which is a partial data string having a pixel of interest as its leading pixel and a length equal to one or more pixels and matches data of the immediately preceding line to the longest extent. Therefore, in the case where the dictionary compression in step S424 continues on the same line two or more times, a relative position in the second or subsequent compression never matches a relative position in the compression performed immediately before. For example, in the case where the relative position in the compression performed immediately before is 0, a relative position in compression to be presently performed never takes 0. Accordingly, in the case where the dictionary compression in step S424 continues on the same line two or more times, it is not required that in the second or subsequent compression, a code should be allotted to the same relative position as a relative position in the compression performed immediately before. In the fifth data compression/decompression method of the present invention, therefore, in the case where the dictionary compression in step S424 continues on the same line two or more times, a code representing a relative position in compression to be presently performed is prepared for each value of T' in the second or subsequent compression where T' is a relative position in the compression performed immediately before. Therefore, the uselessness of the allotment of codes to values other than possible values of the relative position is eliminated, thereby improving the redundancy of coding to enhance the compression ratio. Thereby, in the present embodiment, the relative position can be represented by one bit, as shown in FIG. 65B. Further, since the relative position when S'=2 and T'=-1 is always 0 and the relative position when S'=2 and T'=0 is always -1, it is not necessary to a code to such relative position. In FIGS. 65A and 65B, a hyphen "-" shows that no variable-length code is allotted.

The reason why no code is allotted in FIG. 65B when S'=0, is that in the case where a pixel of interest is positioned at the lead of the current line, a partial data string to be compressed having this pixel of interest as its leading pixel is subjected to the first data compression performed on the same line.

The length too is represented by a variable-length code. A code shown in FIG. 66B is allotted in the accordance with the length for each value of U which is a larger one of the position $x_1$' and a position $x_2$' (U=MAX ($x_1$', $x_2$')) where $x_2$' is the position of a leading pixel of an immediately preceding partial data string from a leading pixel of the immediately preceding line ($0 \leq x_2' \leq 7$ in the present embodiment). For example, {−1, 2} in the 4th row of the code string shown in FIG. 63 is such that $x_2$' is 1 since $x_1$' is 2 and the relative position is −1. Accordingly, U=$x_1$'=2. Therefore, a code for the length equal to 2 results in 10 from FIG. 66B. Also, {0, 4} in the 4th row of the code string shown in FIG. 63 is such that $x_2$' is 4 since $x_1$' is 4 and the relative position is 0. Accordingly, U=$x_1$'=$x_2$'=4. Therefore, a code for the length equal to 4 results in 111 from FIG. 66B.

The reason why a code corresponding to the length is prepared for each value of U in the case of the dictionary compression is as follows. In principle, if a different code is allotted in accordance with the length, it is not necessary to allot the code for each value of U. However, the maximum value, which the length of a partial data string to be compressed or the length of an immediately preceding partial data string can take, never becomes larger than a dot length from a pixel of interest to a pixel positioned at the last of the current line and never becomes larger than a dot length from a leading pixel of the immediately preceding partial data string to a pixel positioned at the last of the immediately preceding line. Accordingly, the maximum possible value of the length is the value of a smaller one of the dot length from the pixel of interest to the pixel positioned at the last of the current line and the dot length from the leading pixel of the immediately preceding partial data string to the pixel positioned at the last of the immediately preceding line. In the present embodiment, therefore, a larger one of the position $x_1$' and the position $x_2$' is taken as U and a different code is allotted in accordance with the length for each value of U, so that the uselessness of the allotment of codes for values outside of the range of values which the length can take is eliminated, thereby improving the redundancy of coding to enhance the compression ratio. In FIG. 66B, a hyphen "-" shows that no variable-length code is allotted. The reason why no variable-length code is allotted when U=7, is that the length is always 1 in the case of T=U.

Thereby, for example, {−1, 2} in the 4th row of the code string shown in FIG. 63 results in 11110. Also, {0, 4} in the 4th row of the code string shown in FIG. 63 results in 10111.

Figures 67, 68:
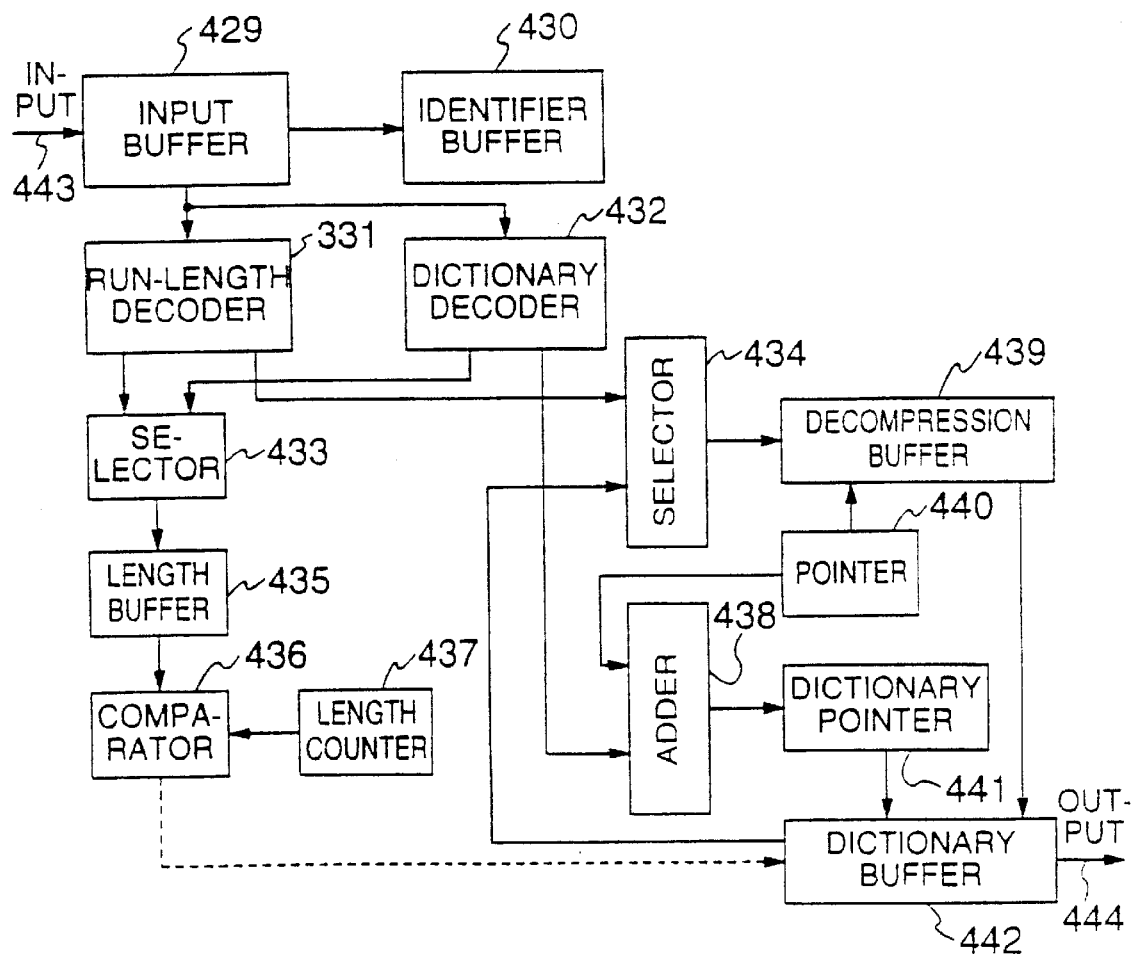
FIG. 67 is an explanatory diagram showing image data after data compression in which the actual codes are allotted.
FIG. 68 is a block diagram showing a data decompression circuit according to an embodiment of a fifth data decompression apparatus for realizing the fifth data decompression method of the present invention.

The result of transformation of the code string of FIG. 63 into the actual codes is shown in FIG. 67. The capacity of the image data shown in FIGS. 62A and 62B is 256 bits whereas the data capacity of the code string shown in FIG. 67 is 160 bits. The use of the algorithm of the fifth data compression method according to the present invention results in the compression of the original image data to about 62.5%.

Figure 69:
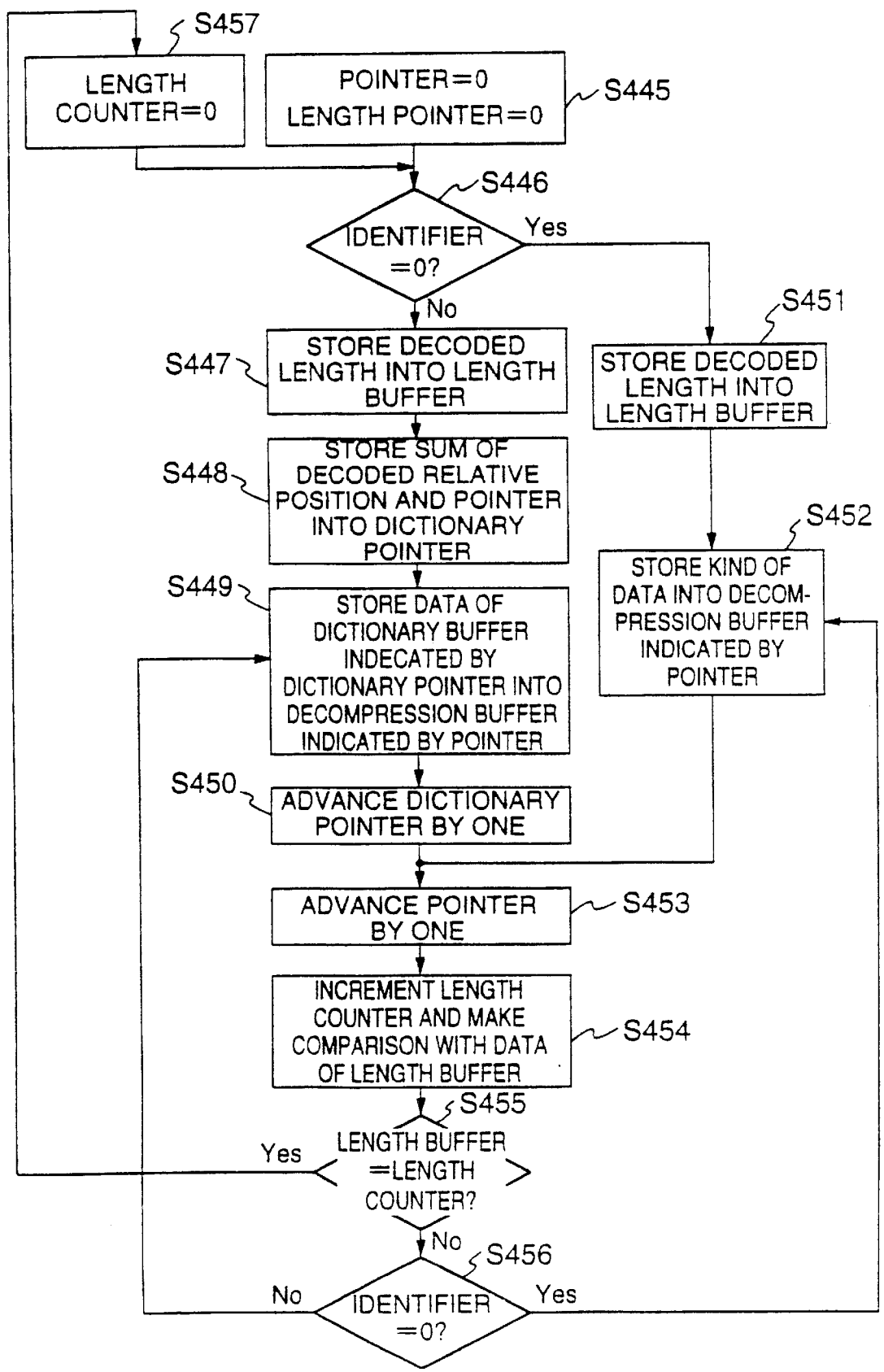
FIG. 69 is a flow chart showing the operation of data decompression in the data decompression circuit shown in FIG. 68.

A procedure for decompressing or expanding the code compressed in accordance with the above manner will be shown using FIGS. 68 and 69. FIG. 68 is a block diagram showing an example of the construction of a decompression circuit. FIG. 69 is a flow chart of a data decompression algorithm. In FIG. 68, reference numeral 429 denotes an input buffer, numeral 430 an identifier buffer, numeral 431 a run-length decoder, numeral 432 a dictionary decoder, numerals 433 and 434 selectors, numeral 435 a length buffer, numeral 436 a comparator, numeral 437 a length counter, numeral 438 an adder, numeral 439 a decompression buffer, numeral 440 a pointer, numeral 441 a dictionary pointer, numeral 442 a dictionary buffer, numeral 443 an input signal line, and numeral 444 an output signal line.

Next, the outline of the operation of the decompression circuit having the above construction will be shown on the basis of a flow shown in FIG. 69.

First, the compressed data is taken into the input buffer 429 through the input signal line 443. One bit at the beginning is stored into the identifier buffer 430. In step S445, the pointer 440 and the length counter 437 are initialized to 0. Then, the flow goes to step S446. If the content of the identifier buffer 430 is 1, the succeeding data is data subjected to dictionary compression. Therefore, the data is passed through the dictionary decoder 432 to decode relative position information and length information. First, the relative position information (−1, 0 or 1) is extracted from a bit string length including the 2nd and subsequent bits succeeding the beginning 1st bit. Namely, in the case where data previously decompressed on the same line is data subjected to the dictionary compression, that is, in the case where the beginning 1st bit of the data previously decompressed is 1, it means that the input of data subjected to the dictionary compression on the same line continues two or more times. Therefore, the value of S' is determined on the basis of the position $x_1$' of a pixel of interest on the current line indicated by the pointer 440. And, information of a relative position corresponding to a bit string length including the 2nd and subsequent bits succeeding the beginning 1st bit is extracted from the table shown in FIG. 65B on the basis of the determined value of S' and the value relative position information T' previously decoded by the dictionary decoder 432. On the other hand, in the case where data previously decompressed on the same line is data subjected to the run-length compression, that is, in the case where the beginning 1st bit of the data previously decompressed is 0, or in the case where data to be presently decompressed is the first data on the same line, the value of S' is determined on the basis of the position $x_1$' of a pixel of interest on the current line indicated by the pointer 440. And, information of a relative position corresponding to a bit string length including the 2nd and subsequent bits succeeding the beginning 1st bit is extracted from the table shown in FIG. 65B on the basis of the determined value of S'. Next, the decoded relative position information (−1, 0 or 1) and the content of the pointer 440 (or the position $x_1$' of the pixel of interest from a leading pixel of the current line) are inputted to the adder 438 to determine the position $x_2$' of a leading pixel of an immediately preceding partial data string on the immediately preceding line and this position $x_2$' is stored into the dictionary pointer 441 (step S447). Thereafter, the value of U (U=MAX($x_1$', $x_2$')) is determined on the basis of the position $x_1$' of the pixel of interest on the current line indicated by the pointer 440 and the position $x_2$' of the leading pixel of the immediately preceding partial data string on the immediately preceding determined by the adder 438. The length information is extracted from a bit string length succeeding the bit string length representing the relative position on the basis of the determined value of U and the length buffer (step S448).

In step S449, data of the dictionary buffer 442 indicated by the dictionary pointer 441 is stored into the decompression buffer 439 indicated by the pointer 440. Next, each of the dictionary pointer 441 and the pointer 440 is advanced by one (steps S450 and S453). The length counter 437 is incremented and the content of the length counter 437 and the content of the length buffer 435 are compared through the comparator 436 (step S454). If the content of the length buffer 435 and the content of the length counter 437 do not match (step S455), the flow goes to step S449 through step S456 so that steps S449, S450, S453 and S454 are successively repeated until the matching is obtained. In the case where the matching is obtained, the length counter 437 is initialized to 0 (step S457) and the flow thereafter goes to step S446 for decompression of a new code.

In the case where it is determined in step S446 that the identifier is 0, the succeeding data is data subjected to run-length compression. Therefore, the data is passed through the run-length decoder 431 to decode raw data and length information. First, the raw data is extracted from a bit string length including the 2nd to 5th bits succeeding the beginning 1st bit. Next, the length information is extracted from a bit string length including the 6th and subsequent bits. The decoded length information is stored into the length buffer 435 (step S451) and the raw data is stored into the decompression buffer 439 indicated by the pointer 440 (step S452). Next, the pointer 440 is advanced by one (step S453). The length counter 437 is incremented and the content of the length counter 437 and the content of the length buffer 435 are compared through the comparator 436 (step 454). If the content of the length buffer 435 and the content of the length counter 437 do not match (step S455), the flow goes to step S452 through step S456 so that steps S452, S453 and S454 are successively repeated until the matching is obtained. In the case where the matching is obtained, the length counter 437 is initialized to 0 (step S457) and the flow thereafter goes to step S446 for decompression of a new code. In the case where the inputted data is the compressed data of the first line, the identifier is omitted but the data includes only data subjected to run-length compression. In this case, the flow goes to step S451 without making the judgement of the identifier in step S446.

The above processing is repeated up to the last code. If data stored in the decompression buffer 439 reaches data corresponding to for one line of the image data, the contents of the decompression buffer 439 are all copied into the dictionary buffer 442 and the content of the dictionary buffer 442 or the restored data is outputted through the output signal line 444. Then, the flow returns to step S446 in which the decompression for the next line is made.

As explained in detail in the foregoing, according to the fifth data compression/decompression method of the present invention, a dictionary is required to store only the immediately preceding line, as mentioned above. Therefore, the capacity of the dictionary is very small. Also, the reference to the dictionary is made within a range in which the degree of similarity is high, and the reference is made to a longest possible partial data string. Therefore, a high compression ratio can be attained and a processing for compression/decompression can be performed at a high speed. Further, in the case where the detection of a partial data string to be compressed continues on the same line two or more times, a code corresponding to a relative position to be outputted as the compressed data of the partial data string to be compressed which is subjected to the second or subsequent detection is allotted with a code which differs in accordance with a relative position for each value of 'I'. Therefore, it is possible to improve the redundancy of the code representing the relative position, thereby enhancing the compression ratio. Furthermore, by applying compression such as run-length compression to the first line of the image data and a partial string for which the reference to the dictionary is impossible, a higher compression ratio is obtained.

What is claimed is:

1. A data compression apparatus comprising:
   reference memory means for holding data of the immediately preceding line for successively inputted two-dimensional image data;
   buffer means for extracting a plurality of continuous data strings from an inputted signal of the current line to store them as a partial data string to be compressed;
   scanning comparison means for detecting whether or not the same data string as a data string continuing from a pixel of interest of said partial data string to be compressed exists in the data stored in said reference memory means; and
   code generating means by which in the case where the presence of the same data string is detected by said scanning comparison means, data of the position of a leading pixel of said partial data string relative to said pixel of interest and the length of said partial data string on the data of the immediately preceding line stored in said reference memory means is determined and a corresponding code is outputted as data of that partial data string of the current line by referring to a table in which a different code is allotted in accordance with said relative position and the length of said partial data string for each position of the pixel of interest on the current line.

2. A data compression apparatus according to claim 1, wherein variable-length codes in at least three different cases including the case where the relative position of a pixel of interest of input data of the current line and a leading pixel of the same partial data string of the immediately preceding line is the same pixel position, the case where the relative position is shifted to the left by one pixel and the case where the relative position is shifted to the right by one pixel are stored in said table.

3. A data compression apparatus according to claim 1, wherein in the case where there is inputted data for which the same partial data string does not exist in the immediately preceding line, a corresponding code is outputted by referring to a run-length table in which a different variable-length code is allotted in accordance with the position of that data on the current line and the length of the same continuous data.

4. A data compression apparatus according to claim 2, wherein in the case where there is inputted data for which the same partial data string does not exist in the immediately preceding line, a corresponding code is outputted by referring to a run-length table in which a different variable-length code is allotted in accordance with the position of that data on the current line and the length of the same continuous data.

5. A data compression apparatus according to claim 3, wherein the variable-length codes stored in said run-length table are allotted with variable-length codes which are different from the variable-length codes stored in said table.

6. A data compression apparatus according to claim 4, wherein the variable-length codes stored in said run-length table are allotted with variable-length codes which are different from the variable-length codes stored in said table.

7. A data decompression apparatus for compressed two-dimensional image data in which in the case where there exists in two-dimensional image data a partial data string which is the same as the immediately preceding line to the extent of at least one or more pixels, there is successively inputted, as data of the overlapping portion, data encoded by referring to a table in which a different code is allotted in accordance with the relative position and the length of a partial data string on the immediately preceding line for each leading position of the compressed data on the current line, the apparatus comprising:

buffer memory means for holding data of the immediately preceding line;

inverse transformation tables provided for the respective positions of a pixel of interest on the current line for outputting data of the relative position and the length of a partial data string on the immediately preceding line in accordance with an inputted code; and decoding means for selecting an inverse transformation table corresponding to the position on the current line of a pixel of interest to be subjected to the decoding of the inputted data, extracting said code from the inputted data to refer to the selected table on the basis of said code so that data of the relative position and the length of a partial data string on the immediately preceding line is derived from said inverse transformation table, and extracting, from said buffer memory means, data which continues from a bit corresponding to the relative position of said partial data string to the extent of the length of said partial data string, the extracted data being outputted as decompressed data.

8. A data decompression apparatus for compressed two-dimensional image data in which in the case where there exists in two-dimensional image data a partial data string which is the same as the immediately preceding line to the extent of at least one or more pixels, data allotted with a code differing in accordance with the relative position and the length of a partial data string on the immediately preceding line for each leading position of the compressed data on the current line is successively inputted as data of the overlapping portion, and in which in the case where the same partial data string does not exist, that data is successively inputted together with data allotted with a code which differs in accordance with the position of that data on the current line and the length of the same continuous data, the apparatus comprising:

a counter for counting the position on the current line of a pixel of interest to be subjected to the decoding of the inputted data;

buffer memory means for holding data of the immediately preceding line;

inverse transformation tables provided for the respective positions of a pixel of interest on the current line for outputting data of the relative position and the length of a partial data string on the immediately preceding line or a run length in accordance with an inputted code;

a decoder for selecting an inverse transformation table corresponding to the count value of said counter, and extracting said code from the inputted data to refer to the selected table on the basis of said code so that a mode in which the partial data string exists or a mode in which the partial data string does not exist is outputted while data of the relative position and the length of a partial data string on the immediately preceding line or data of the length of the same continuous data is derived from said inverse transformation table;

first decoding means by which in the case of the mode in which the partial data string exists, data continuing from a bit corresponding to the relative position of said partial data string to the extent of the length of said partial data string is extracted from said buffer memory means and the extracted data is outputted as decompressed data; and second decoding means by which in the case of the mode in which the partial data string does not exist, data succeeding said code is continuously outputted to the extent of the length of the same continuous data.

9. A data compression method for two-dimensional image data in which a compression processing is performed in the case where the reference to data of the immediately preceding line for successively scanned two-dimensional image data results in that there is detected in the current line a partial data string which is the same as the immediately preceding line to the extent of at least one or more pixels, the method comprising:

preparing tables which are provided for the respective values of T, T being T=0 when x=0, T=1 when $1 \leq x \leq H-N$, and T=x−H+N+1 when $H-N+1 \leq x \leq H-1$ where H is the number of pixels in one line of said two-dimensional image data, N is the maximum detection string length of said partial data string ($1 \leq N \leq H$) and x is the position of a pixel of interest on the current line from a leading pixel thereof ($0 \leq x \leq H-1$) and in which a different code is allotted in accordance with the relative position of a leading pixel of said partial data string and said pixel of interest and the length of said partial data string on the immediately preceding line; and determining, in the case where there is detected in the current line a partial data string which is the same as the immediately preceding line to the extent of at least one or more pixels, the value of T on the basis of the position x of said pixel of interest on the current line and selecting the corresponding table on the basis of the determined value of T to output a code corresponding to the leading position and the length of the partial data string on the current line.

10. A data compression method according to claim 9, wherein codes in at least three different cases including the case where the relative position of a pixel of interest of input data of the current line and a leading pixel of the same partial data string of the immediately preceding line is the same pixel position, the case where the relative position is shifted to the left by one pixel and the case where the relative position is shifted to the right by one pixel are stored in said table in the form of variable-length codes.

11. A data compression method according to claim 9, wherein in the case where there is not detected in the current line a partial data string which is the same as the immediately preceding line, a corresponding code is outputted by referring to a run-length tables which are prepared for the respective values of T and in which a different code is allotted in accordance with the length of the same continuous data.

12. A data compression method according to claim 10, wherein in the case where there is not detected in the current line a partial data string which is the same as the immediately preceding line, a corresponding code is outputted by referring to a run-length tables which are prepared for the respective values of T and in which a different code is allotted in accordance with the length of the same continuous data.

13. A data compression method according to claim 11, wherein the codes stored in said run-length table are allotted with codes which are different from the codes stored in said table.

14. A data compression method according to claim 12, wherein the codes stored in said run-length table are allotted with codes which are different from the codes stored in said table.

15. A data compression method according to claim 13, wherein said table and said run-length table are united into one so that codes for the length of the same partial data string in three different cases including the case where the relative position is the same pixel position, the case where the relative position is shifted to the left by one pixel and the case where the relative position is shifted to the right by one pixel and codes for the length of the same continuous data in the case of run length are stored in the form of different variable-length codes.

16. A data compression method according to claim 14, wherein said table and said run-length table are united into one so that codes for the length of the same partial data string in three different cases including the case where the relative position is the same pixel position, the case where the relative position is shifted to the left by one pixel and the case where the relative position is shifted to the right by one pixel and codes for the length of the same continuous data in the case of run length are stored in the form of different variable-length codes.

17. A data decompression method for compressed two-dimensional image data in which in the case where the reference to data of the immediately preceding line for successively scanned two-dimensional image data results in that there is detected in the current line a partial data string which is the same as the immediately preceding line to the extent of at least one or more pixels, there is successively inputted as data of the overlapping portion a code which differs in accordance with the relative position of a leading pixel of said partial data string and a pixel of interest and the length of said partial data string on the immediately preceding line for each value of T, T being T=0 when x=0, T=1 when $1 \leq x \leq H-N$, and T=x−H+N+1 when $H-N+1 \leq x \leq H-1$ where H is the number of pixels in one line of said two-dimensional image data, N is the maximum detection string length of said partial data string ($1 \leq N \leq H$) and x is the position of said pixel of interest on the current from a leading pixel thereof ($0 \leq x \leq H-1$), the method comprising:

holding at least decompressed data of the immediately preceding line in a buffer;

determining the value of T on the basis of the position x of said pixel of interest to be decompressed on the current line to select a corresponding table on the basis of the determined value of T from tables which are prepared for the respective values of T and in which a different code is allotted in accordance with said relative position and said length; and extracting said code from the inputted compressed data to refer to the selected table on the basis of the extracted code so that data continuing from a bit corresponding to the leading position of said partial data string to the extent of the length of said partial data string is extracted from said buffer for the inputted data of the current line and the extracted data is outputted as decompressed data.

18. A data compression/decompression method in which on a transmitting side, in the case where the reference to data of the immediately preceding line for successively scanned two-dimensional image data results in that there is detected in the current line a partial data string which is the same as the immediately preceding line to the extent of at least one or more pixels, the relative position of a leading pixel of said partial data string on the immediately preceding line and a pixel of interest on the current and the length of said partial data string are determined, and a corresponding code is outputted as compressed data by referring to tables which are prepared for the respective values of T, T being T=0 when x=0, T=1 when $1 \leq x \leq H-N$, and T=x−H+N+1 when $H-N+1 \leq x \leq H-1$ where H is the number of pixels in one line of said two-dimensional image data, N is the maximum detection string length of said partial data string ($1 \leq N \leq H$) and x is the position of a pixel of interest on the current line ($0 \leq x \leq H-1$) and in which a different code is allotted in accordance with said relative position and said length, and in which on a receiving side, the method comprises:

holding at least decompressed data of the immediately preceding line in a buffer;

determining the value of T on the basis of the position x of a pixel of interest to be decompressed on the current line from a leading pixel thereof to select the table corresponding to the determined value of T; and extracting said code from the inputted compressed data to refer to the selected table on the basis of the extracted code so that data continuing from a bit corresponding to the leading position of said partial data string to the extent of the length of said partial data string is extracted from said buffer for the inputted data of the current line and the extracted data is outputted as decompressed data.

19. A data compression/decompression method according to claim 18, wherein codes in at least three different cases including the case where the relative position of a pixel of interest of input data of the current line and a leading pixel of the same partial data string of the immediately preceding line is the same pixel position, the case where the relative position is shifted to the left by one pixel and the case where the relative position is shifted to the right by one pixel are stored in said table.

20. A data compression apparatus comprising:

reference memory means for holding data of the immediately preceding line for successively inputted two-dimensional image data;

buffer means for extracting a plurality of continuous data strings within the range of a predetermined length from an inputted signal of the current line to store them as a partial data string to be compressed;

scanning comparison means for detecting whether or not the same partial data string as a partial data string continuing from a pixel of interest of said partial data string to be compressed exists in the data stored in said reference memory means; and code generating means by which in the case where said scanning comparison means detects the same partial data string, the relative position of a leading pixel of said partial data string and said pixel of interest and the length of said partial data string on the data of the immediately line stored in said reference memory means are determined, and a corresponding code is outputted as data of that partial data string on the current line by referring to tables which are prepared for the respective values of T, T being T=0 when x=0, T=1 when $1 \leq x \leq H-N$, and T=x−H+N+1 when $H-N+1 \leq x \leq H-1$ where H is the number of pixels in one line of said two-dimensional image data, N is the maximum detection string length of said partial data string ($1 \leq N \leq H$) and x is the position of a pixel of interest on the current from a leading pixel thereof ($0 \leq x \leq H-1$) and in which a different code is allotted in accordance with said relative position and said length of the partial data string.

21. A data compression apparatus according to claim 20, wherein variable-length codes in at least three different cases including the case where the relative position of a pixel of interest of input data of the current line and a leading pixel of the same partial data string of the immediately preceding line is the same pixel position, the case where the relative position is shifted to the left by one pixel and the case where the relative position is shifted to the right by one pixel are stored in said table.

22. A data compression apparatus according to claim 20, wherein in the case where there is not detected in the current line a partial data string which is the same as the immediately preceding line, a corresponding code is outputted by referring to a run-length tables which are prepared for the respective values of T and in which a different variable-length code is allotted in accordance with the length of the same continuous data.

23. A data compression apparatus according to claim 21, wherein in the case where there is not detected in the current line a partial data string which is the same as the immediately preceding line, a corresponding code is outputted by referring to a run-length tables which are prepared for the respective values of T and in which a different variable-length code is allotted in accordance with the length of the same continuous data.

24. A data compression apparatus according to claim 22, wherein the variable-length codes stored in said run-length table are allotted with variable-length codes which are different from the variable-length codes stored in said table.

25. A data compression apparatus according to claim 23, wherein the variable-length codes stored in said run-length table are allotted with variable-length codes which are different from the variable-length codes stored in said table.

26. A data decompression apparatus for compressed two-dimensional image data in which in the case where the reference to data of the immediately preceding line for successively scanned two-dimensional image data results in that there is detected in the current line a partial data string which is the same as the immediately preceding line to the extent of at least one or more pixels, there is successively inputted as data of the overlapping portion a code which differs in accordance with the relative position of a leading pixel of said partial data string and a pixel of interest and the length of said partial data string on the immediately preceding line for each value of T, T being T=0 when x=0, T=1 when $1 \leq x \leq H-N$, and T=x−H+N+1 when $H-N+1 \leq x \leq H-1$ where H is the number of pixels in one line of said two-dimensional image data, N is the maximum detection string length of said partial data string ($1 \leq N \leq H$) and x is the position of said pixel of interest on the current from a leading pixel thereof ($0 \leq x \leq H-1$), the apparatus comprising:

buffer memory means for holding decompressed data of the immediately preceding line;

inverse transformation tables which are prepared for the respective values of T and in which the relative position of a leading pixel of said partial data string and said pixel of interest and the length of said partial data string on the immediately preceding line are allotted in accordance with said code; and decoding means for determining the value of T on the basis of the position x of a pixel of interest of the compressed data to be decompressed on the current line from a leading pixel thereof to select the inverse transformation table corresponding to the determined value of T, extracting said code from the inputted data to refer to the selected inverse transformation table on the basis of said code so that data of the leading position and the length of said partial data string on the immediately preceding line is derived from said inverse transformation table, and extracting, from said buffer memory means, data which continues from a bit corresponding to the leading position of said partial data string to the extent of the length of said partial data string, so that the extracted data is outputted as decompressed data.

27. A data decompression apparatus for compressed two-dimensional image data in which in the case where the reference to data of the immediately preceding line for successively scanned two-dimensional image data results in that there is detected in the current line a partial data string which is the same as the immediately preceding line to the extent of at least one or more pixels, there is successively inputted as data of the overlapping portion a code which differs in accordance with the relative position of a leading pixel of said partial data string and a pixel of interest and the length of said partial data string on the immediately preceding line for each value of T, T being T=0 when x=0, T=1 when $1 \leq x \leq H-N$, and T=x−H+N+1 when $H-N+1 \leq x \leq H-1$ where H is the number of pixels in one line of said two-dimensional image data, N is the maximum detection string length of said partial data string ($1 \leq N \leq H$) and x is the position of said pixel of interest on the current from a leading pixel thereof ($0 \leq x \leq H-1$), and in which in the case where there is not detected in the current line a partial data string which is the same as the immediately preceding line, a code differing in accordance with the length of the same continuous data for each value of T and the same data are successively inputted as compressed data of run length, the apparatus comprising:

a counter for counting the position x of a pixel of interest of compressed data to be decompressed on the current line from a leading pixel thereof;

buffer memory means for holding decompressed data of the immediately preceding line;

inverse transformation tables which are prepared for the respective values of T and in which data of the relative position of a leading pixel of said partial data string and said pixel of interest and the length of said partial data string on the immediately preceding line or a run length are allotted in accordance with an inputted code;

a decoder for determining the value of T on the basis of the position x of said pixel of interest on the current line from the leading pixel thereof counted by the count value of said counter to select the inverse transformation table corresponding to the determined value of T, and extracting said code from the inputted data to refer to the selected inverse transformation table on the basis of said code so that a mode flag for discriminating whether or not there is detected in the current line a partial data string which is the same as the immediately preceding line is outputted while data of said relative position and said length or data of the length of the same continuous data is derived from said inverse transformation table;

first decoding means by which in the case where there is detected in the current line a partial data string which is the same as the immediately preceding line, data continuing from a bit corresponding to said relative position to the extent of the length of said partial data string is extracted from said buffer memory means and the extracted data is outputted as decompressed data; and second decoding means by which in the case where there is not detected in the current line a partial data string which is the same as the immediately preceding line, data succeeding said code is continuously outputted to the extent of the length of the same continuous data.

28. A data compression method in which in the case where the reference to data of the immediately preceding line for successively scanned two-dimensional image data results in that there is detected in the current line a partial data string to be compressed which is a partial data string which is the same as the immediately preceding line to the extent of at least one or more pixels, there are outputted, as compressed data of said partial data string to be compressed, a code which differs in accordance with the position of an immediately preceding partial data string on the immediately preceding line corresponding to said partial data string to be compressed and a code which differs in accordance with the length of said immediately preceding partial data string for each value of the position $x_1$ of a pixel of interest as a leading pixel of said partial data string to be compressed from a leading pixel of the current line and/or the position $x_2$ of a leading pixel of said immediately preceding partial data string from a leading pixel of the immediately preceding line.

29. A data compression method according to claim 28, wherein the code corresponding to the length of said immediately preceding partial data string and outputted as compressed data of said partial data string to be compressed is allotted with a code which differs in accordance with the length of said immediately preceding partial data string for each value of T which is a larger one of said position $x_1$ and said position $x_2$.

30. A data compression method according to claim 28, wherein information concerning the position of said immediately preceding partial data string is represented as the relative position on a two-dimensional space of a pixel of interest on the current line and a leading pixel of an immediately preceding partial data string on the immediately preceding line.

31. A data compression method according to claim 29, wherein information concerning the position of said immediately preceding partial data string is represented as the relative position on a two-dimensional space of a pixel of interest on the current line and a leading pixel of an immediately preceding partial data string on the immediately preceding line.

32. A data compression method according to claim 30, wherein the range of reference to the immediately preceding line is limited to fall within a predetermined range of said relative position.

33. A data compression method according to claim 31, wherein the range of reference to the immediately preceding line is limited to fall within a predetermined range of said relative position.

34. A data decompression method for compressed two-dimensional image data in which in the case where the reference to data of the immediately preceding line for successively scanned two-dimensional image data results in that there is detected in the current line a partial data string to be compressed which is a partial data string which is the same as the immediately preceding line to the extent of at least one or more pixels, there are successively inputted, as compressed data of said partial data string to be compressed, a code which differs in accordance with the position of an immediately preceding partial data string on the immediately preceding line corresponding to said partial data string to be compressed and a code which differs in accordance with the length of said immediately preceding partial data string for each value of the position $x_1$ of a pixel of interest as a leading pixel of said partial data string to be compressed from a leading pixel of the current line and/or the position $x_2$ of a leading pixel of said immediately preceding partial data string from a leading pixel of the immediately preceding line, the method comprising:

holding at least decompressed data of the immediately preceding line;

extracting information concerning the position of said immediately preceding partial data string from the inputted compressed data while determining the position $x_2$ of the leading pixel of said immediately preceding partial data string from the leading pixel of the immediately preceding line on the basis of the extracted information to extract information concerning the length of said immediately preceding partial string on the basis of the position $x_1$ of a pixel of interest to be decompressed from a leading pixel of the current line and/or said position $x_2$; and extracting said immediately preceding partial data string from the held decompressed data of the immediately preceding line on the basis of the information concerning the position of said immediately preceding partial data string and the information concerning the length of said immediately preceding partial string to output said immediately preceding partial data string as decompressed data of the inputted compressed data.

35. A data compression/decompression method in which on a transmitting side, in the case where the reference to data of the immediately preceding line for successively scanned two-dimensional image data results in that there is detected in the current line a partial data string to be compressed which is a partial data string which is the same as the immediately preceding line to the extent of at least one or more pixels, there are outputted, as compressed data of said partial data string to be compressed, a code which differs in accordance with the position of an immediately preceding partial data string on the immediately preceding line corresponding to said partial data string to be compressed and a code which differs in accordance with the length of said immediately preceding partial data string for each value of the position $x_1$ of a pixel of interest as a leading pixel of said partial data string to be compressed from a leading pixel of the current line and/or the position $x_2$ of a leading pixel of said immediately preceding partial data string from a leading pixel of the immediately preceding line, and in which on a receiving side, the method comprises holding at least decompressed data of the immediately preceding line, extracting information concerning the position of said immediately preceding partial data string from the inputted compressed data while determining the position $x_2$ of the leading pixel of said immediately preceding partial data string from the leading pixel of the immediately preceding line on the basis of the extracted information to extract information concerning the length of said immediately preceding partial string on the basis of the position $x_1$ of a pixel of interest to be decompressed from a leading pixel of the current line and/or said position $x_2$, and extracting said immediately preceding partial data string from the held decompressed data of the immediately preceding line on the basis of the information concerning the position of said immediately preceding partial data string and the information concerning the length of said immediately preceding partial string to output said immediately preceding partial data string as decompressed data of the inputted compressed data.

36. A data compression apparatus comprising:

reference memory means for holding data of the immediately preceding line for successively inputted two-dimensional image data;

buffer means for extracting a plurality of continuous data strings from an inputted signal of the current line to store them as a partial data string to be compressed;

scanning comparison means for detecting whether or not the same partial data string as said partial data string to be compressed exists in the data stored in said reference memory means; and code generating means by which in the case where said scanning comparison means detects the same partial data string, a code differing in accordance with the position of an immediately preceding partial data string corresponding to said partial data string to be compressed on the data stored in said reference memory means and a code differing in accordance with the length of said immediately preceding partial data string for each value of the position $x_1$ of a pixel of interest as a leading pixel of said partial data string to be compressed from a leading pixel of the current line and/or the position $x_2$ of a leading pixel of said immediately preceding partial data string from a leading pixel of the immediately preceding line are outputted as compressed data of said partial data string to be compressed.

37. A data compression apparatus according to claim 36, wherein said buffer means successively increases the number of bits of the data extracted from the signal of the current line in the case where said scanning comparison means detects the same data string, the increase being repeated until said scanning comparison means ceases to detect the same data string, and wherein said buffer means stores, as the partial data string to be compressed, a partial data string detected by said scanning comparison means immediately before said scanning comparison means ceases to detect the same data string.

38. A data compression apparatus according to claim 36, wherein said scanning comparison means makes comparison by extracting that portion of the data of the immediately preceding line stored in said reference memory means which is within a predefined pixel range from a pixel of interest.

39. A data compression apparatus according to claim 37, wherein said scanning comparison means makes comparison by extracting that portion of the data of the immediately preceding line stored in said reference memory means which is within a predefined pixel range from a pixel of interest.

40. A data decompression apparatus for compressed two-dimensional image data in which in the case where the reference to data of the immediately preceding line for successively scanned two-dimensional image data results in that there is detected in the current line a partial data string to be compressed which is a partial data string which is the same as the immediately preceding line to the extent of at least one or more pixels, there are successively inputted, as compressed data of said partial data string to be compressed, a code which differs in accordance with the position of an immediately preceding partial data string corresponding to said partial data string to be compressed on the immediately preceding line and a code which differs in accordance with the length of said immediately preceding partial data string for each value of the position $x_1$ of a pixel of interest as a leading pixel of said partial data string to be compressed from a leading pixel of the current line and/or the position $x_2$ of a leading pixel of said immediately preceding partial data string from a leading pixel of the immediately preceding line, the apparatus comprising:

buffer memory means for holding at least decompressed data of the immediately preceding line;

extracting means for extracting information concerning the position of said immediately preceding partial data string from the inputted compressed data while determining the position $x_2$ of the leading pixel of said immediately preceding partial data string from the leading pixel of the immediately preceding line on the basis of the extracted information to extract information concerning the length of said immediately preceding partial string on the basis of the position $x_1$ of a pixel of interest to be decompressed from a leading pixel of the current line and/or said position $x_2$; and decoding means for extracting said immediately preceding partial data string from the decompressed data of the immediately preceding line stored in the buffer memory means on the basis of the information concerning the position of said immediately preceding partial data string and the information concerning the length of said immediately preceding partial data string to output said immediately preceding partial data string as decompressed data of the inputted compressed data.

41. A data compression method in which in the case where the reference to data of the immediately preceding line for successively scanned two-dimensional image data results in that there is detected from the current line a partial data string to be compressed which has a pixel of interest as its leading pixel and a length corresponding to one or more pixels and which matches data of the immediately preceding line to the longest extent, there are outputted, as compressed data of said partial data string to be compressed, a code which differs in accordance with the relative position of said pixel of interest and a leading pixel of an immediately preceding partial data string on the immediately preceding line corresponding to said partial data-string to be compressed and a code which differs in accordance with the length of said immediately preceding partial data string, wherein in the case where the detection of said partial data string to be compressed continues on the same line two or more times, a code corresponding to said relative position and outputted as compressed data of the partial data string to be compressed which is subjected to the second or subsequent detection, is allotted with a code which differs in accordance with the relative position of a pixel of interest and a leading pixel of an immediately preceding partial data string for each value of T which is the relative position of compressed data previously outputted.

42. A data compression method in which in the case where the reference to data of the immediately preceding line for successively scanned two-dimensional image data results in that there is detected from the current line a partial data string to be compressed which has a pixel of interest as its leading pixel and a length corresponding to one or more pixels and which matches data of the immediately preceding line to the longest extent, there are outputted, as compressed data of said partial data string to be compressed, a code which differs in accordance with the relative position of said pixel of interest and a leading pixel of an immediately preceding partial data string on an immediately preceding line corresponding to said partial data string to be compressed for each value of S, S being S=0 when x=0, S=1 when $1 \leq x \leq H-2$, and S=2 when x=H-1 where H is the number of pixels in one line of the two-dimensional image data and x is the position of the pixel of interest from a leading pixel of the current line ($0 \leq x \leq H-1$) and a code which differs in accordance with the length of said immediately preceding partial data string.

43. A data compression method according to claim 42, wherein in the case where the detection of said partial data string to be compressed continues on the same line two or more times, a code corresponding to said relative position and outputted as compressed data of a partial data string to be compressed which is subjected to the second or subsequent detection, is allotted with a code which differs in accordance with the relative position of a pixel of interest and a leading pixel of an immediately preceding partial data string for each of the value of T, T being the relative position of compressed data previously outputted and the value of said S.

44. A data compression method according to claim 41, wherein the range of reference to the immediately preceding line is limited to the case where said relative position is the same pixel position and the case where said relative position is a position shifted by one pixel.

45. A data compression method according to claim 42, wherein the range of reference to the immediately preceding line is limited to the case where said relative position is the same pixel position and the case where said relative position is a position shifted by one pixel.

46. A data compression method according to claim 43, wherein the range of reference to the immediately preceding line is limited to the case where said relative position is the same pixel position and the case where said relative position is a position shifted by one pixel.

47. A data decompression method for compressed two-dimensional image data in which in the case where the reference to data of the immediately preceding line for successively scanned two-dimensional image data results in that there is detected from the current line a partial data string to be compressed which has a pixel of interest as its leading pixel and a length corresponding to one or more pixels and which matches data of the immediately preceding line to the longest extent, there are successively inputted, as compressed data of said partial data string to be compressed, a code which differs in accordance with the relative position of said pixel of interest and a leading pixel of an immediately preceding partial data string on the immediately preceding line corresponding to said partial data string to be compressed and a code which differs in accordance with the length of said immediately preceding partial data string, and in which in the case where the detection of said partial data string to be compressed continues on the same line two or more times, a code corresponding to said relative position and inputted as compressed data of the partial data string to be compressed which is subjected to the second or subsequent detection, is allotted with a code which differs in accordance with the relative position of a pixel of interest and a leading pixel of an immediately preceding partial data string for each value of T, T being the relative position of compressed data previously inputted, the method comprising:

holding at least decompressed data of the immediately preceding line;

extracting information concerning said relative position and the length of said immediately preceding partial data string from the inputted compressed data and extracting, in the case where the inputted compressed data is compressed data of a partial string data to be compressed which is subjected to the second or subsequent detection, information concerning said relative position on the basis of the value of T; and extracting said immediately preceding partial data string from the held compressed data of the immediately preceding line on the basis of the extracted information concerning said relative position and said length of said immediately preceding partial data string to output the extracted immediately preceding partial data string as decompressed data of the inputted compressed data.

48. A data decompression method for compressed two-dimensional image data in which in the case where the reference to data of the immediately preceding line for successively scanned two-dimensional image data results in that there is detected from the current line a partial data string to be compressed which has a pixel of interest as its leading pixel and a length corresponding to one or more pixels and which matches data of the immediately preceding line to the longest extent, there are successively inputted, as compressed data of said partial data string to be compressed, a code which differs in accordance with the relative position of said pixel of interest and a leading pixel of an immediately preceding partial data string on an immediately preceding line corresponding to said partial data string to be compressed for each value of S, S being S=0 when x=0, S=1 when $1 \leq x \leq H-2$, and S=2 when x=H-1 where H is the number of pixels in one line of the two-dimensional image data and x is the position of the pixel of interest from a leading pixel of the current line ($0 \leq x < H-1$) and a code which differs in accordance with the length of said immediately preceding partial data string, the method comprising:

holding at least decompressed data of the immediately preceding line;

determining the value of S on the basis of the position x of a pixel of interest to be compressed on the current line to extract information concerning said relative position on the basis of the determined value of S and information concerning the length of said immediately preceding partial data string from the inputted compressed data; and extracting said immediately preceding partial data string from the held compressed data of the immediately preceding line on the basis of the extracted information concerning said relative position and the length of said immediately preceding partial data string to output the extracted immediately preceding partial data string as decompressed data of the inputted compressed data.

49. A data decompression method according to claim 48, wherein in the case where the detection of said partial data string to be compressed continues on the same line two or more times, a code corresponding to said relative position and inputted as compressed data of a partial data string to be compressed which is subjected to the second or subsequent detection, is allotted with a code which differs in accordance with the relative position of a pixel of interest and a leading pixel of an immediately preceding partial data string for each the value of T, T being the relative position of compressed data previously inputted and the value of said S, and wherein in the case where the inputted compressed data is compressed data of a partial string data to be compressed which is subjected to the second or subsequent detection, information concerning said relative position is extracted on the basis of the value of T and the value of S.

50. A data compression/decompression method in which on a transmitting side, in the case where the reference to data of the immediately preceding line for successively scanned two-dimensional image data results in that there is detected from the current line a partial data string to be compressed which has a pixel of interest as its leading pixel and a length corresponding to one or more pixels and which matches data of the immediately preceding line to the longest extent, there are successively outputted, as compressed data of said partial data string to be compressed, a code which differs in accordance with the relative position of said pixel of interest and a leading pixel of an immediately preceding partial data string on the immediately preceding line corresponding to said partial data string to be compressed and a code which differs in accordance with the length of said immediately preceding partial data string, and in the case where the detection of said partial data string to be compressed continues on the same line two or more times, a code corresponding to said relative position and outputted as compressed data of the partial data string to be compressed which is subjected to the second or subsequent detection, is allotted with a code which differs in accordance with the relative position of a pixel of interest and a leading pixel of an immediately preceding partial data string for each value of T, T being the relative position of compressed data previously inputted, and in which on a receiving side, the method comprises holding at least decompressed data of the immediately preceding line, extracting information concerning said relative position and the length of said immediately preceding partial data string from the inputted compressed data, extracting, in the case where the inputted compressed data is compressed data of a partial string data to be compressed which is subjected to the second or subsequent detection, information concerning said relative position on the basis of the value of T, and extracting said immediately preceding partial data string from the held compressed data of the immediately preceding line on the basis of the extracted information concerning said relative position and the length of said immediately preceding partial data string to output the extracted immediately preceding partial data string as decompressed data of the inputted compressed data.

51. A data compression/decompression method in which on a transmitting side, in the case where the reference to data of the immediately preceding line for successively scanned two-dimensional image data results in that there is detected from the current line a partial data string to be compressed which has a pixel of interest as its leading pixel and a length corresponding to one or more pixels and which matches data of the immediately preceding line to the longest extent, there are outputted, as compressed data of said partial data string to be compressed, a code which differs in accordance with the relative position of a pixel of interest and a leading pixel of an immediately preceding partial data string on an immediately preceding line corresponding to said partial data string to be compressed for each value of S, S being S=0 when x=0, S=1 when $1 \leq x \leq H-2$, and S=2 when x=H-1 where H is the number of pixels in one line of the two-dimensional image data and x is the position of said pixel of interest from a leading pixel of the current line ($0 \leq x \leq H-1$) and a code which differs in accordance with the length of said immediately preceding partial data string, and in which on a receiving side, the method comprises holding at least decompressed data of the immediately preceding line, determining the value of S on the basis of the position x of a pixel of interest to be compressed on the current line to extract information concerning said relative position on the basis of the determined value of S and information concerning the length of said immediately preceding partial data string from the inputted compressed data, and extracting said immediately preceding partial data string from the held compressed data of the immediately preceding line on the basis of the extracted information concerning said relative position and the length of said immediately preceding partial data string to output the extracted immediately preceding partial data string as decompressed data of the inputted compressed data.

52. A data compression/decompression method in which on a transmitting side, in the case where the reference to data of the immediately preceding line for successively scanned two-dimensional image data results in that there is detected from the current line a partial data string to be compressed which has a pixel of interest as its leading pixel and a length corresponding to one or more pixels and which matches data of the immediately preceding line to the longest extent, there are outputted, as compressed data of said partial data string to be compressed, a code which differs in accordance with the relative position of a pixel of interest and a leading pixel of an immediately preceding partial data string on an immediately preceding line corresponding to said partial data string to be compressed for each value of S, S being S=0 when x=0, S=1 when $1 \leq x \leq H-2$, and S=2 when x=H-1 where H is the number of pixels in one line of the two-dimensional image data and x is the position of said pixel of interest from a leading pixel of the current line ($0 \leq x \leq H-1$) and a code which differs in accordance with the length of said immediately preceding partial data string, and in the case where the detection of said partial data string to be compressed continues on the same line two or more times, a code corresponding to said relative position and outputted as compressed data of a partial data string to be compressed which is subjected to the second or subsequent detection, is allotted with a code which differs in accordance with the relative position of a pixel of interest and a leading pixel of an immediately preceding partial data string for each the value of T, T being the relative position of compressed data previously outputted and the value of said S, and in which on a receiving side, the method comprises holding at least decompressed data of the immediately preceding line, determining the value of S on the basis of the position x of a pixel of interest to be compressed on the current line to extract information concerning said relative position on the basis of the determined value of S and information concerning the length of said immediately preceding partial data string from the inputted compressed data, extracting, in the case where the inputted compressed data is compressed data of a partial string data to be compressed which is subjected to the second or subsequent detection, information concerning said relative position on the basis of the value of T and the value of S, and extracting said immediately preceding partial data string from the held compressed data of the immediately preceding line on the basis of the extracted information concerning said relative position and the length of said immediately preceding partial data string to output the extracted immediately preceding partial data string as decompressed data of the inputted compressed data.

53. A data compression apparatus comprising:

reference memory means for holding data of the immediately preceding line for successively inputted two-dimensional image data;

buffer means for extracting from an inputted signal of the current line a plurality of partial data strings having a pixel of interest as its leading pixel and a length corresponding to one or more pixels to store them;

scanning comparison means for detecting a partial data string to be compressed which is that one of said partial data strings stored in said buffer means which matches data stored in said reference memory means to the longest extent; and code generating means by which in the case where said scanning comparison means detects said partial data string to be compressed, a code differing in accordance with the relative position of said pixel of interest and a leading pixel of an immediately preceding partial data string on the data stored in said reference memory means and corresponding to said partial data string to be compressed and a code differing in accordance with the length of said immediately preceding partial data string are outputted as compressed data of said partial data string to be compressed, and by which in the case where said partial data string to be compressed is detected by said scanning comparison means on the same line continuously two or more times, a code corresponding to said relative position and outputted as compressed data of a partial data string to be compressed which is subjected to the second or subsequent detection, is allotted with a code which differs in accordance with the relative position of a pixel of interest and a leading pixel of an immediately preceding partial data string for each value of T, T being the relative position of compressed data previously outputted.

54. A data compression apparatus comprising:

reference memory means for holding data of the immediately preceding line for successively inputted two-dimensional image data;

buffer means for extracting from an inputted signal of the current line a plurality of partial data strings having a pixel of interest as its leading pixel and a length corresponding to one or more pixels to store them;

scanning comparison means for detecting a partial data string to be compressed which is that one of said partial data strings stored in said buffer means which matches data stored in said reference memory means to the longest extent; and code generating means by which in the case where said scanning comparison means detects said partial data string to be compressed, there are outputted, as compressed data of said partial data string to be compressed, a code which differs in accordance with the relative position of a pixel of interest and a leading pixel of an immediately preceding partial data string on the data stored in said reference memory means and corresponding to said partial data string to be compressed for each value of S, S being S=0 when x=0, S=1 when $1 \leq x \leq H-2$, and S=2 when x=H-1 where H is the number of pixels in one line of the two-dimensional image data and x is the position of said pixel of interest from a leading pixel of the current line ($0 \leq x \leq H-1$) and a code which differs in accordance with the length of said immediately preceding partial data string.

55. A data compression apparatus comprising:

reference memory means for holding data of the immediately preceding line for successively inputted two-dimensional image data;

buffer means for extracting from an inputted signal of the current line a plurality of partial data strings having a pixel of interest as its leading pixel and a length corresponding to one or more pixels to store them;

scanning comparison means for detecting a partial data string to be compressed which is that one of said partial data strings stored in said buffer means which matches data stored in said reference memory means to the longest extent; and code generating means by which in the case where said scanning comparison means detects said partial data string to be compressed, there are outputted, as compressed data of said partial data string to be compressed, a code which differs in accordance with the relative position of a pixel of interest and a leading pixel of an immediately preceding partial data string on the data stored in said reference memory means and corresponding to said partial data string to be compressed for each value of S, S being S=0 when x=0, S=1 when $1 \leq x \leq H-2$, and S=2 when x=H-1 where H is the number of pixels in one line of the two-dimensional image data and x is the position of said pixel of interest from a leading pixel of the current line ($0 \leq x \leq H-1$) and a code which differs in accordance with the length of said immediately preceding partial data string, and by which in the case where said partial data string to be compressed is detected by said scanning comparison means on the same line continuously two or more times, a code corresponding to said relative position and outputted as compressed data of a partial data string to be compressed which is subjected to the second or subsequent detection, is allotted with a code which differs in accordance with the relative position of a pixel of interest and a leading pixel of an immediately preceding partial data string for each of the value of said S and the value of T, T being the relative position of compressed data previously outputted.

56. A data compression apparatus according to claim 53, wherein in the case where a partial data string matching the partial data string stored in said buffer means is detected by said scanning comparison means from the data stored in said reference memory means, data succeeding said partial data string stored in said buffer means is extracted by said buffer means from the signal of the current line to successively increase the length of the partial data string stored in said buffer means, the increase being repeated until said scanning comparison means ceases to detect the matching partial data string, and said scanning comparison means detects, as said partial data string to be compressed, a partial data string stored in said buffer means immediately before said scanning comparison means ceases to detect the matching partial data string.

57. A data compression apparatus according to claim 54, wherein in the case where a partial data string matching the partial data string stored in said buffer means is detected by said scanning comparison means from the data stored in said reference memory means, data succeeding said partial data string stored in said buffer means is extracted by said buffer means from the signal of the current line to successively increase the length of the partial data string stored in said buffer means, the increase being repeated until said scanning comparison means ceases to detect the matching partial data string, and said scanning comparison means detects, as said partial data string to be compressed, a partial data string stored in said buffer means immediately before said scanning comparison means ceases to detect the matching partial data string.

58. A data compression apparatus according to claim 55, wherein in the case where a partial data string matching the partial data string stored in said buffer means is detected by said scanning comparison means from the data stored in said reference memory means, data succeeding said partial data string stored in said buffer means is extracted by said buffer means from the signal of the current line to successively increase the length of the partial data string stored in said buffer means, the increase being repeated until said scanning comparison means ceases to detect the matching partial data string, and said scanning comparison means detects, as said partial data string to be compressed, a partial data string stored in said buffer means immediately before said scanning comparison means ceases to detect the matching partial data string.

59. A data compression apparatus according to claim 53, wherein said scanning comparison means makes comparison by extracting that partial data string from the data stored in said reference buffer means which has, as its leading pixel, data for which said relative position is the same pixel position or a position shifted by one pixel.

60. A data compression apparatus according to claim 54, wherein said scanning comparison means makes comparison by extracting that partial data string from the data stored in said reference buffer means which has, as its leading pixel, data for which said relative position is the same pixel position or a position shifted by one pixel.

61. A data compression apparatus according to claim 55, wherein said scanning comparison means makes comparison by extracting that partial data string from the data stored in said reference buffer means which has, as its leading pixel, data for which said relative position is the same pixel position or a position shifted by one pixel.

62. A data compression apparatus according to claim 56, wherein said scanning comparison means makes comparison by extracting that partial data string from the data stored in said reference buffer means which has, as its leading pixel, data for which said relative position is the same pixel position or a position shifted by one pixel.

63. A data compression apparatus according to claim 57, wherein said scanning comparison means makes comparison by extracting that partial data string from the data stored in said reference buffer means which has, as its leading pixel, data for which said relative position is the same pixel position or a position shifted by one pixel.

64. A data compression apparatus according to claim 58, wherein said scanning comparison means makes comparison by extracting that partial data string from the data stored in said reference buffer means which has, as its leading pixel, data for which said relative position is the same pixel position or a position shifted by one pixel.

65. A data decompression apparatus for compressed two-dimensional image data in which in the case where the reference to data of the immediately preceding line for successively scanned two-dimensional image data results in that there is detected from the current line a partial data string to be compressed which has a pixel of interest as its leading pixel and a length corresponding to one or more pixels and which matches data of the immediately preceding line to the longest extent, there are successively inputted, as compressed data of said partial data string to be compressed, a code which differs in accordance with the relative position of said pixel of interest and a leading pixel of an immediately preceding partial data string on the immediately preceding line corresponding to said partial data string to be compressed and a code which differs in accordance with the length of said immediately preceding partial data string, and in which in the case where the detection of said partial data string to be compressed continues on the same line two or more times, a code corresponding to said relative position and inputted as compressed data of a partial data string to be compressed which is subjected to the second or subsequent detection, is allotted with a code which differs in accordance with the relative position of a pixel of interest and a leading pixel of an immediately preceding partial data string for each value of T, T being the relative position of compressed data previously inputted, the apparatus comprising:

buffer memory means for holding at least decompressed data of the immediately preceding line;

extracting means by which information concerning said relative position and the length of said immediately preceding partial data string is extracted from the inputted compressed data, and by which when the inputted compressed data is compressed data of a partial string data to be compressed which is subjected to the second or subsequent detection, information concerning said relative position is extracted on the basis of the value of T; and decoding means for extracting said immediately preceding partial data string from the compressed data of the immediately preceding line stored in said buffer memory means on the basis of the information concerning said relative position and the length of said immediately preceding partial data string extracted by said extracting means to output the extracted immediately preceding partial data string as decompressed data of the inputted compressed data.

66. A data decompression apparatus for compressed two-dimensional image data in which in the case where the reference to data of the immediately preceding line for successively scanned two-dimensional image data results in that there is detected from the current line a partial data string to be compressed which has a pixel of interest as its leading pixel and a length corresponding to one or more pixels and which matches data of the immediately preceding line to the longest extent, there are successively inputted, as compressed data of said partial data string to be compressed, a code which differs in accordance with the relative position of a pixel of interest and a leading pixel of an immediately preceding partial data string on an immediately preceding line corresponding to said partial data string to be compressed for each value of S, S being S=0 when x=0, S=1 when $1 \leq x \leq H-2$, and S=2 when x=H-1 where H is the number of pixels in one line of the two-dimensional image data and x is the position of said pixel of interest from a leading pixel of the current line ($0 \leq x \leq H-1$) and a code which differs in accordance with the length of said immediately preceding partial data string, the apparatus comprising:

buffer memory means for holding at least decompressed data of the immediately preceding line;

extracting means for determining the value of S on the basis of the position x of a pixel of interest to be compressed on the current line to extract information concerning said relative position on the basis of the determined value of S and information concerning the length of said immediately preceding partial data string from the inputted compressed data; and decoding means for extracting said immediately preceding partial data string from the compressed data of the immediately preceding line stored in said buffer memory means on the basis of the information concerning said relative position and the length of said immediately preceding partial data string extracted by said extracting means to output the extracted immediately preceding partial data string as decompressed data of the inputted compressed data.

67. A data decompression apparatus according to claims 66, wherein in the case where the detection of said partial data string to be compressed continues on the same line two or more times, a code corresponding to said relative position and inputted as compressed data of a partial data string to be compressed which is subjected to the second or subsequent detection, is allotted with a code which differs in accordance with the relative position of a pixel of interest and a leading pixel of an immediately preceding partial data string for each of the value of T, T being the relative position of compressed data previously inputted and the value of said S, and wherein when the inputted compressed data is compressed data of a partial string data to be compressed which is subjected to the second or subsequent detection, said extracting means extracts information concerning said relative position is extracted on the basis of the value of T and the value of S.

68. A data decompression method for decompressing compressed two-dimensional image data which are produced by a data compressing method using first line data of a first line and second line data of a second line, said first line immediately preceding said second line, wherein said data compressing method comprising the steps of:
preparing tables which are provided every position of a pixel of interest on said second line and in each of which codes are allotted so as to be different in accordance with a relative position of a leading pixel of said first partial data string to said pixel of interest and a length of said first partial data string;
comparing a first partial data string among said first line data and a second partial data string among said second line data; and
selecting, when said second partial data string is the same as said first partial data string, one of said tables in accordance with a position of said pixel of interest on said second line to output one of said codes which is allotted corresponding to a leading pixel of said first partial data string to said pixel of interest and the length of said first partial data, instead of said second partial data string,
said data decompressing method comprising the stops of:
preparing said tables;
holding at least said first line data included in said compressed two-dimensional image data;
selecting one of said tables in accordance with a position of a pixel to be decompressed on said second line;
extracting said one of codes included in said compressed two-dimensional image data;
referring said selected one of tables in accordance with said extracted one of codes to extract data, which comprises a corresponding bit corresponding to the relative position of the leading pixel of said first partial data string to said pixel to be decompressed and at least one bit following said corresponding bit by the length of said first partial data string, from said held first line data; and
reproducing said second line data by using said extracted data instead of said extracted one of codes.

69. A data compression/decompression method comprising:

a data compression method performed in a transmitting side and for compressing two-dimensional image data using first line data of a first line and second line data of a second line, said first line immediately preceding said second line, comprising the steps of:
preparing tables which are provided every position of a pixel of interest on said second line and in each of which codes are allotted 90 as to be different in accordance with a relative position of a leading pixel of said first partial data string to said pixel of interest and a length of said first partial data string;
comparing a first partial data string among said first line data and a second partial data string among said second line data; and
selecting, when said second partial data string is the same as said first partial data string, one of said tables in accordance with a position of said pixel of interest on said second line to output one of said codes which is allotted corresponding to a leading pixel of said fires partial data string to said pixel of interest and the length of said first partial data, instead of said second partial data string, and
a data decompressing method performed in a receiving side comprising the steps of:
preparing said tables;
holding at least said first line data included in said compressed two-dimensional image data;
selecting one of said tables in accordance with a position of a pixel to be decompressed on said second line;
extracting said one of codes included in said compressed two-dimensional image data;
referring said selected one of tables in accordance with said extracted one of codes to extract data, which comprises a corresponding bit corresponding to the relative position of the leading pixel of said first partial data string to said pixel to be decompressed and at least one bit following said corresponding bit by the length of said first partial data string, from said held first line data; and
reproducing said second line data by using said extracted data instead of said extracted one of codes.

70. A data compression/decompression method according to claim 52, wherein codes in at least three different cases are stored in said table in the form of variable-length codes, said three different cases including a case where said relative position represents that said leading pixel is positioned at the same pixel position as said pixel of interest, a case where said relative position represents that said leading pixel shifts to the left by one pixel to said pixel of interest, and a case where said relative position represents that said leading pixel shifts to the right by one pixel to said pixel of interest.

* * * * *

UNITED STATES PATENT AND TRADEMARK OFFICE
CERTIFICATE OF CORRECTION

PATENT NO. : 5,883,975
DATED : March 16, 1999
INVENTOR(S) : Narita, et. al.

It is certified that error appears in the above-identified patent and that said Letters Patent is hereby corrected as shown below:

Title page, item [21]  Change "526,663" to --08/526,663--.

Signed and Sealed this

Sixth Day of February, 2001

Attest:

Attesting Officer

Q. TODD DICKINSON
Director of Patents and Trademarks